US008311122B2

(12) United States Patent
Kure et al.

(10) Patent No.: US 8,311,122 B2
(45) Date of Patent: Nov. 13, 2012

(54) INFORMATION PROCESSING APPARATUS AND METHOD

(75) Inventors: Yoshinobu Kure, Kanagawa (JP); Takahiro Fukuhara, Kanagawa (JP)

(73) Assignee: Sony Corporation, Tokyo (JP)

( * ) Notice: Subject to any disclaimer, the term of this patent is extended or adjusted under 35 U.S.C. 154(b) by 455 days.

(21) Appl. No.: 12/613,056

(22) Filed: Nov. 5, 2009

(65) Prior Publication Data

US 2010/0150243 A1 Jun. 17, 2010

(30) Foreign Application Priority Data

Dec. 12, 2008 (JP) ................................ 2008-316719

(51) Int. Cl.
*H04N 7/66* (2006.01)
(52) U.S. Cl. ................ 375/240.24; 375/240.27
(58) Field of Classification Search ............. 375/240.24, 375/240.27
See application file for complete search history.

(56) References Cited

U.S. PATENT DOCUMENTS

| 5,477,272 | A | * | 12/1995 | Zhang et al. ............. 375/240.06 |
| 7,385,921 | B2 | | 6/2008 | Itakura et al. |
| 7,564,782 | B2 | | 7/2009 | Futenma et al. |
| 2007/0269122 | A1 | | 11/2007 | Fukuhara et al. |
| 2007/0279683 | A1 | | 12/2007 | Iwami et al. |
| 2008/0063078 | A1 | | 3/2008 | Futenma et al. |
| 2008/0107040 | A1 | | 5/2008 | Mizoguchi et al. |
| 2009/0102686 | A1 | | 4/2009 | Fukuhara et al. |

FOREIGN PATENT DOCUMENTS

| JP | 7-87483 | 3/1995 |
| JP | 11-127138 | 5/1999 |
| JP | 2001-16584 | 1/2001 |
| JP | 2003-87225 | 3/2003 |
| JP | 2003-152752 | 5/2003 |
| JP | 2006-339775 | 12/2006 |
| JP | 2008-160499 | 7/2008 |

OTHER PUBLICATIONS

Office Action issued Dec. 16, 2010, in Japan Patent Application No. 2008-316719.
Wim Sweldens, "The Lifting Scheme: A Custom-Design Construction of Biorthogonal Wavelets", Applied and Computational Harmonic Analysis, Article No. 15, vol. 3, No. 2, 1996, pp. 186-200.
Christos Chrysafis et al., "Line-Based, Reduced Memory, Wavelet Image Compression", IEEE Transactions on Image Processing, vol. 9, No. 3, Mar. 2000, pp. 378-389.
Alexander E. Mohr et al., "Unequal Loss Protection: Graceful Degradation of Image Quality Over Packet Erasure Channels Through Forward Error Correction", IEEE Journal on Selected Areas in Communications, vol. 18, No. 6, Jun. 2000, pp. 1-25.

* cited by examiner

*Primary Examiner* — Sath V Perungavoor
*Assistant Examiner* — Jeffery Williams
(74) *Attorney, Agent, or Firm* — Oblon, Spivak, McClelland, Maier & Neustadt, L.L.P.

(57) ABSTRACT

An information processing apparatus includes: a coding mechanism for generating hierarchical data hierarchized in descending order of importance with respect to resolution from image data, and coding the hierarchical data for each hierarchy; and a redundancy coding mechanism for blocking the hierarchical data for each of the hierarchies using a block size determined for each of the hierarchies on the basis of dependencies of the hierarchies between pieces of the hierarchical data generated by the coding mechanism or between the hierarchical data and the image data, and performing redundancy coding to generate redundant data of the hierarchical data for each of the blocks.

7 Claims, 32 Drawing Sheets

FIG. 3
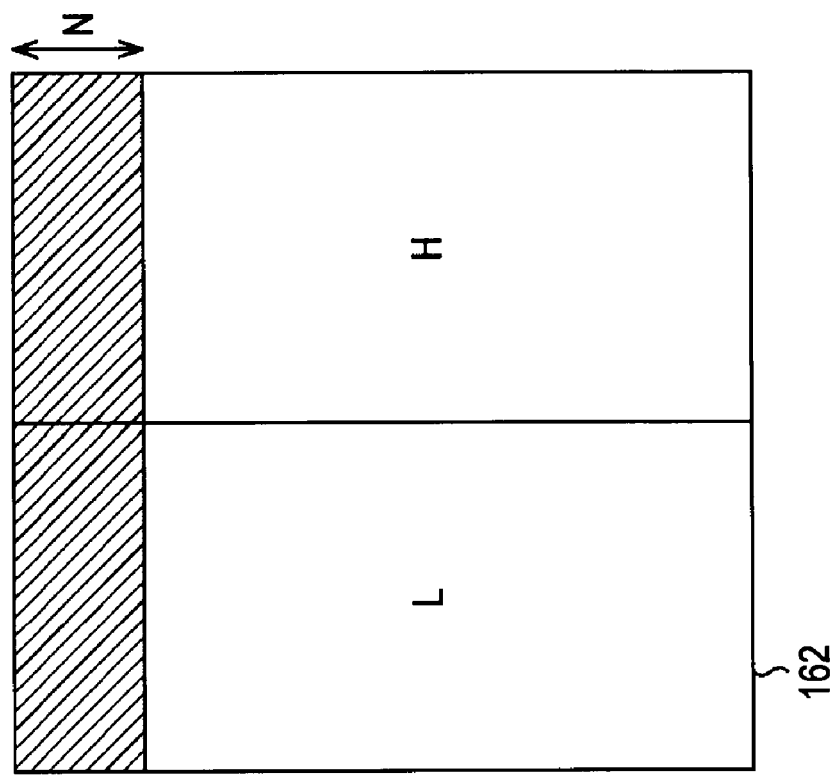
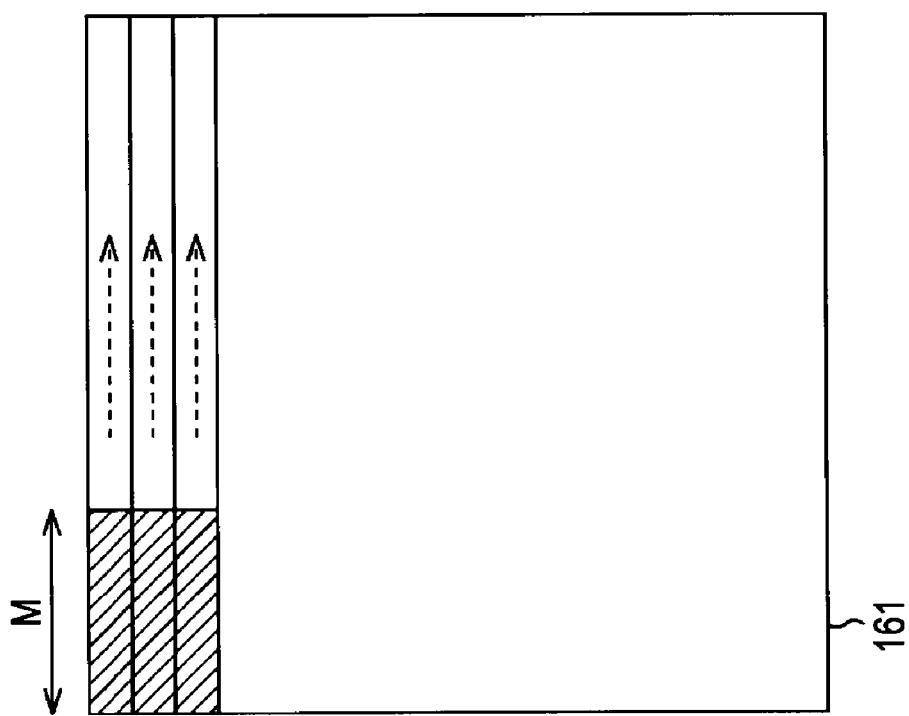

INFORMATION PROCESSING APPARATUS AND METHOD

BACKGROUND OF THE INVENTION

1. Field of the Invention

The present invention relates to an information processing apparatus and method. More particularly, the present invention relates to an information processing apparatus and method which makes it possible to improve burst-packet-loss resilience while restraining an increase in unnecessary delays in data transmission.

2. Description of the Related Art

In recent years, there is an increasing demand for transmitting multimedia data with a low delay through the Internet or the other transmission lines. For example, a so-called remote medical operation application is provided. In the remote medical operation, medical centers at two remote places are connected through the Internet, etc., an operation scene at one of remote operating rooms is transmitted by video to the other of the remote operating rooms, and surgical tools are operated at the other remote operating room while viewing the video. In such an application, video transmission is requested to have a delay not more than a few frame intervals.

In order to meet such a request, a proposal (for example, Japanese Unexamined Patent Application Publication No. 2007-311924) has been made of a method of handling each few lines of each picture of video as one compression coded block and performing compression coding on the block by wavelet transformation. In this method, a coding apparatus can start compression coding before all the data in a picture is input. Also, if the compressed data is transmitted through a network, and the compressed data is decoded at a receiving side, the decoder can start decoding processing before all the data in a picture is received. Accordingly, if a network propagation delay is sufficiently small, it becomes possible to transmit real-time video with a delay of a frame interval or less.

The Internet techniques suitable for such real-time transmission include RTP (Realtime Transport Protocol), which is defined by the RFC (Request for Comments) 3550 of IETF (Internet Engineering Task Force). In data transfer by RTP, a time stamp is added to a packet as time information, and thus a time relationship between a transmission side and a receiving side is obtained. In this manner, it becomes possible to reproduce synchronized data without the influence of delay fluctuations (jitters) of the packet transfer.

In this regard, RTP does not guarantee real-time data transfer. The transport service provided by RTP does not include setting the priorities of packet delivery, management, etc. Accordingly, delivery delay and packet loss may occur in RTP packets in the same manner as the packets of the other protocols.

However, even if there are a few data loss, only the data quality is deteriorated, and it is possible to reproduce data at the receiving side using only the packets arrived in an expected time period. In this regard, a packet delivered with a delay and a packet having an error are directly discarded at the receiving side.

In this manner, in the case of network transmission, even if high-quality data is delivered, the data might not be fully reproduced at the receiving side by packet losses and errors. In general, the probability of the occurrence of an error is $10^{-5}$ or more in a wired section, and is $10^{-3}$ or more in a wireless section. Accordingly, it is not possible to sufficiently maintain the quality of media to be delivered using RTP without change.

As a method of using another protocol, a method of using TCP (Transmission Control Protocol), which has a high reliability in data transfer, is considered to be used. However, although TCP is resilient against errors, TCP has a low throughput and a large delay, and thus TCP is not suitable for low-delay data transmission. For example, if a receiving side requests packet retransmission at the time of the occurrence of an error, the retransmitted packet might not arrive in time for the reproduction of the packet.

Thus, as a method of improving the reliability of data transfer using RTP, there is a forward error correction method, namely FEC (Forward Error Correction), which performs redundancy coding on data. (For example, Alexander E. Mohr, Student Member, IEEE, Eve A. Riskin, Senior Member, IEEE, and Richard E. Ladner, Member, IEEE, "Unequal Loss Protection: Graceful Degradation of Image Quality over Packet Erasure Channels Through Forward Error Correction" IEEE JOURNAL ON SELECTED AREAS IN COMMUNICATIONS, VOL. 18, No. 6, pp 819-828, JUNE 2000). In the FEC method, a plurality of packets is gathered into one FEC block, and redundancy coding is performed using error correction codes, such as RS (Reed-Solomon) codes, etc. For example, in the case of using the (n, k) RS code, assuming that the number of original packets is k, n−k redundant packets can be generated (n>k). In this case, if a transmission apparatus transmits n packets in total, and a receiving apparatus receives k packets out of the n packets, it is possible to recover the k original packets by the RS decoding processing. For example, a redundancy coding method in accordance with priorities is described in the above-described non-patent document.

When redundancy coding is performed using the FEC method, the recovery performance from a packet loss depends on the FEC block size and the number of redundant packets (n−k). In particular, the recovery performance from a consecutive packet loss, namely a burst packet loss, on a data sequence, which occurs during data transmission through a network, has a strong relationship with the FEC block size. In general, the larger the FEC block size is, the more the recovery performance from a burst packet loss improves.

SUMMARY OF THE INVENTION

However, in the case of the FEC method, it becomes necessary to have time for storing data of a block size in order to perform the FEC coding processing and decoding processing. Thus, if the FEC block size is determined to be large, the delay time may increase drastically. To put it in another way, in data transmission which is requested to have a low delay, it may be difficult to sufficiently improve recovery performance on burst packet losses by the EFC method.

The present invention addresses the above-described and other problems. It is desirable to minimize a delay by the FEC processing while maintaining recovery performance on burst packet losses by adjusting the FEC block size in accordance with a related range of video compressed data with respect to input data.

According to an embodiment of the present invention, there is provided an information processing apparatus including: a coding means for generating hierarchical data hierarchized in descending order of importance with respect to resolution from image data, and coding the hierarchical data for each hierarchy; and a redundancy coding means for blocking the hierarchical data for each of the hierarchies using a block size determined for each of the hierarchies on the basis of dependencies of the hierarchies between pieces of the hierarchical data generated by the coding means or between the hierarchical data and the image data, and performing redundancy coding to generate redundant data of the hierarchical data for each of the blocks.

In the above-described embodiment, the information processing apparatus may further include a block-size determination means for determining the block size for each of the hierarchies on the basis of the dependencies of the hierarchies between pieces of the hierarchical data generated by the coding means or between the hierarchical data and the image data, wherein the redundancy coding means performs blocking on the hierarchical data for each of the hierarchies using the block size determined by the block-size determination means, and performing redundancy coding to generate redundant data of the hierarchical data for each of the blocks.

The block-size determination means may set the block size to a larger value as a hierarchy has a wider range of dependency in the dependencies of the hierarchies.

In the above-described embodiment, the information processing apparatus may further include a redundancy determination means for determining the redundancy of the redundancy coding for each of the hierarchies on the basis of the dependencies of the hierarchies between pieces of the hierarchical data generated by the coding means or between the hierarchical data and the image data, wherein the redundancy coding means performs blocking on the hierarchical data for each of the hierarchies using the block size determined by the block-size determination means, and performs redundancy coding to generate redundant data of the hierarchical data using the redundancy determined by the redundancy determination means for each of the blocks.

In the above-described embodiment, the information processing apparatus may further include a transmission means for transmitting packets of the hierarchical data having been subjected to redundancy coding by the redundancy coding means and packets of the redundant data to another information processing apparatus through a network; and a propagation-delay calculation means for calculating an average value of propagation delays of the network in a predetermined time period, wherein the block-size determination means determines the block size for each of the hierarchies on the basis of the average value of the propagation delays calculated by the propagation-delay calculation means in addition to the dependencies of the hierarchies.

In the above-described embodiment, the information processing apparatus may further include a transmission means for transmitting packets of the hierarchical data having been subjected to redundancy coding by the redundancy coding means and packets of the redundant data to another information processing apparatus through a network; and a maximum-propagation-delay calculation means for calculating a maximum value of the propagation delays in a predetermined time period, wherein the block-size determination means determines the block size for each of the hierarchies on the basis of the maximum value of the propagation delays calculated by the maximum-propagation-delay calculation means in addition to the dependencies of the hierarchies.

The coding means may generate the hierarchical data hierarchized in descending order of importance with respect to an SNR (Signal to Noise Ratio), a spatial resolution, or a time-direction resolution, and coding the hierarchical data for each hierarchy.

The coding means may recursively repeat dividing processing of the image data or the hierarchical data into a plurality of sub-bands so as to generate the hierarchical data for each of the plurality of hierarchized sub-bands, and coding the hierarchical data for each hierarchy.

According to another embodiment of the present invention, there is provided a method of processing information in an information processing apparatus processing image data, the method including the steps of: generating by a coding means hierarchical data hierarchized in descending order of importance with respect to resolution from the image data, and coding the hierarchical data for each hierarchy; and blocking the hierarchical data by a redundancy coding means for each of the hierarchies using a block size determined for each of the hierarchies on the basis of dependencies of the hierarchies between pieces of the hierarchical data or between the hierarchical data and the image data, and performing redundancy coding to generate redundant data of the hierarchical data for each of the blocks.

By an embodiment of the present invention, hierarchical data hierarchized in descending order of importance with respect to resolution is generated, the hierarchical data is coded for each hierarchy, the hierarchical data is blocked for each hierarchy using the block size determined for each hierarchy on the basis of dependencies of the hierarchies between pieces of the hierarchical data or between the hierarchical data and the image data, and redundant data of the hierarchical data is generated for each block.

By the present invention, it is possible to transmit data so as to improve burst-packet-loss resilience while restraining an increase in unnecessary delays.

BRIEF DESCRIPTION OF THE DRAWINGS

FIG. 3 is a diagram illustrating an overview of analysis filtering;

DESCRIPTION OF THE PREFERRED EMBODIMENTS

In the following, descriptions will be given of embodiments of the present invention.

Figure 1:
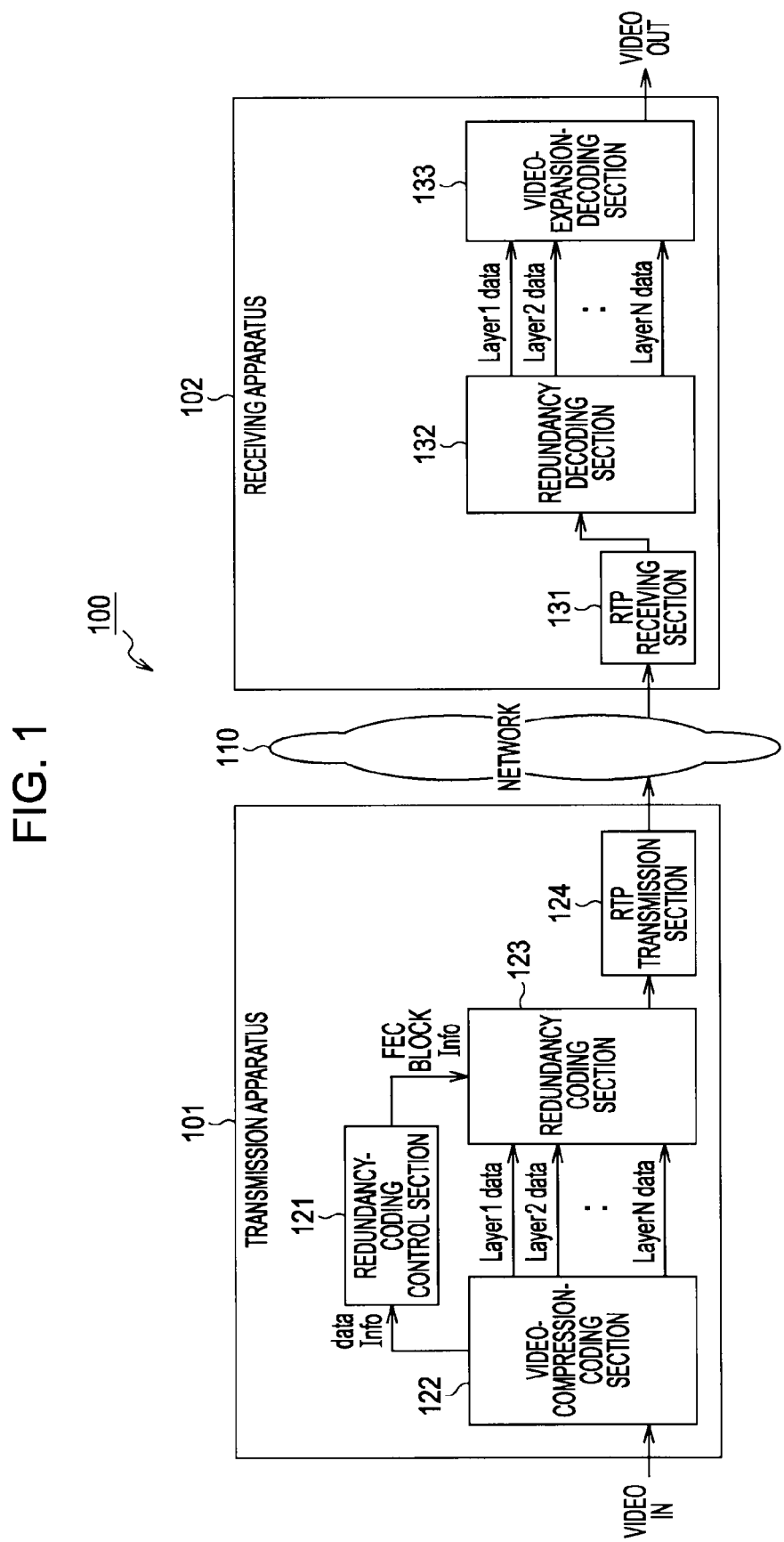
FIG. 1 is a block diagram illustrating an example of a main configuration of a network system to which the present invention is applied.

In this regard, the descriptions will be given in the following order.
1. First embodiment (network system: example of controlling FEC block size and redundancy in accordance with a hierarchy)
2. Second embodiment (transmission apparatus: example of storing FEC block size and redundancy in advance)
3. Third embodiment (transmission apparatus: example of setting target FEC-block-loss rate for each hierarchy)
4. Fourth embodiment (network system: example of reflecting network state information on the setting of FEC block size and redundancy using RTCP)
5. Fifth embodiment (transmission apparatus: example of calculating maximum round-trip delay time)
6. Sixth embodiment (transmission apparatus: example of selecting the FEC coding control method)
   1. First Embodiment
   Example of Network System Configuration FIG. 1 is a block diagram illustrating an example of a main configuration of a network system to which the present invention is applied. Referring to FIG. 1, a network system 100 is a system in which a transmission apparatus 101 and a receiving apparatus 102 are connected through a network 110. The network system 100 is a system for transmitting image data (video or still image data) from the transmission apparatus 101 to the receiving apparatus 102 through the network 110. In the following, for the sake of convenience of explanation, a description will be given of the case of transmitting video data. However, the following explanation can also be applied to the transmission of still image data. A video is considered to be a set of frame images or field images, that is to say, a set of still images. Accordingly, it is possible for the network system 100 to transmit still image data by performing basically the same processing as the case of transmitting video data, which is described below.

The transmission apparatus 101 performs coding on input video data (video IN), packetizes the data, and transmits the packets to the receiving apparatus 102 through the network 110. As shown in FIG. 1, the transmission apparatus 101 has a redundancy-coding control section 121, a video-compression-coding section 122, a redundancy coding section 123, and an RTP transmission section 124.

The redundancy-coding control section 121 determines the block size and the redundancy of redundancy coding performed by the redundancy coding section 123. The video-compression-coding section 122 performs compression coding on the video data (video IN) input into the transmission apparatus 101, and supplies the generated coded data to the redundancy coding section 123.

The redundancy coding section 123 performs redundancy coding on the coded data supplied from the video-compression-coding section 122. The redundancy coding section 123 performs blocking on the coded data using the block size determined by the redundancy-coding control section 121. The redundancy coding section 123 performs RTP packetization on the coded data for each block. The redundancy coding section 123 generates redundant data (redundant packet) at the redundancy determined by the redundancy-coding control section 121. The redundancy coding section 123 supplies the generated RTP packets to the RTP transmission section 124.

The RTP transmission section 124 transmits the supplied RTP packets to the receiving apparatus 102 through the network 110.

The receiving apparatus 102 receives RTP packets transmitted from the transmission apparatus 101 through the network 110, and performs de-packetization, redundancy decoding, and expansion decoding to generate the video data, and output the data. As shown in FIG. 1, the receiving apparatus 102 has an RTP receiving section 131, a redundancy decoding section 132, and a video-expansion-decoding section 133.

The RTP receiving section 131 receives the RTP packets transmitted to the receiving apparatus 102, and supplies the packets to the redundancy decoding section 132. The redundancy decoding section 132 performs redundancy decoding on the supplied RTP packets by the decoding method corresponding to the redundancy coding method of the redundancy coding section 123. If there is a loss, the redundancy decoding section 132 recovers the original packet using the redundant data, and extracts the coded data. The redundancy decoding section 132 supplies the obtained coded data to the video-expansion-decoding section 133. The video-expansion-decoding section 133 performs expansion decoding on the coded data by the method corresponding to the compression coding method of the video-compression-coding section 122 to generate baseband video data. The video-expansion-decoding section 133 outputs the generated video data from the receiving apparatus 102.

Description of video compression coding and expansion decoding

Next, descriptions will be given of examples of video compression coding and expansion decoding performed by the video-compression-coding section 122 and by the video-expansion-decoding section 133, respectively.

Figure 2:
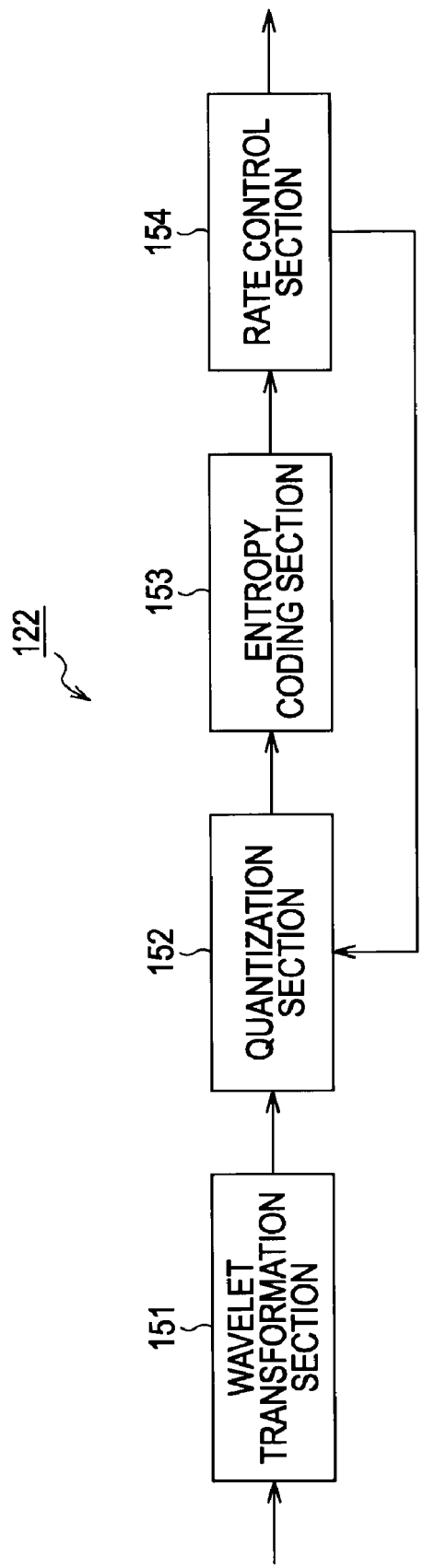
FIG. 2 is a block diagram illustrating an example of a configuration of a video-compression coding section.

FIG. 2 is a block diagram illustrating an example of a detailed configuration of the video-compression coding section 122. The video-compression coding section 122 hierarchizes image data in descending order of importance with respect to resolution, and performs hierarchical coding, which carries out coding for each hierarchy. For example, the video-compression coding section 122 generates hierarchical data hierarchized in descending order of importance with respect to spatial resolution. Also, for example, the video-compression coding section 122 generates hierarchical data hierarchized in descending order of importance with respect to time-directional resolution. Further, for example, the video-compression coding section 122 generates hierarchical data hierarchized in descending order of importance with respect to an SNS (Signal to Noise Ratio). The video-compression coding section 122 performs coding on the hierarchical data generated in this manner for each hierarchy.

As such hierarchical coding, for example the JPEG (Joint Photographic Experts Group) 2000 system, in which each picture of video data is subjected to wavelet transformation and entropy coding, is provided. In the system, any method of hierarchical coding is used. In the following, a description will be given of the case in which the video-compression-coding section 122 performs wavelet transformation on video data for each plurality of lines, and performs entropy coding.

As shown in FIG. 2, the video-compression coding section 122 has a wavelet transformation section 151, a quantization section 152, an entropy coding section 153, and a rate control section 154. The wavelet transformation section 151 performs wavelet transformation on each picture of video data for each plurality of lines.

The wavelet transformation is processing performing analysis filter processing, which divides input data into low-frequency components and high-frequency components, both in a horizontal direction and a vertical direction of the screen. That is to say, by the wavelet transformation processing, input data is divided into four components (sub-bands), namely, components having a low frequency both in the horizontal direction and the vertical direction (LL components), components having a high frequency in the horizontal direction and a low frequency in the vertical direction (HL components), components having a low frequency in the horizontal direction and a high frequency in the vertical direction (LH components), and components having a high frequency both in the horizontal direction and the vertical direction (HH components).

The wavelet transformation section 151 recursively performs such wavelet transformation on the components having a low frequency both in the horizontal direction and the vertical direction (LL components) obtained by analysis filter processing for a predetermined number of times. That is to say, by the wavelet transformation, each picture of video data is divided into a plurality of hierarchical sub-bands (frequency components) (hierarchical data is generated). The entropy coding section 153 performs coding for each of the sub-bands.

The image data of each picture of video is input into the wavelet transformation section 151 by each one line downward from top in sequence. Also, the image data of each line is input by one sample (one column) rightward from left of the image in sequence.

The wavelet transformation section 151 performs analysis filtering (horizontal analysis filtering) in the horizontal direction of the image on the image data input in such a way each time (as soon as receives input) the data of the number of samples capable of being subjected to analysis filtering is input. For example, the wavelet transformation section 151 performs horizontal analysis filtering on the baseband image data 161 shown on the left in FIG. 3 each time M columns of data is input, and divides the data into low-frequency components (L) and high-frequency components (H) for each line in the horizontal direction. A horizontal filter processing result 162 shown on the right in FIG. 3 indicates low-frequency components (L) and high-frequency components (H) for N lines in the horizontal direction, which are divided by the wavelet transformation section 151.

Next, the wavelet transformation section 151 performs analysis filtering in the vertical direction (vertical analysis filtering) on each component of the horizontal filter processing result 162. When the wavelet transformation section 151 generates coefficients necessary for the vertical filtering by the horizontal analysis filtering, the wavelet transformation section 151 performs vertical analysis filtering on the coefficients necessary for the vertical filtering for each column.

Figure 4:
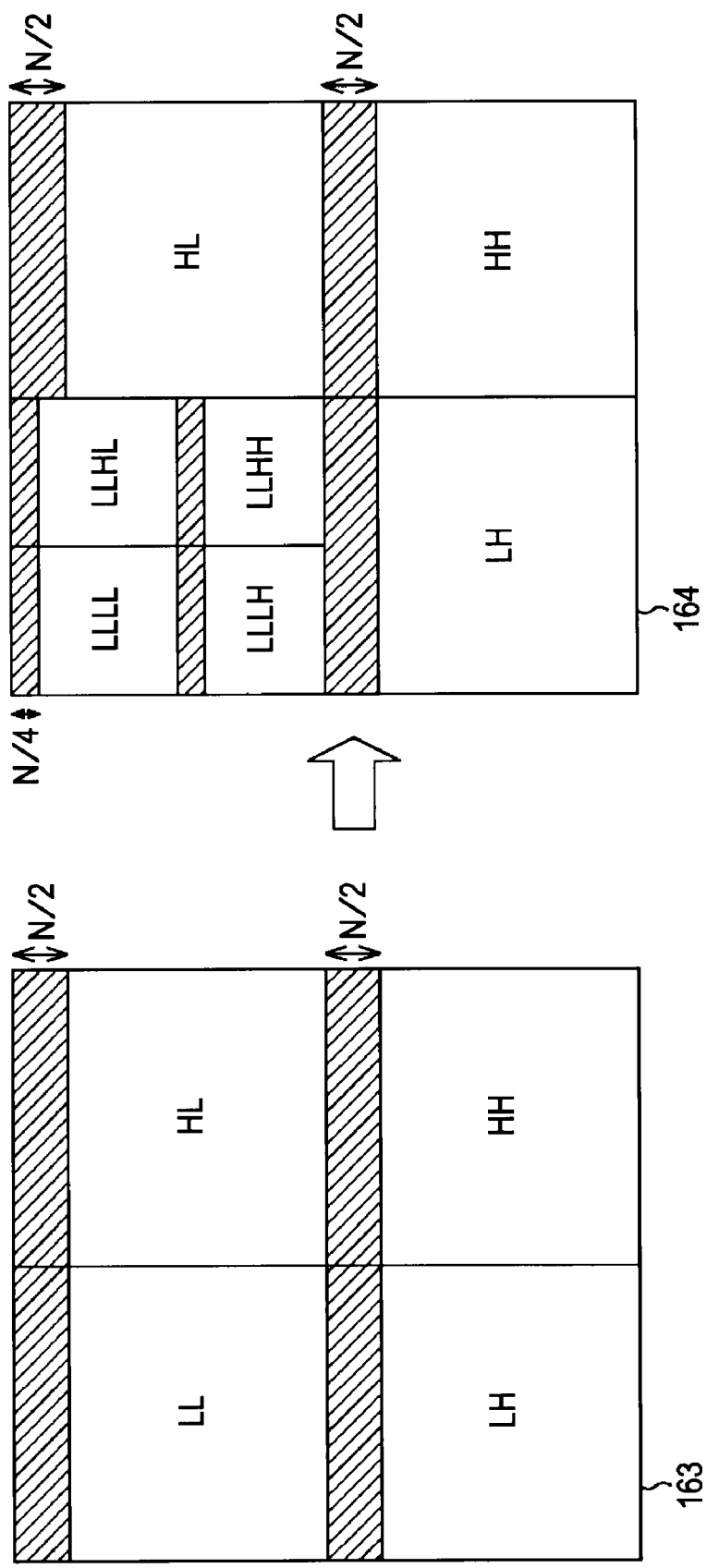
FIG. 4 is the subsequent diagram of FIG. 3, which illustrates an overview of analysis filtering.

As a result, as shown on the left in FIG. 4, the horizontal filter processing result 162 is divided into the wavelet transformation coefficients (in the following, called coefficients) of four components, namely, components having a low frequency both in the horizontal direction and the vertical direction (LL components), components having a high frequency in the horizontal direction and a low frequency in the vertical direction (HL components), components having a low frequency in the horizontal direction and a high frequency in the vertical direction (LH components), and components having a high frequency both in the horizontal direction and the vertical direction (HH components) (hierarchical data 163).

The HL components, the LH components, and the HH components are output to the outside out of the obtained result of the analysis filtering until the coefficients of a predetermined hierarchy (division level) are obtained. The remaining LL components are subjected to analysis filtering again by the wavelet transformation section 151. That is to say, for example, the hierarchical data 163 shown on the left in FIG. 4 is converted into hierarchical data 164 shown on the right in FIG. 4. In the hierarchical data 164, four components, namely the LLLL components, the LLHL components, the LLLH components, and the LLHH components are generated from the LL components.

Figure 5:
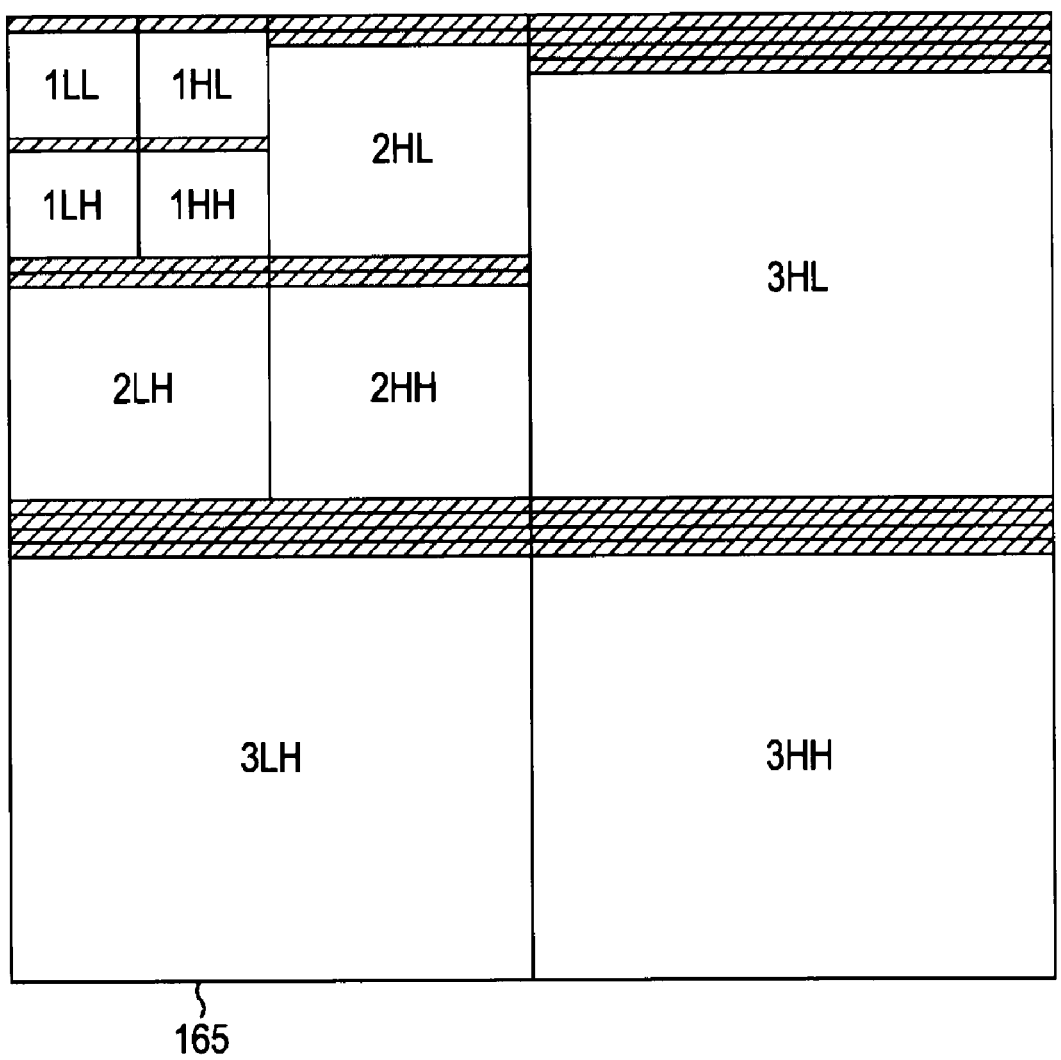
FIG. 5 is a diagram illustrating line blocks.

The wavelet transformation section 151 recursively performs such analysis filtering on the video data for a predetermined number of times to generate hierarchical data hierarchized up to a desired division level. FIG. 5 is a diagram illustrating an example of the hierarchical data hierarchized up to a division level-3 (third hierarchy). In FIG. 5, hierarchical data 165, which is divided up to the division level-3 (third hierarchy) includes individual sub-bands of a division level-1 (hierarchy number 3), 3HL components, 3LH components, and 3HH components, a division level-2 (hierarchy number 2), 2HL components, 2LH components, and 2HH components, and a division level-3 (hierarchy number 1), 1LL components, 1HL components, 1LH components, and 1HH components.

In the wavelet transformation processing, the number of lines produced becomes the reciprocal of a power of two times smaller each time the filtering processing is repeated (each time a hierarchy becomes one step lower). The number of baseband lines necessary for generating one line of the coefficients of the final division level (hierarchy number 1) is determined by the number of repetitions of the filtering processing. Usually, the number of hierarchies is determined in advance.

The baseband image data (the image data for a plurality of lines) necessary for generating one line of final division level coefficients or the whole of the coefficients of individual hierarchies is called a precinct (or a line block).

In FIG. 5, shaded portions are coefficients forming one precinct. As shown in FIG. 5, the precinct includes one line of coefficients of individual components of the hierarchy number 1, two lines of coefficients of individual components of the hierarchy number 2, and four lines of coefficients of individual components of the hierarchy number 3. In this regard, the image data before the analysis filtering corresponding to these, that is to say, eight lines of image data in this example is also called a precinct (or a line block).

Next, a specific description will be given of a calculation method in the above-described analysis filtering. The most general calculation method in the analysis filtering is a method called a convolutional calculation. The convolutional calculation is the most basic means for achieving a digital filter, and is convolutional multiplication of actual input data and the tap coefficients of the filter. However, in the convolutional calculation, if a tap length is great, the calculation load may increase by that amount.

As a method of addressing this problem, there is a famous lifting technique on the wavelet transformation, which is introduced by the paper "W. Swelden, "The lifting scheme: A custom-design construction of Biorhtogonal wavelets", Applied and Computational Harmonic Analysis, vol 3, no. 2, pp. 186-200, 1996".

Figure 6:
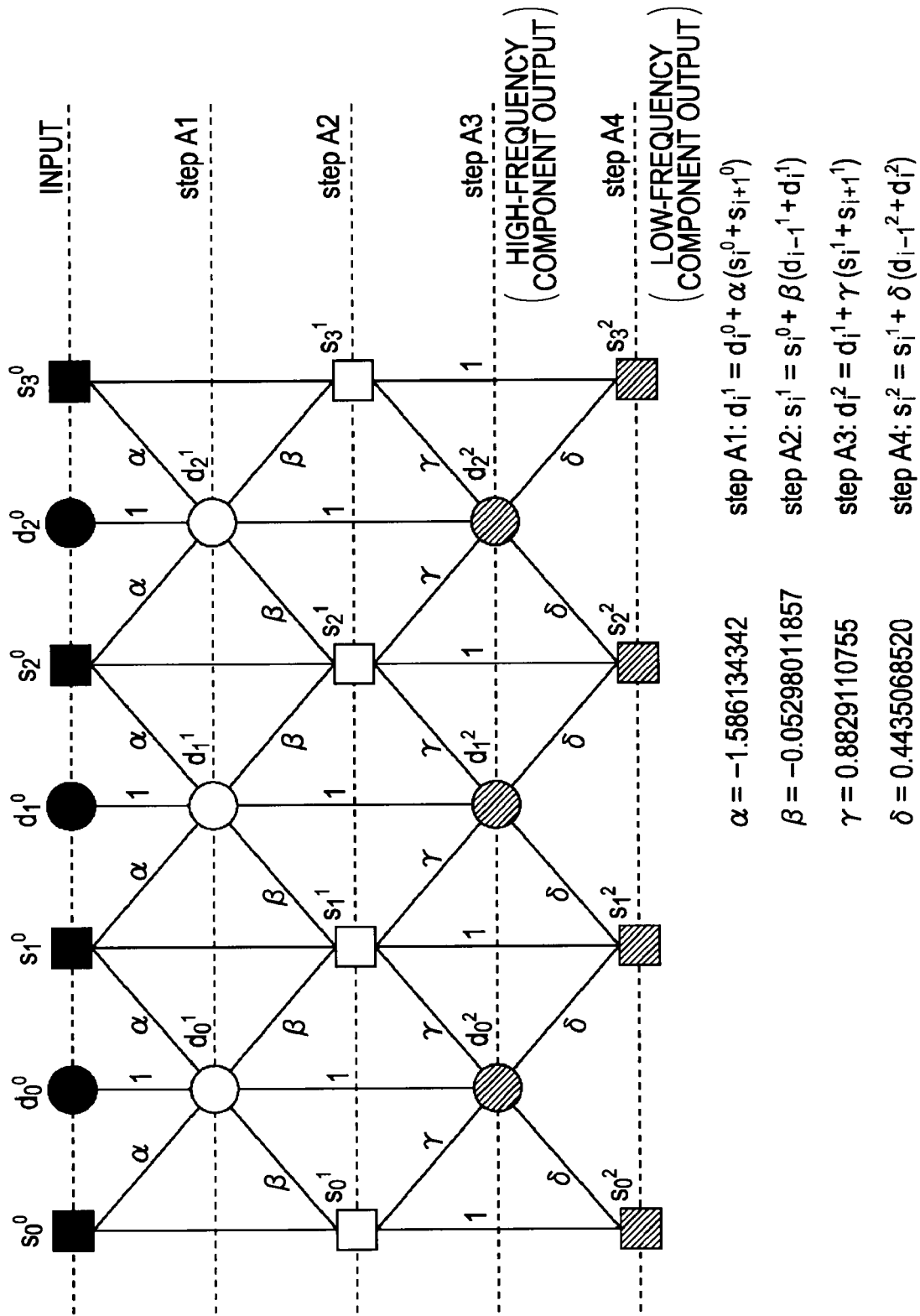
FIG. 6 is a diagram illustrating an example of a 9×7 filter.

FIG. 6 illustrates a lifting structure of a 9×7 analysis filter which is also adopted by the JPEG2000 standard. A description will be given of analysis filtering when a lifting technique is applied to the 9×7 analysis filter.

In the example in FIG. 6, a first step (highest step) shows a sample group (pixel columns) of an input image, a second step and a third step show components (coefficients) generated in the processing of step A1 and step A2, respectively. Also, a fourth step shows a high-frequency component output generated by the processing in step A3, a fifth step shows a low-frequency component output generated by the processing in step A4. The highest step is not limited to a sample group of an input image, but may be the coefficients obtained by the prior analysis filtering. Here, the highest step is assumed to be a sample group of an input image, a square mark (■) is an even-numbered sample or line, and a circular mark (•) is an odd-numbered sample or line.

In analysis filtering in which the lifting technique is applied to the 9×7 analysis filter, high-frequency components are obtained by the processing of step A3, and low-frequency components are obtained by the processing of step A4. In this regard, the processing of steps A1 to A4 are expressed by the following expressions (1) to (4).

$$\text{Step A1: } d_i^1 = d_i^0 + \alpha(s_i^0 + s_{i+1}^0) \quad (1)$$

$$\text{Step A2: } s_i^1 = s_i^0 + \beta(d_{i-1}^1 + d_i^1) \quad (2)$$

$$\text{Step A3: } d_i^2 = d_i^1 + \gamma(s_i^1 + s_{i+1}^1) \quad (3)$$

$$\text{Step A4: } s_i^2 = s_i^1 + \delta(d_{i-1}^2 + d_i^2) \quad (4)$$

($\alpha = -1.586134342$, $\beta = -0.05298011857$, $\gamma = 0.8829110755$, $\delta = 0.4435068520$)

In this manner, in the analysis filtering to which the lifting technique is applied, the processing of steps A1 and A2 is performed, the coefficients of high-frequency components are generated in step A3, and then the coefficients of low-frequency components are generated in step A4. The filter bank used at this time can be achieved only by additions and shift operations as shown in Expressions (1) to (4). Accordingly, the amount of calculation can be decreased significantly. Thus, as described below, the lifting technique is applied to the horizontal analysis filtering and the vertical analysis filtering.

Figure 7:
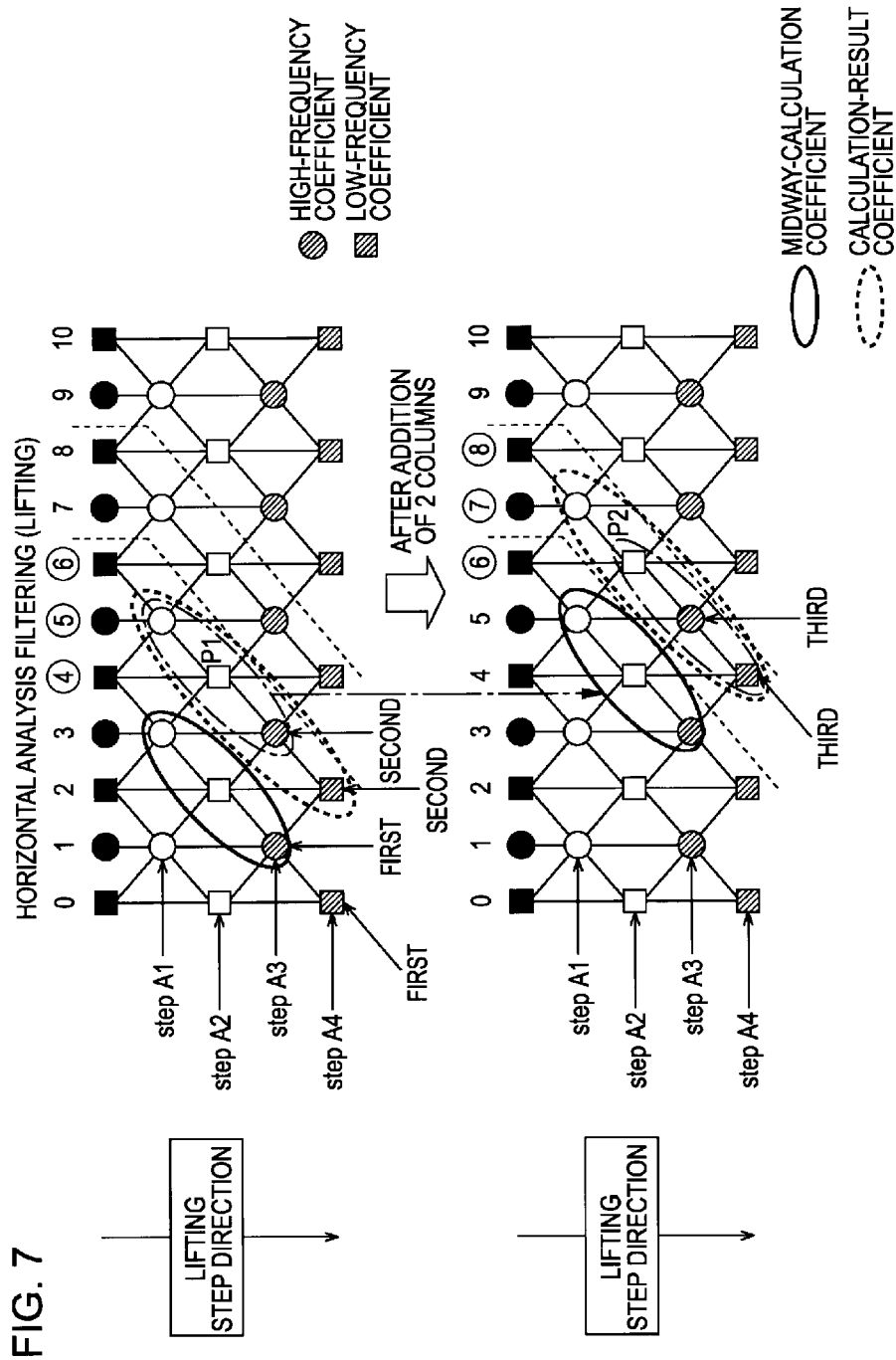
FIG. 7 is a diagram illustrating an example of lifting operation.

First, a specific description will be given of the processing of the horizontal analysis filtering. FIG. 7 illustrates an example of the case where horizontal analysis filtering is performed by the lifting structure in FIG. 6.

The example in FIG. 7 illustrates the case where input horizontal-direction coefficients are subjected to the processing of the four steps (steps A1 to A4) described above in FIG. 6, and then high-frequency component coefficients (in the following, called high-frequency coefficients) and low-frequency component coefficients (in the following, called low-frequency coefficients) are generated. The direction of the lifting step goes from top downward in the figure. Also, the numbers shown above the horizontal direction coefficients represent the column numbers.

Further, the circles and squares of the first step from top represent input high-frequency coefficients and low-frequency coefficients, respectively. And the circles and squares of the second and subsequent steps represent high-frequency coefficients and low-frequency coefficients that are generated in the process of the lifting operation. Among these, hatched circles and squares represent high-frequency coefficients and low-frequency coefficients, respectively, which are the results of the lifting operations.

In the following, a description will be given of the operation in sequence from top. An upper step in FIG. 7 illustrates an example of the case where the coefficients of the three columns, the column numbers 4 to 6 in the horizontal direction, are input, and operation by the horizontal-direction lifting structure (in the following, called "horizontal lifting operation") is performed.

In order to obtain a first high-frequency coefficient in step A3 of the horizontal lifting operation, and to obtain a first low-frequency coefficient in step A4, it is necessary to input the coefficients of four columns, the column numbers 0 to 4.

After that, in order to obtain the second high-frequency coefficient and low-frequency coefficient, three coefficients denoted by a heavy solid line and the coefficients of the two columns, column numbers 5 and 6, which are denoted by circled numbers, are necessary. Further, in order to calculate the coefficient denoted by P1 in step A2, the coefficient of column number 4 denoted by a circled number is also necessary.

The three coefficients denoted by the heavy solid line are part of the coefficients generated in the process of horizontal lifting operation (in the following, also called "the first horizontal lifting operation") for obtaining the first high-frequency coefficient and low-frequency coefficient.

That is to say, in order to obtain the second high-frequency coefficient and low-frequency coefficient, it is necessary to input the coefficients of the three columns, the column numbers 4 to 6, which are denoted by circled numbers after all. Further, it is necessary to latch the three coefficients, denoted by a heavy solid line, generated in the process of the first horizontal lifting operation as the coefficients for the midway calculation. In reality, as few as three coefficients are necessary, and thus it is possible to save this using a small-capacity storage area, such as a flip-flop.

Accordingly, the horizontal lifting operation is performed using the three coefficients, shown by the heavy solid line, latched in the first horizontal lifting operation and the coefficients of the three input columns, namely the column numbers 4 to 6. Thereby, four coefficients (shown by a heavy broken line) including the second high-frequency coefficients and low-frequency coefficients are generated at the end of the operation process. Among these, three coefficients shown by a chain-dotted line are the coefficients necessary for obtaining third high-frequency coefficients and low-frequency coefficients, and thus are latched by an internal flip-flop for the midway calculation coefficients.

The example is shown in the lower step in FIG. 7 of the case where after the coefficient of the column number 6 is input, the coefficients of two columns are additionally input in the horizontal direction, that is to say, the coefficients of the three columns, the column numbers 6 to 8, are input in the horizontal direction, and the horizontal lifting operation is performed.

In the same manner as the second case, in order to obtain the third high-frequency coefficient and low-frequency coefficient, it is necessary to have the three coefficients shown by the heavy solid line, and the coefficients of the two columns, the column numbers 7 and 8, shown by circled numbers. Further, in order to calculate the coefficient shown by P2 in step A2, it is necessary to have the coefficient of the column number 6 shown by a circled number.

In this regard, three coefficients shown by the heavy solid line in the lower step are latched in a flip-flop by the second horizontal lifting operation as shown by the chain-dotted line in the upper step.

Accordingly, the horizontal lifting operation is performed using the three coefficients, shown by the heavy solid line, latched in the second horizontal lifting operation and the coefficients of the three input columns of the column numbers 6 to 8. Thereby, four coefficients (shown by a heavy broken line) including the third high-frequency coefficients and low-frequency coefficients are generated. Among these, three coefficients shown by a chain-dotted line are the coefficients necessary for obtaining the fourth high-frequency coefficients and low-frequency coefficients, and thus are latched by an internal flip-flop for the midway calculation coefficients.

As described above, the horizontal lifting operation is performed to the rightmost column of the screen while inputting the coefficients for three columns in sequence and holding three coefficients for midway operations. Thereby, the horizontal-direction analysis filtering is completed.

In this regard, in the above, a description has been given of an example of the horizontal analysis filtering for one line by the lifting structure. A description will be given of the operation of the horizontal analysis filtering by the lifting structure while inputting a line of coefficients in sequence from top downward by the above-described operation with reference to FIG. 8. In this regard, in FIG. 8, the coefficients corresponding to FIGS. 6 and 7 are shown in the figure in the same manner, and thus the detailed description thereof will be omitted.

Figure 8:
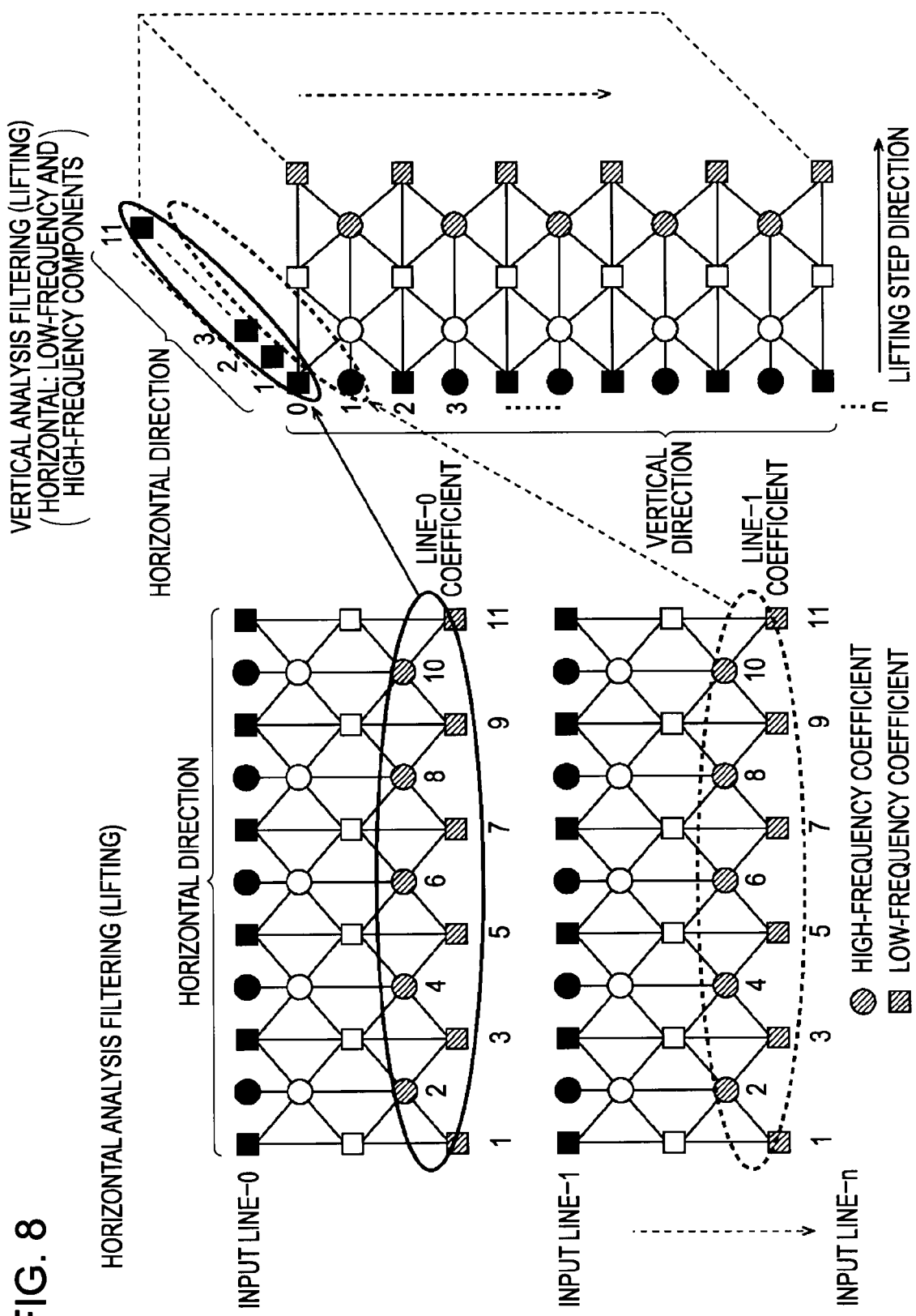
FIG. 8 is a diagram illustrating an example of lifting operation.

On the left side of FIG. 8, an example is shown of performing the horizontal lifting operation on each input line. On the right side, an example is schematically shown of performing the vertical lifting operation on the resultant coefficients of the horizontal lifting operation of each input line extended in sequence from top downward in the vertical direction.

A description will be given of the figure from left in sequence. The horizontal lifting operation including four steps is performed on the coefficients in the beginning input line-0, and thereby the low frequency coefficients and the high frequency coefficients, with numbers 1 to 11, are generated. Among these, the coefficients with odd-numbers (1, 3, 5, 7, 9, 11) are low-frequency coefficients, and the coefficients with even-numbers (2, 4, 6, 8, 10) are high-frequency coefficients.

Only an input line, line-1, is shown in the figure, but the same this is applied to input lines line-1 to line-n. That is to say, the horizontal lifting operation including four steps is performed on the coefficients in the beginning input line, line-1, and thereby the low-frequency coefficients and the high-frequency coefficients, with numbers 1 to 11, are generated. Among these, the coefficients with odd-numbers (1, 3, 5, 7, 9, 11) are low-frequency coefficients, and the coefficients with even-numbers (2, 4, 6, 8, 10) are high-frequency coefficients.

And, as shown on the right side of FIG. 8, the resultant coefficients with numbers 1 to 11 of the horizontal filtering of an input line, line-0, are extended in the horizontal-direction arrangement on the first step from top and from front to back. The resultant coefficients with numbers 1 to 11 of the horizontal filtering of the input line, line-1, are extended in the horizontal-direction arrangement on the first step from the second step and from front to back. The resultant coefficients of the horizontal filtering of the input line, line-2, are extended in the horizontal-direction arrangement on the third step from top from front to back.

As described above, as shown on the right side of FIG. 8, the resultant coefficients of the horizontal lifting on each of the input lines, line-0 to line-n, are extended in sequence from top downward in the vertical direction. In this regard, in reality, the resultant low-frequency and high-frequency coefficients with numbers 1 to 11 of the horizontal filtering of each input line are arranged alternately from front to back in the horizontal direction.

As soon as a predetermined number of coefficients in the vertical direction are gathered, that is to say, a predetermined number of lines are gathered, as shown by the lifting step direction on the right side, the operation by the lifting structure in the vertical direction (that is to say, the vertical lifting operation) is performed from left to right.

Figure 9:
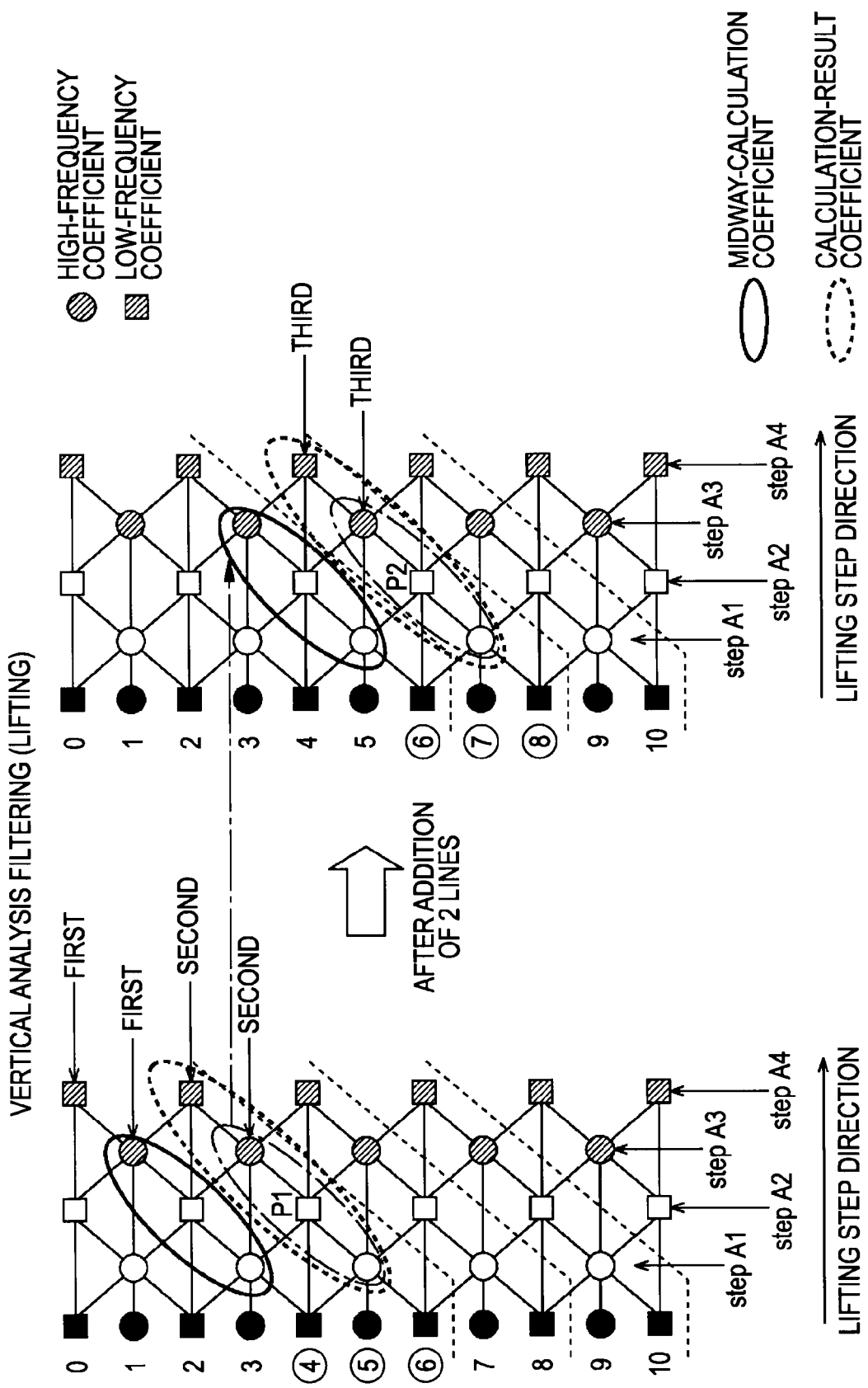
FIG. 9 is a diagram illustrating an example of lifting operation.

Next, a specific description will be given of the vertical analysis filtering. FIG. 9 illustrates an example of the case where vertical analysis filtering is performed by the lifting structure in FIG. 6.

In this regard, attention is focussed on one coefficient extended and arranged in the horizontal direction, shown schematically on the right side of FIG. 8. In the real two-dimensional wavelet transformation, it is obvious that the calculation of analysis filtering in the vertical direction becomes necessary for the number of coefficients in the horizontal direction of the frequency components (sub-bands) generated in the process of the wavelet transformation.

In FIG. 9, an example is shown of the case where the vertical-direction coefficients are subjected to the processing of the four steps (steps A1 to A4) described with reference to FIG. 6, and high-frequency coefficients and low-frequency coefficients are generated. The lifting step direction goes from left to right in the figure. Also, the numbers shown on the left of the vertical-direction coefficients represent line numbers.

Further, circles and squares of the first column from left represent input high-frequency coefficients and low-frequency coefficients, respectively. And circles and squares of the second and subsequent columns represent high-frequency coefficients and low-frequency coefficients that are generated in the process of the lifting operation. Among these, hatched circles and squares represent high-frequency coefficients and low-frequency coefficients, respectively, which are the results of the lifting operations.

In the following, a description will be given of the operation in sequence from left. The left side of FIG. 9 illustrates an example of the case where the coefficients of three lines, the line numbers 4 to 6 in the vertical direction, are input, and operation by the vertical-direction lifting structure is performed.

In order to obtain the first high-frequency coefficient in step A3 of the vertical lifting operation, and to obtain the first low-frequency coefficient in step A4, it is necessary to input the coefficients of four lines, the line numbers 0 to 4.

After that, in order to obtain the second high-frequency coefficient and low-frequency coefficient, three coefficients denoted by a heavy solid line and the coefficients of the two columns, line numbers 5 and 6, which are denoted by circled numbers, are necessary. Further, in order to calculate the coefficient denoted by P1 in step A2, the coefficient of line number 4 denoted by a circled number is also necessary.

The three coefficients denoted by the heavy solid line are part of the coefficients generated in the process of vertical lifting operation (in the following, also called "the first vertical lifting operation") for obtaining the first high-frequency coefficient and low-frequency coefficient.

That is to say, in order to obtain the second high-frequency coefficient and low-frequency coefficient, it is necessary to input the coefficients of the three lines, line numbers 4 to 6, which are denoted by circled numbers after all. Further, it is necessary to have the three coefficients, denoted by a heavy solid line, generated in the process of the first vertical lifting operation. The wavelet transformation section 151 stores the three coefficients as the coefficients for the midway calculation.

Accordingly, the vertical lifting operation is performed using the three coefficients, shown by the heavy solid line, stored in the first vertical lifting operation and the coefficients of the three lines, the line numbers 4 to 6, which are read from the buffers of the corresponding level and input. Thereby, four coefficients (shown by a heavy broken line) including the second high-frequency coefficients and low-frequency coefficients are obtained. Among these, three coefficients shown by a chain-dotted line are the coefficients necessary for obtaining third high-frequency coefficients and low-frequency coefficients, and thus are stored.

The example is shown, on the right side in FIG. 9, of the case where after the coefficient of the line number 6 is input, the coefficients of two lines are additionally input in the vertical direction, that is to say, the coefficients of the three lines, the line numbers 6 to 8, are input in the vertical direction, and the vertical lifting operation is performed.

In the same manner as the second case, in order to obtain the third high-frequency coefficient and low-frequency coefficient, it is necessary to have the three coefficients shown by the heavy solid line, and the coefficients of the two lines, the line numbers 7 and 8, shown by circled numbers 7 and 8. Further, in order to calculate the coefficient shown by P2 in step A2, it is necessary to have the coefficient of the line number 6 shown by a circled number.

In this regard, three coefficients shown by the heavy solid line on the right side are stored by the second vertical lifting operation as shown by the chain-dotted line on the left side. Accordingly, the vertical lifting operation is performed using the three coefficients, shown by the heavy solid line, stored in the second vertical lifting operation and the coefficients of the three input columns of the column numbers 6 to 8, which are read from the buffers of the corresponding level and input. Thereby, four coefficients (shown by a heavy broken line) including the third high-frequency coefficients and low-frequency coefficients are generated. Among these, three coefficients shown by a chain-dotted line are the coefficients necessary for obtaining the fourth high-frequency coefficients and low-frequency coefficients, and thus are stored.

As described above, the vertical lifting operation is performed to the lowest line while inputting the coefficients for three columns and holding three coefficients for midway operations. Thereby, the vertical-direction analysis filtering is completed.

Referring back to FIG. 2, the quantization section 152 performs quantization by dividing the coefficients of individual components generated from the wavelet transformation section 151 by a quantization step size, for example to generate quantization coefficients. At this time, the quantization section 152 can set the quantization step size for each precinct (line block). This precinct includes all the frequency components (10 frequency components, from 1LL to 3HH, in the case of FIG. 5) of a certain image area, and thus if the quantization is performed for each precinct, the advantage of the multi-resolution analysis, which is the feature of the wavelet transformation, can be utilized. Also, only the number of precincts ought to be determined in all the screens, and thus the load of the quantization can be kept small.

Further, in general, energy of an image signal is concentrated in low-frequency components. Also, a human visual sense has a characteristic in which deterioration of low-frequency components is noticed more conspicuously. Thus, it is effective to use weighting such that the quantization step size in the sub-bands of the low-frequency components becomes small at the time of the quantization. By this weighting, a relatively large amount of information is allocated to the low-frequency components, and thus the overall subjective image quality is improved.

The entropy coding section 153 performs source coding on the quantization coefficients generated by the quantization section 152 to generate compressed coded code stream. For the source coding, for example, Huffman coding, which is used in the JPEG system and the MPEG (Moving Picture Experts Group) system, or a higher-precision arithmetic coding used in the JPEG 2000 system, can be used.

Here, in what range of coefficients the entropy coding is performed becomes a very important element directly related to the compression efficiency. For example, in the JPEG system and the MPEG system, DCT (Discrete Cosine Transform) is performed on 8×8 blocks, and Huffman coding is performed on the 64 generated DCT transformation coefficients, thereby compressing information. That is to say, the 64 DCT transformation coefficients become the range of the entropy coding.

Unlike the DCT performed on 8×8 blocks, the wavelet transformation section 151 performs the wavelet transformation on each line, and thus the entropy coding section 153 performs source coding independently for each frequency band (sub-band), and for each P line in each frequency band.

P has a minimum value of one line. If the number of lines is small, the reference information can be little and thus the memory capacity cab be reduced. On the contrary, if the number of lines is large, the amount of information increases as much, and thus the coding efficiency can be increased. However, if P becomes a value higher than the number of lines of a line block in each frequency band, it becomes necessary to have a line of the next line block. Accordingly, it is necessary to wait until the quantization coefficient data of the line block is generated by the wavelet transformation and quantization, and thus this time period becomes a delay time.

Thus, in order to have a low delay, it is necessary that P is equal to the number of lines in a line block or less. For example, in the example of FIG. 5, for frequency bands of 1LL, 1HL, 1LH, and 1HH, the number of lines in a line block=1, and thus P=1. Also, for the sub-bands of 2HL, 2LH, and 2HH, the number of lines in a line block=2, and thus P=1 or 2.

The rate control section 154 controls to adjust the rate to a final target bit rate or compression rate, and outputs coded code stream after the rate control to the outside. For example, the rate control section 154 transmits a control signal to the quantization section 152 so as to decrease the quantization step size in order to increase the bit rate, and to increase the quantization step size in order to decrease the bit rate.

Figure 10:
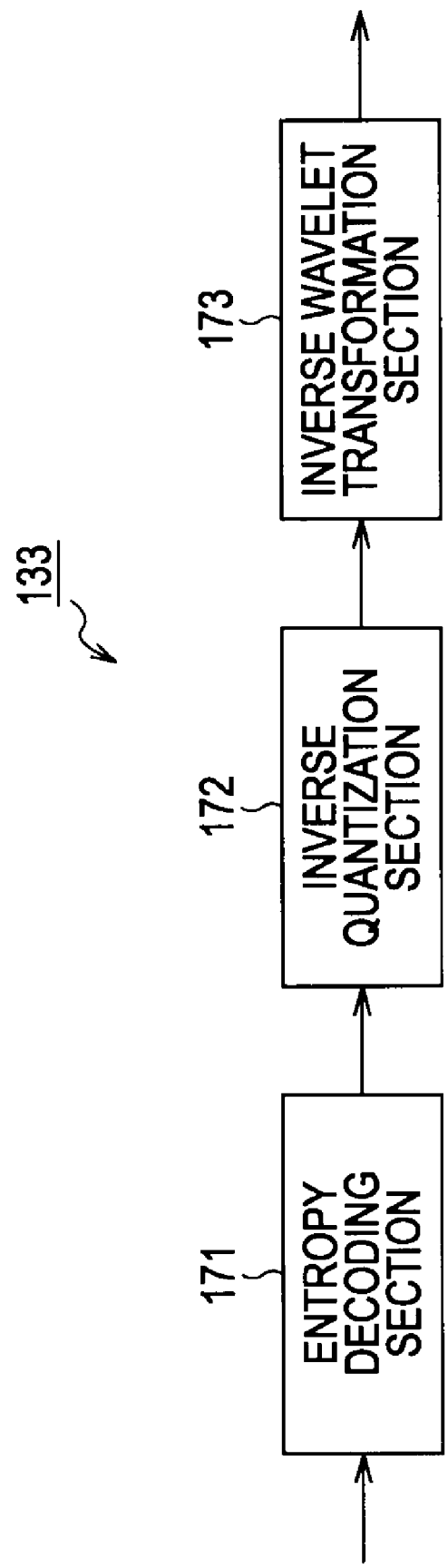
FIG. 10 is a block diagram illustrating an example of a configuration of a video-expansion-decoding section.

Next, a description will be given of a method of expansion-decoding the coded data having been subjected to compression coding as described above. FIG. 10 is a block diagram illustrating an example of a configuration of a video-extension-decoding section 133. In FIG. 10, the video-extension-decoding section 133 includes an entropy decoding section 171, an inverse quantization section 172, and an inverse wavelet transformation section 173.

The entropy decoding section 171 performs source decoding on the input coding data, and generates quantization coefficient data. For the source decoding, corresponding to the source coding of the video-compression-coding section 122, Huffman decoding, high-efficient arithmetic decoding, etc., can be used. In this regard, if the video-compression-coding section 122 performs source coding for each P line, the entropy decoding section 171 similarly performs source decoding independently for each sub-band and for each P line in each sub-band.

The inverse quantization section 172 performs inverse quantization by multiplying the quantization efficient data by the quantization step size to generate coefficient data. This quantization step size is usually described in a header of the coded code stream. In this regard, if the quantization step size is set for each line block in the video-compression-coding section 122, the inverse quantization step size is similarly set for each line in the inverse quantization section 172 for the inverse quantization.

The inverse wavelet transformation section 173 performs inverse processing of the wavelet transformation section 151. That is to say, the inverse wavelet transformation section 173 performs filter processing (synthesis filter processing) synthesizing low-frequency components and high-frequency components on the coefficient data having been divided into a plurality of frequency bands by the wavelet transformation section 151 both in the horizontal direction and in the vertical direction.

In response to the analysis filtering to which the above-described lifting technique is applied, it is desirable to similarly use the lifting technique in the synthesis filtering of the inverse wavelet transformation, because the filtering can be performed efficiently.

Figure 11:
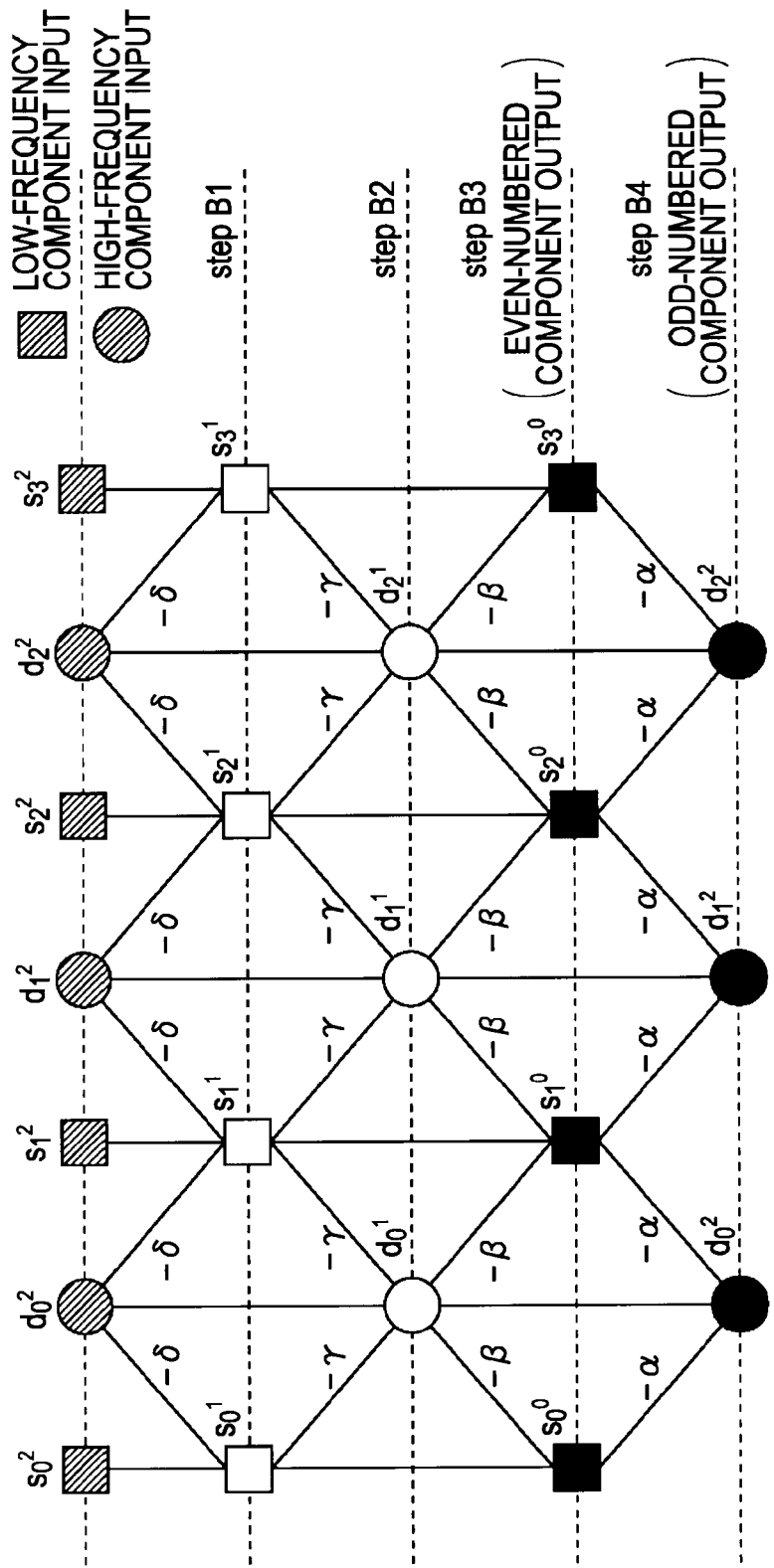
FIG. 11 is a diagram illustrating an example of a 9×7 filter.

FIG. 11 illustrates a lifting structure of a 9×7 analysis filter which is also adopted by the JPEG2000 standard. A description will be given of synthesis filtering when a lifting technique is applied to the 9×7 analysis filter.

In the example in FIG. 11, a first step (highest step) shows the coefficients generated by the wavelet transformation, a circular mark (•) denotes a coefficient of a high-frequency component, and a square mark (■) denotes a coefficient of a low-frequency component. A second step and a third step show components (coefficients) generated in the processing of step B1 and step B2, respectively. Also, a fourth step shows even-numbered component output generated by the processing in step B3, and a fifth step shows odd-numbered component output generated by the processing in step B4.

In synthesis filtering in which the lifting technique is applied to the 9×7 analysis filter, even-numbered components are obtained by the processing of step B3, and odd-numbered components are obtained by the processing of step B4. In this regard, the processing of steps B1 to B4 are expressed by the following expressions (5) to (8).

$$\text{Step B1: } s_i^1 = s_i^2 - \delta(d_{i-1}^2 + d_i^2) \quad (5)$$

$$\text{Step B2: } d_i^1 = d_i^2 - \gamma(s_i^1 + s_{i+1}^1) \quad (6)$$

$$\text{Step B3: } s_i^0 = s_i^1 - \beta(d_{i-1}^1 + d_i^1) \quad (7)$$

$$\text{Step B4: } d_i^2 = d_1^1 - \alpha(s_i^0 + s_{i+1}^0) \quad (8)$$

($\alpha = -1.586134342$, $\beta = -0.05298011857$, $\gamma = 0.8829110755$, $\delta = 0.4435068520$)

In this manner, in the synthesis filtering to which the lifting technique is applied, the processing of steps B1 and B2 is performed, the coefficients of even-numbered components are generated in step B3, and then the coefficients of odd-numbered components are generated in step B4. The filter bank used at this time can be achieved only by divisions and shift operations as shown in Expressions (5) to (8).

Thus, as described in the following, the lifting technique is also applied to the synthesis filtering in the image vertical direction (vertical synthesis filtering) and the synthesis filtering in the image horizontal direction (horizontal synthesis filtering) in the inverse wavelet transformation section 173. In this regard, only the expressions to be used are different. The vertical synthesis filtering basically performs the same operation as that of the vertical analysis filtering described with reference to FIG. 6, and the horizontal synthesis filtering basically performs the same operation as that of the horizontal analysis filtering describe with reference to FIG. 7.

Figure 12:
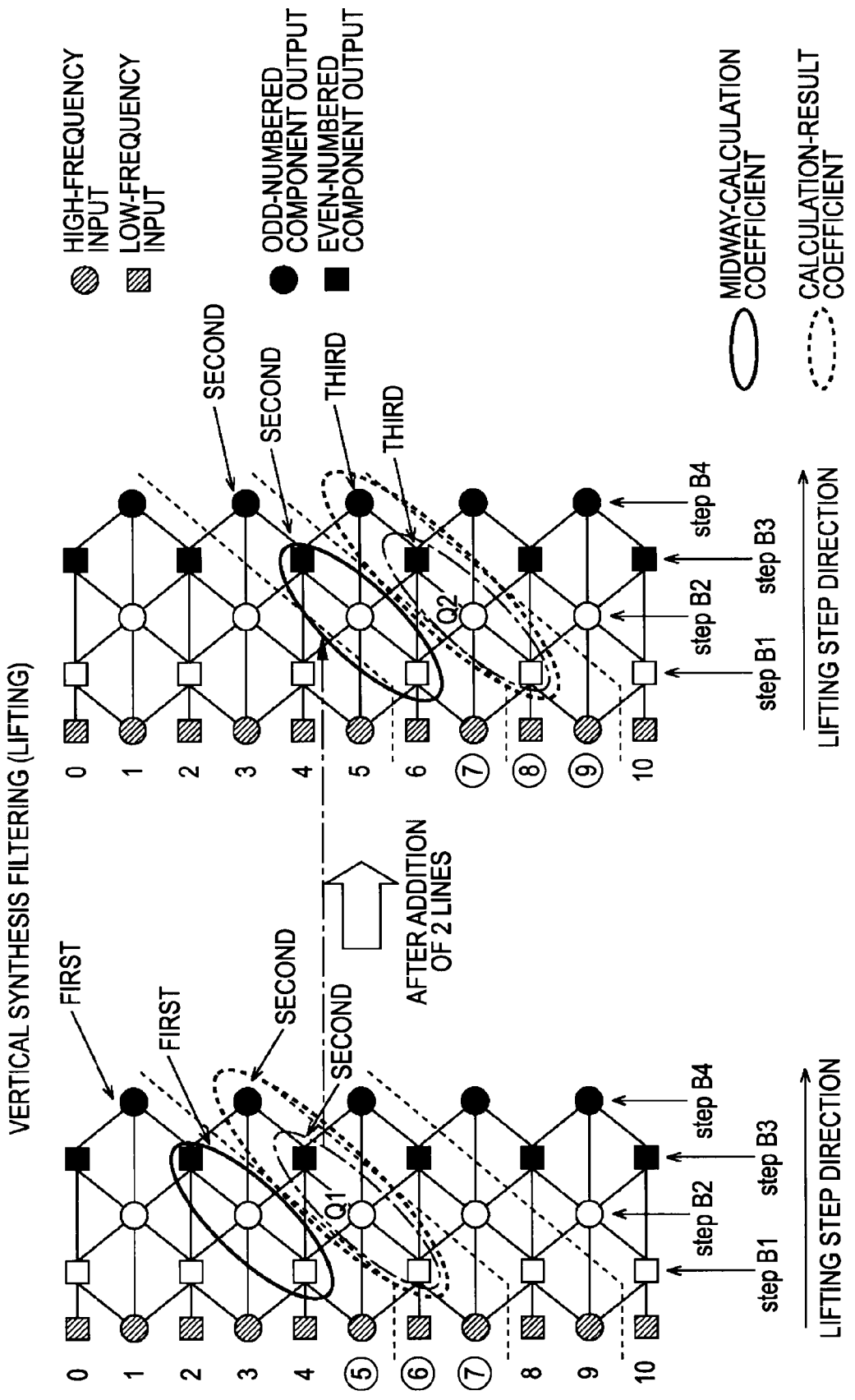
FIG. 12 is a diagram illustrating an example of lifting operation.

First, a specific description will be given of the processing of the vertical synthesis filtering. FIG. 12 illustrates an example of the case where horizontal synthesis filtering is performed on a group of vertical-direction coefficients by the lifting structure in FIG. 11.

The example in FIG. 12 illustrates the case where the vertical-direction coefficients are subjected to the processing of the four steps (steps B1 to B4) described above in FIG. 11, and then even-numbered order coefficients (in the following, called even-numbered coefficients) and odd-numbered order coefficients (in the following, called odd-numbered coefficients) are generated. The direction of the lifting step goes from left rightward in the figure.

Also, the numbers shown above the vertical-direction coefficients indicate the line numbers. The hatched circles and squares of the first column from left represent high-frequency input and low-frequency input, respectively. Further, the circles and squares of the second and subsequent columns represent high-frequency coefficients and low-frequency coefficients that are generated in the process of the lifting operation. Among these, black circles and black squares represent odd-numbered coefficients and even-numbered coefficients, respectively, which are the results of the lifting operations.

In the following, a description will be given of the operation in sequence from left. The left side of FIG. 12 illustrates an example of the case where the coefficients of the three lines, the line numbers 4 to 6 in the vertical direction, are input, and operation by the vertical-direction lifting structure (that is to say, vertical lifting operation) is performed. In this regard, in this case, the even-numbered coefficient in the uppermost step does not make a pair with an odd-numbered coefficient, and thus the description thereof will be omitted.

In order to obtain the first even-numbered coefficient in step B3 of the vertical lifting operation, and to obtain the first odd-numbered coefficient in step B4, it is necessary to input the coefficients of six lines, the line numbers 0 to 5.

After that, in order to obtain the second even-numbered coefficient and odd-numbered coefficient, three coefficients denoted by a heavy solid line and the coefficients of the two lines, line numbers 6 and 7, which are denoted by circled numbers, are necessary. Further, in order to calculate the coefficient denoted by Q1 in step B2, the coefficient of line number 5 denoted by a circled number is also necessary.

The three coefficients denoted by the heavy solid line are part of the coefficients generated in the process of vertical lifting operation (in the following, also called "the first vertical lifting operation") for obtaining the first even-numbered coefficient and odd-numbered coefficient.

Accordingly, in order to obtain the second even-numbered coefficient and odd-numbered coefficient, it is necessary to input the coefficients of the three lines, line numbers 5 to 7, which are denoted by circled numbers after all. Further, it is necessary to store the three coefficients, denoted by a heavy solid line, generated in the process of the vertical lifting operation for obtaining the first even-numbered coefficient and odd-numbered coefficient. In this regard, the coefficients of the three lines in the vertical direction are read for each level.

Accordingly, the vertical lifting operation is performed using the three coefficients, shown by the heavy solid line, stored in the buffer in the first vertical lifting operation and the coefficients of the three input lines, namely the line numbers 7 to 9. Thereby, four coefficients (shown by a heavy broken line) including the second even-numbered coefficients and odd-numbered coefficients are generated at the end of the operation process. Among these, three coefficients shown by a chain-dotted line are the coefficients necessary for obtaining third even-numbered coefficients and odd-numbered coefficients, and thus are stored.

The example is shown on the right side in FIG. 12 of the case where after the coefficient of the line number 7 is input, the coefficients of two lines are additionally input in the horizontal direction, that is to say, the coefficients of the three lines, the line numbers 7 to 9, are input in the vertical direction, and the vertical lifting operation is performed.

In the same manner as the second case, in order to obtain the third even-numbered coefficient and odd-numbered coefficient, it is necessary to have the three coefficients shown by the heavy solid line, and the coefficients of the two lines, the line numbers 8 and 9, shown by circled numbers. Further, in order to calculate the coefficient shown by Q2 in step B2, it is necessary to have the coefficient of the line number 7 shown by a circled number.

In this regard, three coefficients shown by the heavy solid line on the right side are stored in a coefficient buffer 66 by the second vertical lifting operation as shown by the chain-dotted line on the left side.

Accordingly, the vertical lifting operation is performed using the three coefficients, shown by the heavy solid line, stored in the second vertical lifting operation and the coefficients of the three input lines of the line numbers 7 to 9. Thereby, four coefficients (shown by a heavy broken line) including the third even-numbered coefficients and odd-numbered coefficients are generated. Among these, three coefficients shown by a chain-dotted line are the coefficients necessary for obtaining the third even-numbered coefficients and odd-numbered coefficients, and thus are stored.

As described above, the vertical lifting operation is performed to the lowest line of the screen while inputting the coefficients for three columns and holding three coefficients for midway operations. Thereby, the vertical-direction synthesis filtering is completed.

Figure 13:
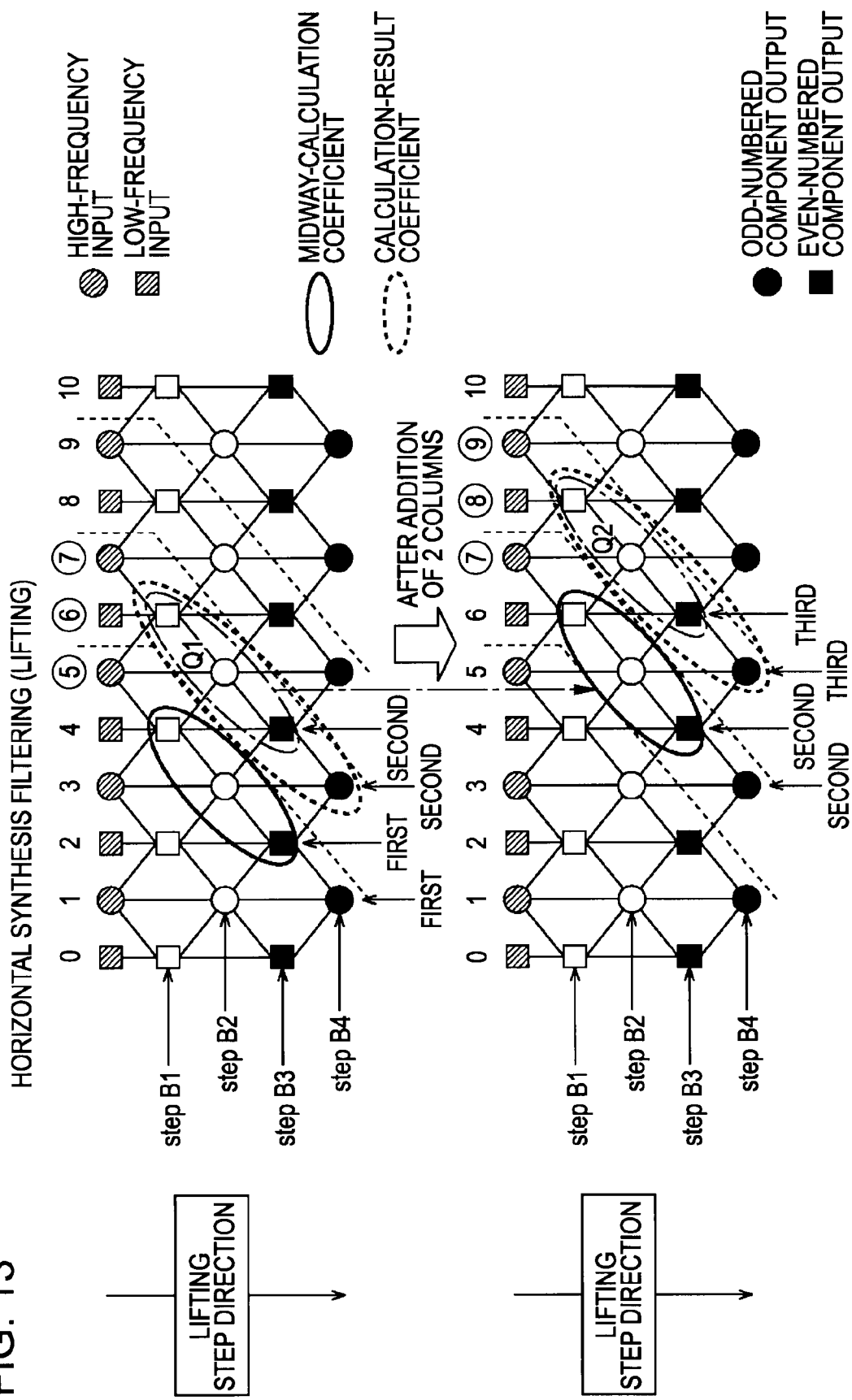
FIG. 13 is a diagram illustrating an example of lifting operation.

Next, a specific description will be given of the processing of the horizontal synthesis filtering. FIG. 13 illustrates an example of the case where the result of the vertical-direction synthesis filtering is arranged and horizontal analysis filtering is performed by the lifting structure in FIG. 11.

In the example of FIG. 13, an example is shown of the case where the horizontal-direction coefficients are subjected to the processing of the four steps (steps B1 to B4) described with reference to FIG. 11, and odd-numbered coefficients and even-numbered coefficients are generated. The lifting step direction goes from top downward in the figure.

Also, the numbers shown above the horizontal-direction coefficients represent column numbers. The hatched circles and squares of the first step from top represent input high-frequency coefficients and low-frequency coefficients, respectively. And circles and squares of the second and subsequent steps represent high-frequency coefficients and low-frequency coefficients that are generated in the process of the lifting operation. Among these, black circles and black squares represent high-frequency coefficients and low-frequency coefficients, respectively, which are the results of the lifting operations.

In the following, a description will be given of the operation in sequence from top. The upper step of FIG. 13 illustrates an example of the case where the coefficients of the three columns, the column numbers 5 to 7 in the horizontal direction, are input, and operation by the horizontal-direction lifting structure (in the following, called "horizontal lifting operation") is performed. In this regard, in this case, the even-numbered coefficient in the leftmost side does not make a pair with an odd-numbered coefficient, and thus the description thereof will be omitted.

In order to obtain the first even-numbered coefficient in step B3 of the horizontal lifting operation, and to obtain the first odd-numbered coefficient in step B4, it is necessary to input the coefficients of six lines, the line numbers 0 to 5.

After that, in order to obtain the second odd-numbered coefficient and even-numbered coefficient, three coefficients denoted by a heavy solid line and the coefficients of the two columns, column numbers 6 and 7, which are denoted by circled numbers, are necessary. Further, in order to calculate the coefficient denoted by Q1 in step B2, the coefficient of column number 5 denoted by a circled number is also necessary.

The three coefficients denoted by the heavy solid line are part of the coefficients generated in the process of horizontal lifting operation (in the following, also called "the first horizontal lifting operation") for obtaining the first odd-numbered coefficient and even-numbered coefficient.

That is to say, in order to obtain the second odd-numbered coefficient and even-numbered coefficient, it is necessary to input the coefficients of the three columns, column numbers 5 to 7, which are denoted by circled numbers after all. Further, it is necessary to latch the three coefficients, denoted by a heavy solid line, generated in the process of the first horizontal lifting operation. In reality, as few as three coefficients are necessary, and thus it is possible to save this using a small-capacity storage area, such as a flip-flop.

Accordingly, the horizontal lifting operation is performed using the three coefficients, shown by the heavy solid line, latched in the first horizontal lifting operation and the coefficients of the three input columns, namely the column numbers 5 to 7. Thereby, four coefficients (shown by a heavy broken line) including the second odd-numbered coefficients and even-numbered coefficients are generated at the end of the operation process. Among these, three coefficients shown by a chain-dotted line are the coefficients necessary for obtaining third odd-numbered coefficients and even-numbered coefficients, and thus are latched in an internal flip-flop.

The example is shown in the lower step in FIG. 13 of the case where after the coefficient of the column number 7 is input, the coefficients of two columns are additionally input in the horizontal direction, that is to say, the coefficients of the three columns, the column numbers 7 to 9, are input in the horizontal direction, and the horizontal lifting operation is performed.

In the same manner as the second case, in order to obtain the third odd-numbered coefficient and even-numbered coefficient, it is necessary to have the three coefficients shown by the heavy solid line, and the coefficients of the two columns, the column numbers 8 and 9, shown by circled numbers. Further, in order to calculate the coefficient shown by Q2 in step B2, it is necessary to have the coefficient of the column number 7 shown by a circled number.

In this regard, three coefficients shown by the heavy solid line in the lower step are latched by the second horizontal lifting operation as shown by the chain-dotted line in the upper step.

Accordingly, the horizontal lifting operation is performed using the three coefficients, shown by the heavy solid line, latched in the second horizontal lifting operation and the coefficients of the three newly input columns of the column numbers 7 to 9. Thereby, four coefficients (shown by a heavy broken line) including the third odd-numbered coefficients and even-numbered coefficients are generated. Among these, three coefficients shown by a chain-dotted line are the coefficients necessary for obtaining the fourth odd-numbered coefficients and even-numbered coefficients, and thus are latched by an internal flip-flop for the midway calculation coefficients.

As described above, the horizontal lifting operation is performed to the rightmost column of the screen while inputting the coefficients for three columns in sequence and holding three coefficients for midway operations. Thereby, the horizontal-direction synthesis filtering is completed.

As described above, the lifting structure of a 9×7 wavelet transformation filter is also used for the vertical synthesis filtering and the horizontal synthesis filtering. Thus, as described with reference to FIG. 10, it becomes necessary to have buffers for individual line coefficients storing the coefficients for three lines as the buffer of the corresponding division level. Further, in order to obtain the coefficients of Q1 and Q2 in FIG. 12, it becomes necessary to have the coefficients of the already used line for the next vertical lifting operation at the time of the vertical lifting operation.

Accordingly, in the internal configuration of the buffer corresponding to a level, the coefficients stored in the buffer of one line are transferred to the buffer of the adjacent line in sequence.

As described above, video data is subjected to the compression coding by the transmission apparatus 101, is transmitted and received as coded data, and is subjected to expansion decoding by the receiving apparatus 102.

Figure 14:
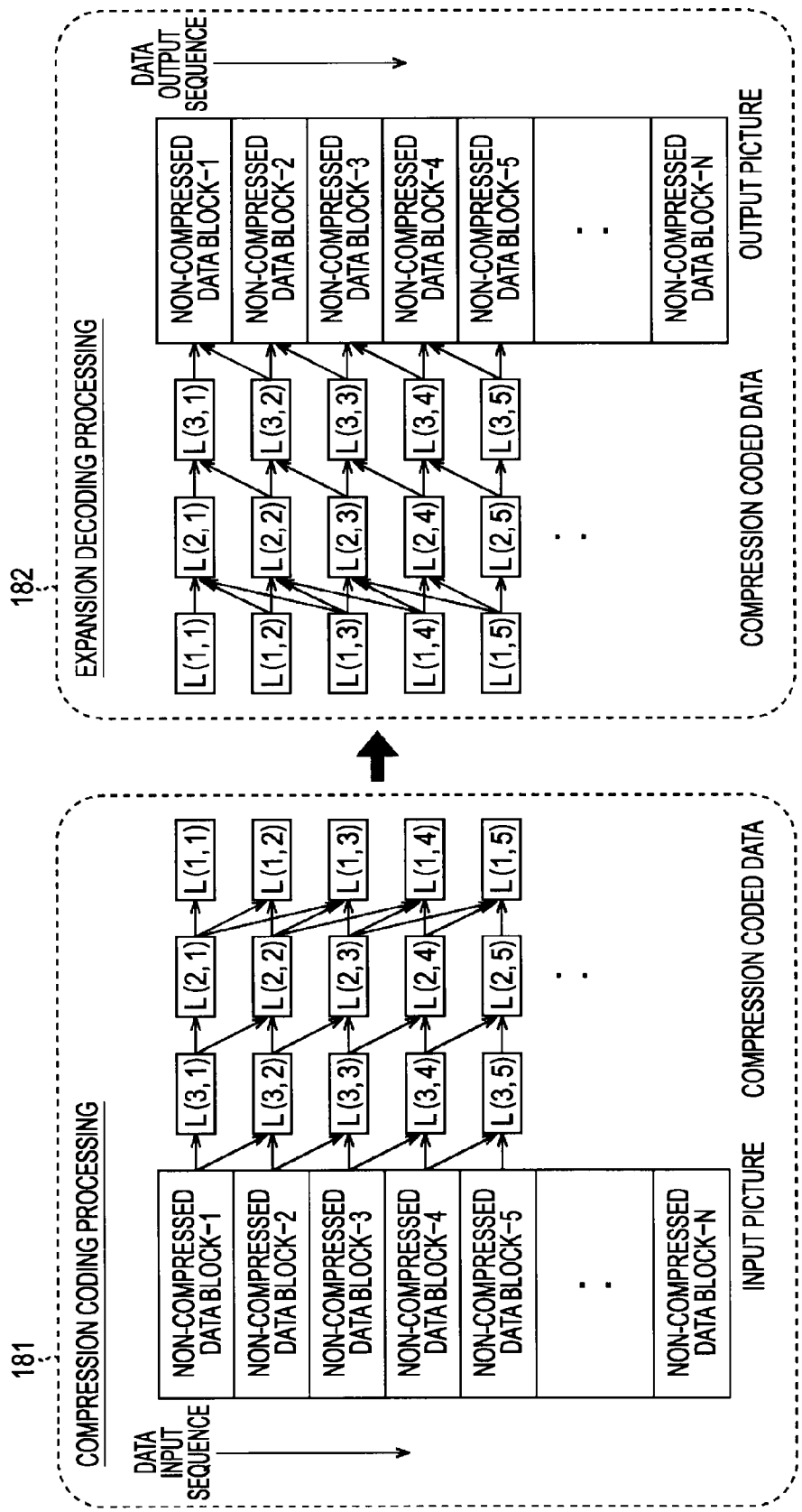
FIG. 14 is a diagram illustrating a state of compression coding processing and expansion decoding processing.

FIG. 14 schematically illustrates individual processing of compression coding processing and extension decoding processing. Compression coding processing 181 shown in FIG. 14 is performed by the transmission apparatus 101, and extension decoding processing 182 is performed by the receiving apparatus 102.

As shown in FIG. 14, in the compression coding processing 181, non-compressed image data of one picture is subjected to wavelet transformation for each plurality of lines (precinct), and is divided into a plurality of hierarchical sub-bands. The non-compressed data blocks 1 to N in FIG. 14 are individual image data for each precinct. When each of the non-compressed data blocks 1 to N is input, the block is subjected to wavelet transformation, and is divided into three hierarchical sub-bands. Each sub-band is subjected to entropy coding.

L(i, n) in FIG. 14 represents compression coded data of each hierarchical sub-band. Here, i denotes a hierarchy number. Also, n denotes a non-compressed data block number (precinct number) before the coding. In the case of FIG. 14, i=1, 2, 3, n=1, 2, . . . N.

The compression coded data L(i, n) of the hierarchy number 1 is four coded components in the lowest layer, the LL components, the HL components, the LH components, and the HH components. The compression coded data L(i, n) (i≧2) of the hierarchy having the hierarchy number 2 or more is three coded components in the layer, the HL components, the LH components, and the HH components.

As described above, analysis filtering is performed using the lifting operation. Accordingly, the vertical analysis filtering generates the compression coded data L(i, n) using not only the non-compressed data block n, but also data of the other blocks. That is to say, the compression coded data L(i, n) depends on the other blocks. The arrows between the non-compressed data block n and the compression coded data L(i, n) in FIG. 14 represents this dependency relationship.

For example, the compression coded data L(1, 5) of the hierarchy number 1 depends on the compression coded data L(2, 3), L(2, 4), and L(2, 5) of the hierarchy number 2, the compression coded data L(3, 2), L(3, 3), L(3, 4) and L(3, 5) of the hierarchy number 3, and the non-compressed data block 1, the non-compressed data block 2, the non-compressed data block 3, the non-compressed data block 4, and the non-compressed data block 5 of the non-compressed data. Also, the compression coded data L(2, 3) of the hierarchy number 2 depends on the compression coded data L(3, 2), and L(3, 3) of the hierarchy number 3, and the non-compressed data block 1, and the non-compressed data blocks 1 to 3 of the non-compressed data.

In this manner, the number of dependent non-compressed data blocks (range of dependency) is different for each hierarchy of the compression coded data. Input video data is input in sequence from top from the horizontal line of picture data through an interface, etc., such as the HD-SDI (High Definition Serial Digital Interface) standard, for example. Thus, individual compression coded data is not allowed to be generated (a sub-band is not generated) until the dependent non-compressed data blocks are input.

As shown in FIG. 14, each compression coded data L(i, n) is generated in ascending order of n, and thus is transmitted to the receiving apparatus 102 in that order.

As shown in FIG. 14, the extension decoding processing 182 is achieved by symmetrical processing to the compression coding processing 181. The dependency relationship is also the same. Thus, the non-compressed data block 1 is dependent on the compression coded data L(3, 1), and L(3, 3) of the hierarchy number 3, the compression coded data L(2, 1), L(2, 2), and L(2, 3) of the hierarchy number 2, and the compression coded data L(1, 1), L(1, 2), L(1, 3), L(1, 4), and L(1, 5) of the hierarchy number 1. Thus, the data is not decoded (generated) until all of the compression coded data is received.

Accordingly, when the number of hierarchies is three as an example in FIG. 14, in order for the extension decoding processing 182 to decode the non-compressed data block n, it is at least necessary for the compression coding processing 181 to have coded as far as the non-compressed data block (n+4). Thus, the principle delay, which occurs by an algorithm and excludes a transmission delay, etc., becomes the input time of the five non-compressed data blocks by adding the input time of the non-compressed data block n.

Description of Processing of Overall System

Figure 15:
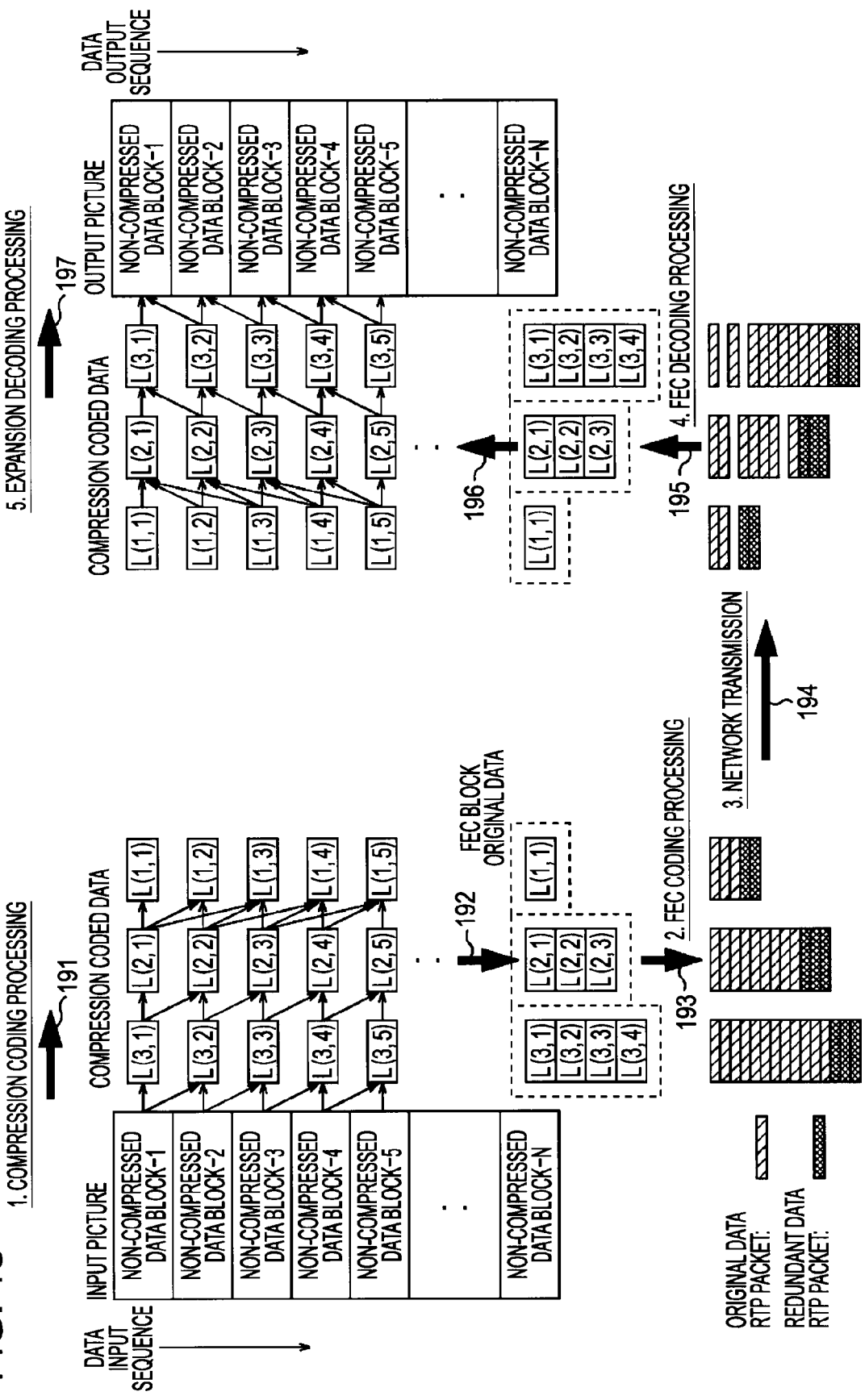
FIG. 15 is a diagram illustrating an overview of processing executed by individual sections of the network system.

Next, a description will be given of processing other than the compression coding and expansion decoding processing. FIG. 15 is a diagram illustrating an overview of processing executed by the network system in FIG. 1.

For example, the video data (video IN) input in the transmission apparatus 101 by the video input interface through a video camera, etc., is subjected to the hierarchical compression coding by the video-compression-coding section 122 as described above. Each picture of the video data is subjected to wavelet transformation for each block as shown by an arrow 191, and transformed into coded data for each sub-band of a plurality of hierarchies.

Each compression coded data is subjected to FEC (Forward Error Correction) coding processing by the redundancy coding section 123. As shown by an arrow 192, the redundancy coding section 123 performs FEC blocking on the compression coded data, and as shown by an arrow 193, performs RTP packetization (original data RTP packets) for each of the FEC blocks to generate redundant data (redundant data RTP packets).

As shown by an arrow 194, the RTP transmission section 124 transmits each RTP packet to the receiving apparatus 102 through the network 110. The receiving section 131 of the receiving apparatus 102 receives the RTP packets.

As shown by an arrow 195, the redundancy decoding section 132 performs FEC decoding processing on the received RTP packets, and further performs de-packetization, and extracts the coded data of each hierarchy of each block.

As shown by an arrow 196, the video-expansion-decoding section 133 provides the coded data of each hierarchy of each block necessary for decoding processing, and as shown by an arrow 197, performs expansion decoding, and performs inverse wavelet transformation. In this manner, each non-compressed data block is generated and output in sequence from block number 1.

In this regard, the processing unit of the compression coding (wavelet transformation) can be any unit. For example, the processing may be performed for each picture. However, in order to reduce delay time, it is desirable to perform for each precinct. Also, in the above, the description has been given of a method of using wavelet transformation. However, any method may be applied as far as the coding method (scalable codec) is capable of decoding the coded data by a plurality of resolutions, and necessitates the other portion of the original image data in order to generate coded data for each coding (hierarchical) processing unit (there are dependencies among coding (hierarchical) processing units). For example, ITU-T (International Telecommunication Union Telecommunication Standardization Sector) H.264/SVC (Scalable Video Codec), etc., may be used.

In the data transmission processing as described above, in order to improve the data redundancy and recovery performance without increasing delay time (to achieve more correct data transmission), the redundancy-coding control section 121 of the transmission apparatus 101 performs control of the FEC block size and the redundancy. A description will be given of the transmission apparatus 101 below.

Example of Transmission Apparatus Configuration

Figure 16:
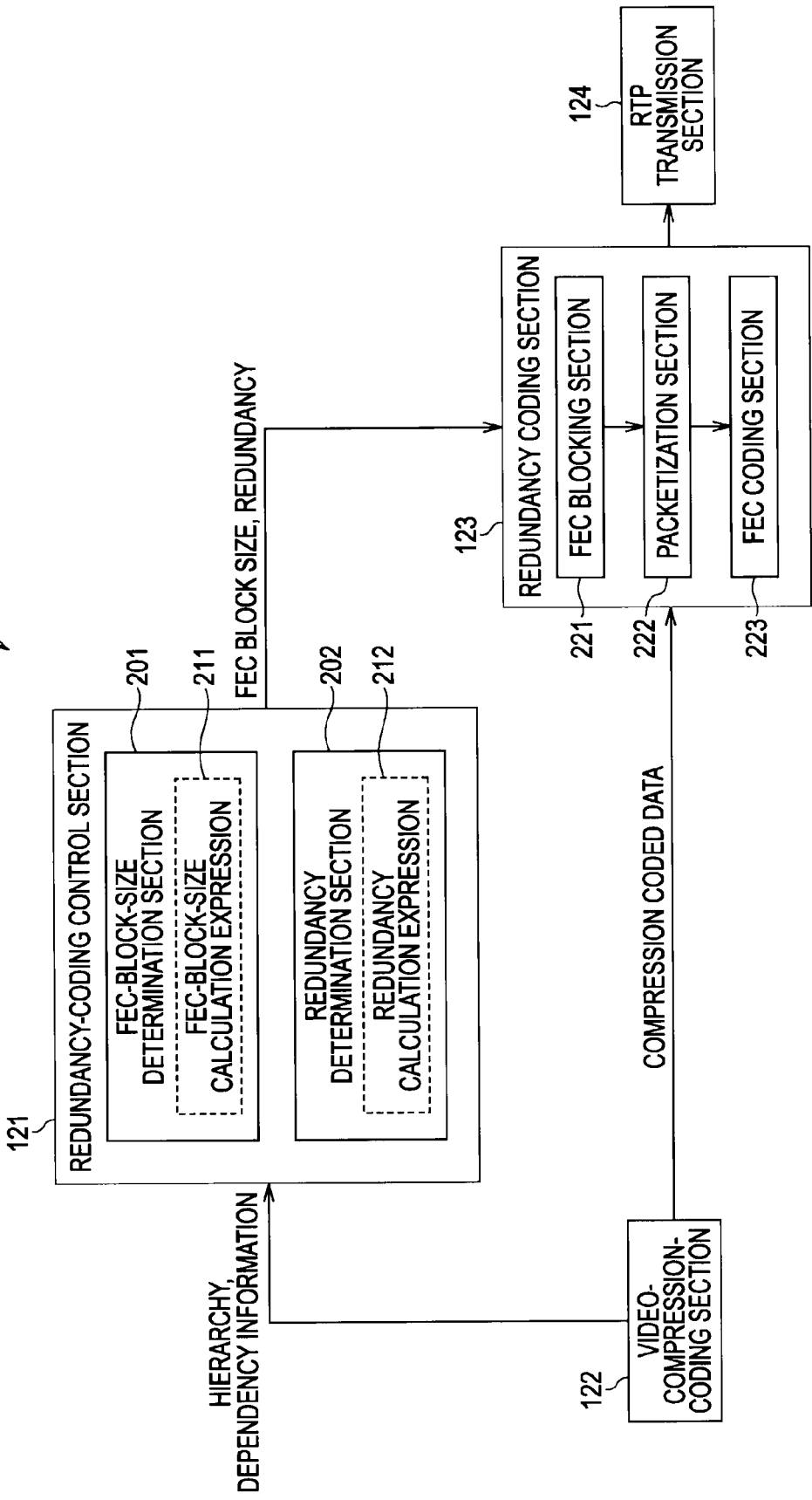
FIG. 16 is a block diagram illustrating an example of a main configuration of a transmission apparatus.

FIG. 16 is a block diagram illustrating an example of a main configuration of the transmission apparatus 101. The redundancy-coding control section 121 obtains the number of hierarchies of the compression coding processing (wavelet transformation processing) in the video-compression-coding section 122, and the dependency information indicating a range (hierarchy and block) in which the coded data is dependent for each hierarchy of each block.

The "dependency" mentioned here means data necessary for generating the coded data as described above. That is to say, the dependency information is information indicating data of which hierarchy of which block is necessary in order to generate coded data for each block and for each hierarchy produced by the hierarchical coding of non-compressed data of each block.

Of course, any information may be used as far as the information indicates these contents directly or in directly. Fore example, a dependency relationship of data is determined by the type of a filter used for analytical filtering. Thus, the redundancy-coding control section 121 may obtain information indicating the type of the filter as the dependency information. Also, any format may be used for each information.

The redundancy-coding control section 121 determines the FEC block size, which is the size of the data unit to be subjected to the redundancy coding processing from the information, and the redundancy indicating the amount of the redundant data to be generated by each FEC block.

The redundancy-coding control section 121 has an FEC-block-size determination section 201 and a redundancy determination section 202. The FEC-block-size determination section 201 determines the size (FEC block size) of the redundancy coding block (in the following, called an FEC block), which is a processing unit of the redundancy coding on the basis of the hierarchies and the dependency supplied from the video-compression-coding section 122. The FEC-block-size determination section 201 has an FEC-block-size calculation expression 211 in advance, and determines the FEC block size using the expression.

The redundancy determination section 202 determines the redundancy of each EFC block on the basis of the hierarchy and the dependency information supplied from the video-compression-coding section 122. The redundancy determination section 202 has the redundancy calculation expression 212 in advance, and determines the redundancy using the calculation expression.

The redundancy-coding control section 121 specifies a redundancy in the form of (the number of original data packets, the number of redundant packets). In the following, the pair of (the number of original data packets, the number of redundant packets) as one redundancy coding unit, namely an FEC block. For example, if the redundancy-coding control section 121 specifies that (the number of original data packets, the number of redundant packets)=(10, 5), the redundancy coding section 123 generates 5 redundant packets from 10 original data packets. That is to say, the RTP transmission section 124 transmits 15 packets in total from this FEC block. If the receiving apparatus 102 (the redundancy decoding section 132) receives 10 packets or more out of 15 FEC blocks, the receiving apparatus 102 can decode the original data by the FEC decoding processing.

The redundancy-coding control section 121 supplies the determined information to the redundancy coding section 123.

The redundancy coding section 123 performs redundancy coding of the coded data supplied from the video-compression-coding section 122 using the FEC block size and the redundancy supplied from the redundancy-coding control section 121.

The redundancy coding section 123 has an FEC blocking section 221, a packetization section 222, and an FEC coding section 223.

The FEC blocking section 221 groups the coded data for each block and for each hierarchy, which is supplied from the video-compression-coding section 122, into an FEC block.

As shown in FIG. 15, an FEC block includes one piece of coded data or a plurality of pieces of coded data in a same hierarchy with each other. The FEC blocking section 221 puts together individual coded data to be formed to have the FEC lock size specified by the redundancy-coding control section 121, thereby performing FEC blocking.

The compression-coding section 122 packetizes the coded data for each FEC block to generate an RTP packet. The FEC coding section 223 performs the FEC coding on the RTP packets as a unit. The FEC coding section 223 performs redundancy coding using a loss-error correction code, such as a Reed-Solomon code, etc.

The redundancy coding section 123 supplies the generated RTP packet (including redundant data) to the RTP transmission section 124, and causes the RTP transmission section 124 to perform transmission.

FEC Block Size

Next, a description will be given of the FEC block size. As described above, in the compression coding method by the video-compression-coding section 122, a dependent non-compressed data block and the range of compression coding data (the number of data items) are different for each hierarchy, and thus the processing sequence of the compression coding is sometimes different at the compression coding time and at the expansion decoding time. Until necessary data is put together, the expansion decoding is not performed, and thus there may be allowable time until decoding is started after compression coded data is transmitted from the transmission apparatus 101 to the receiving apparatus 102.

The allowable time period is determined on a dependency relationship, and is different for each hierarchy. The FEC-block-size determination section 201 adjusts the FEC block size for each hierarchy such that the size becomes large as much as possible in the range satisfying a delay target index in accordance with the difference in the allowable time for each hierarchy.

In this manner, the redundancy coding section 123 can perform the redundancy coding so as to improve the recovery performance of a burst packet loss while satisfying the delay target index. That is to say, the transmission apparatus 101 can correctly transmit data without increasing delay time unnecessarily.

A description will be given using the example in FIG. 15. That is to say, the number of hierarchies of the compression coding processing is three, and a data dependency relationship among hierarchies is as shown in FIG. 15.

It is assumed that input time for one block of the non-compressed data block is D, and the total time of the FEC processing time and the transmission delay is α. A principle delay (in the following, called a codec principle delay) in the compression coding processing and the expansion decoding processing becomes 5D.

From the dependency relationship shown in FIG. 15, in order to perform expansion decoding on any non-compressed data block n, it becomes necessary to have the hierarchy-number-1 compression coding data L (1, n), L (1, n+1), L (1, n+2), L (1, n+3), and L (1, n+4), the hierarchy-number-2 compression coding data L (2, n), L (2, n+1), and L (2, n+2), and the hierarchy-number-3 compression coding data L (3, n) and L (3, n+1). That is to say, it is necessary that these pieces of the compression coded data have been received, or have been recovered from loss packets by the FEC recovery processing.

If the target delay index is assumed to be 5D+α, the video-expansion-decoding section 133 waits for a time period of the target delay index, 5D+α, after video data is input into the transmission apparatus 101, and then the expansion decoding processing is started. Thus, at the time of starting the expansion decoding processing for generating a non-compressed data block n, it is necessary that the compression coded data L (i, k) (i=1, 2, 3,) (k=1, 2, . . . , n+4) is provided (received or recovered).

That is to say, for the expansion decoding processing generating non-compressed data block n, it is necessary for the compression coded data of the hierarchy number-1 to have data up to L (1, n+4), which has been received immediately before the start time of the expansion decoding processing. It ought to be necessary for the compression coded data of the hierarchy number-2 to have data up to L (2, n+2). In the same manner, it is necessary for the compression coded data of the hierarchy number-3 only to have data up to L (3, n+1).

To put it another way, the compression coded data of the hierarchy number-1 has allowable time of time D from the start of receiving to the start of the expansion decoding processing. In the same manner, the compression coded data of the hierarchy number-2 has allowable time of time 3D from the start of receiving to the start of the expansion decoding processing. Further, in the same manner, the compression coded data of the hierarchy number-3 has allowable time of time 4D from the start of receiving to the start of the expansion decoding processing.

It is difficult for loss packet recovery by FEC to be executed until the packet other than all the lost packets in the FEC block are put together. Thus, if an FEC block is generated for each k pieces of the compression coded data, it is difficult to recover the lost packet until a maximum time of (k−1) D is waited after the receiving of the lost packet.

Thus, the FEC-block-size determination section 201 adjusts the FEC block size in accordance with the allowable time from the start of receiving compression coded data to the start of the expansion decoding processing for each hierarchy as described below, for example.

Hierarchy number-1: one piece of compression coded data (an FEC block is generated for one piece of compression coded data)

Hierarchy number-2: three pieces of compression coded data (an FEC block is generated for three pieces of compression coded data)

Hierarchy number-3: four pieces of compression coded data (an FEC block is generated for four pieces of compression coded data)

(each compression coded data is divided into a plurality of RTP packets, and packetized)

In the case where the FEC block is configured as described in this example, even if a packet loss occurs, it is possible to perform FEC decoding at the point in time when a packet has arrived in an allowable time and the redundant packet has arrived. Accordingly, if sufficient amount of redundant packets have been generated, it becomes possible to recover the lost packet.

By generalizing an algorithm for determining the FEC block size like this, the FEC block size for each hierarchy (using the compression coded data for each hierarchy, which is generated by compression coding on one non-compressed data block as a unit) B(i) (hierarchy number i=1, 2, . . . ) can be expressed by the following expression (9).

$$B(i) = \begin{cases} T+1, & (i=1) \\ T+1+\sum_{k=1}^{i-1}(d(k)-1), & (i=2, 3, \ldots) \end{cases} \quad (9)$$

Here, d(i) denotes the number of compression coded data of the hierarchy (i+1) on which the compression coded data of the hierarchy i is dependent (if i denotes the lowest hierarchy (hierarchy-3 in the example), the number of non-compression coded data on which it is dependent). For example, in the example in FIG. 15, d(3)=2, d(2)=2, and d(1)=3. Also, T denotes the number of allowable delay extension blocks indicating the allowable delay time in addition to the above-described principle delay. When T=0, the above-described example matches the FEC block size.

For example, If the target delay index is the sum of a codec principle delay, a transmission delay, an FEC delay, etc., the FEC-block-size determination section 201 ought to determine the number of allowable delay extension blocks, T=0. On the other hand, if the recovery performance of burst packet loss is to be increased in spite of the extension of the delay, the FEC-block-size determination section 201 ought to make the number of allowable delay extension blocks, T, large. By making the number of allowable delay extension blocks, T, large, it is possible to increase the FEC block size. The larger the FEC block size is, the more the recovery performance of the burst packet loss improves. However, the delay is increased.

That is to say, the expression (9) represents one example of an FEC-block-size calculation expression 211.

Redundancy

The redundancy determination section 202 determines the redundancy so as to satisfy the recovery performance index of packet loss for each FEC block size (for each hierarchy) determined by the FEC-block-size determination section 201.

For example, it is assumed that the assumed packet loss rate is p, the number of packets in an FEC block is n, the number of packets in the original data is k, and the number of the redundant packets is (n−k). At this time, assuming that the target FEC block loss rate is Pt, in order to satisfy the target FEC block loss rate, the following expression (10) ought to be satisfied.

$$P_t \geq 1 - \sum_{j=0}^{n-k} {}_nC_j p^j (1-p)^{n-j} \quad (n > k) \tag{10}$$

The redundancy determination section 202 determines the number of packets in the original data k and the number of the redundant packets (n−k) so that the expression (10) is satisfied. That is to say, the expression (10) shows an example of the redundancy calculation expression 212.

In this regard, a method of determining the redundancy may be any method, and thus a different method from the above-described one may be used. For example, although the FEC block size for each hierarchy is different, a same redundancy for all the hierarchies may be specified. That is to say, the redundancy determination section 202 may be omitted. However, if the redundancy determination section 202 determines the redundancy in accordance with the FEC block size, it is possible for the redundancy-coding control section 121 to further improve the recovery performance of the burst packet loss.

Description of Processing Flow

Next, a description will be given of the individual processing flow described above. First, a description will be given of an example of the flow of the transmission processing in which the transmission apparatus 101 performs compression coding on the video data, and transmits the data with reference to a flowchart in FIG. 17.

When the transmission processing is started, in step S101, the redundancy-coding control section 121 determines the FEC block size and the redundancy. In step S102, the video-compression-coding section 122 performs compression coding on the input video data for each precinct. In step S103, the redundancy coding section 123 performs redundancy coding on the generated coded data. In step S104, the RTP transmission section 124 transmits the generated RTP packet to the receiving apparatus 102 through the network 110.

In step S105, the video-compression-coding section 122 determines whether the transmission processing is terminated or not. If there is untransmitted video data, and thus it is determined not to terminate transmission processing, the processing returns to step S102, and the subsequent processing is repeated. In step S105, if all the video data has been transmitted, and it is determined to terminate the transmission processing, the transmission processing is terminated.

Next, a description will be given of an example of the block-size and redundancy determination processing performed in step S101 in FIG. 17 with reference to a flowchart in FIG. 18.

When the block-size and redundancy determination processing is started, the redundancy-coding control section 121 obtains the number of hierarchies of the compression coding and the dependency information among the hierarchies in step S121.

In step S122, the FEC-block-size determination section 201 obtains the FEC block size of each hierarchy on the basis of the information obtained by the processing in step S121. In step S123, the redundancy determination section 202 obtains the redundancy of each hierarchy on the basis of the information obtained by the processing in step S121.

In step S124, the redundancy-coding control section 121 supplies the FEC block size determined by the processing in step S122 and the redundancy determined by the processing in step S123 to the redundancy coding section 123 in response to a request. In this regard, the processing in step S124 is continuously performed after that.

Figure 17:
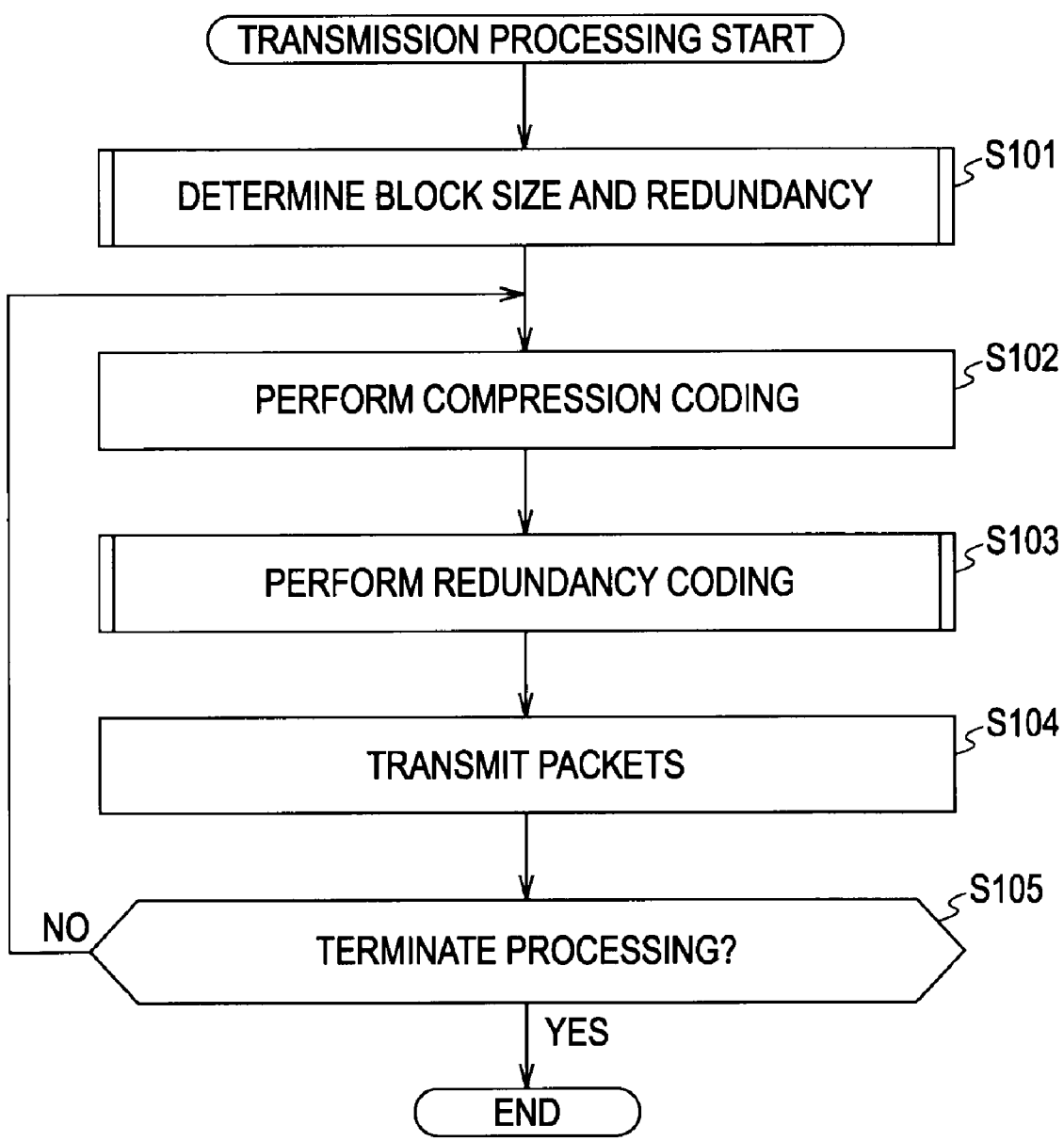
FIG. 17 is a flowchart illustrating an example of a flow of transmission processing.

When the FEC block size and the redundancy is ready to be provided in step S124, the block-size and redundancy determination processing is terminated, the processing is returned to step S101 in FIG. 17, and the processing in step S102 and after that is executed.

Figure 19:
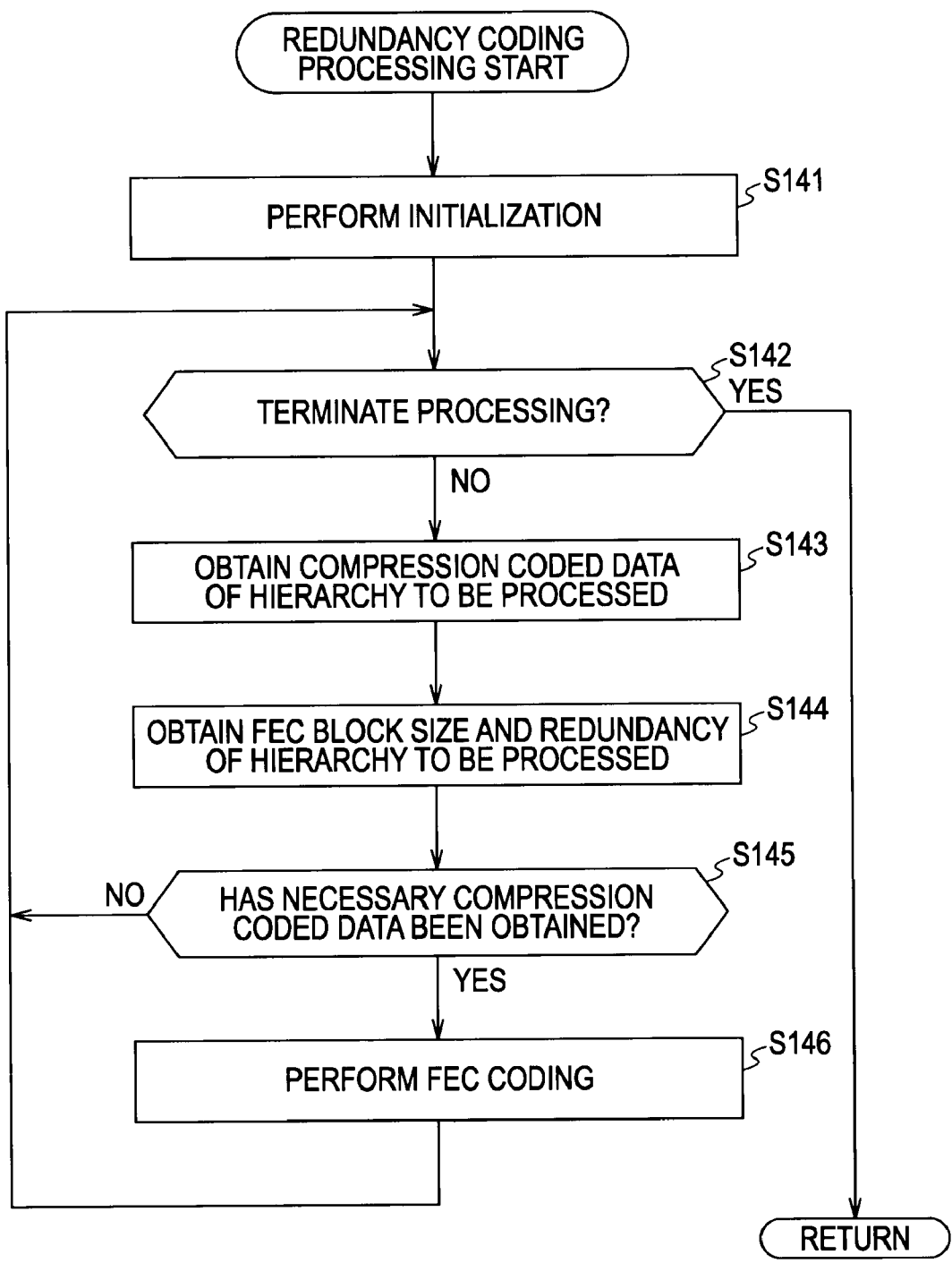
FIG. 19 is a flowchart illustrating an example of redundancy coding processing.

Next, a description will be given of an example of the redundancy coding processing performed in step S103 in FIG. 17 with reference to a flowchart in FIG. 19. In step S141, the redundancy coding section 123 performs initialization processing. In step S142, the redundancy coding section 123 determines whether to terminate the redundancy coding processing. If there is unprocessed coded data and determined not to terminate the redundancy coding processing, the processing proceeds to step S143.

In step S143, the redundancy coding section 123 obtains the compression coded data of the hierarchy to be processed by the video-compression-coding section 122. In step S144, the redundancy coding section 123 obtains the FEC block size and the redundancy of the hierarchy to be processed from the redundancy-coding control section 121. In step S145, the redundancy coding section 123 determines whether the necessary amount of compression coded data has been obtained.

If determined all the necessary amount of compression coded data has not been obtained, the processing returns to step S142, and the subsequent processing is repeated.

Also, in step S145, if determined that all the compression coded data of the FEC block to be processed has been obtained and the compression coded data necessary for the redundancy coding has been obtained, the processing proceeds to step S146. In step S146, the redundancy coding section 123 performs the FEC coding, performs the RTP packetization, and generates the redundant data. When the processing in step S146 is completed, the processing returns to step S142, and the subsequent processing is repeated.

In step S142, if determined that all the compression coded data has been redundancy coded, and the redundancy coding processing is to be completed, the redundancy coding processing is terminated, the processing returns to step S103 in FIG. 17, and the subsequent processing of step S104 is executed.

As described above, the redundancy-coding control section 121 independently determines the FEC block size for each hierarchy in accordance with the length of allowable time at the receiving side, which is determined by the number of hierarchies of the compression coding and the dependency relationship so that it is possible to increase the FEC block size as much as possible in order not to increase the delay time unnecessarily. That is to say, it is possible to improve the recovery performance from burst packet loss without increasing the delay time unnecessarily.

Also, the redundancy-coding control section 121 can determine the redundancy in accordance with the FEC block size (the number of packets). Accordingly, the redundancy-coding control section 121 can generate more redundant data so as not to increase unnecessary delay time. Further, it is possible to improve the recovery performance from a burst packet loss.

Figure 20:
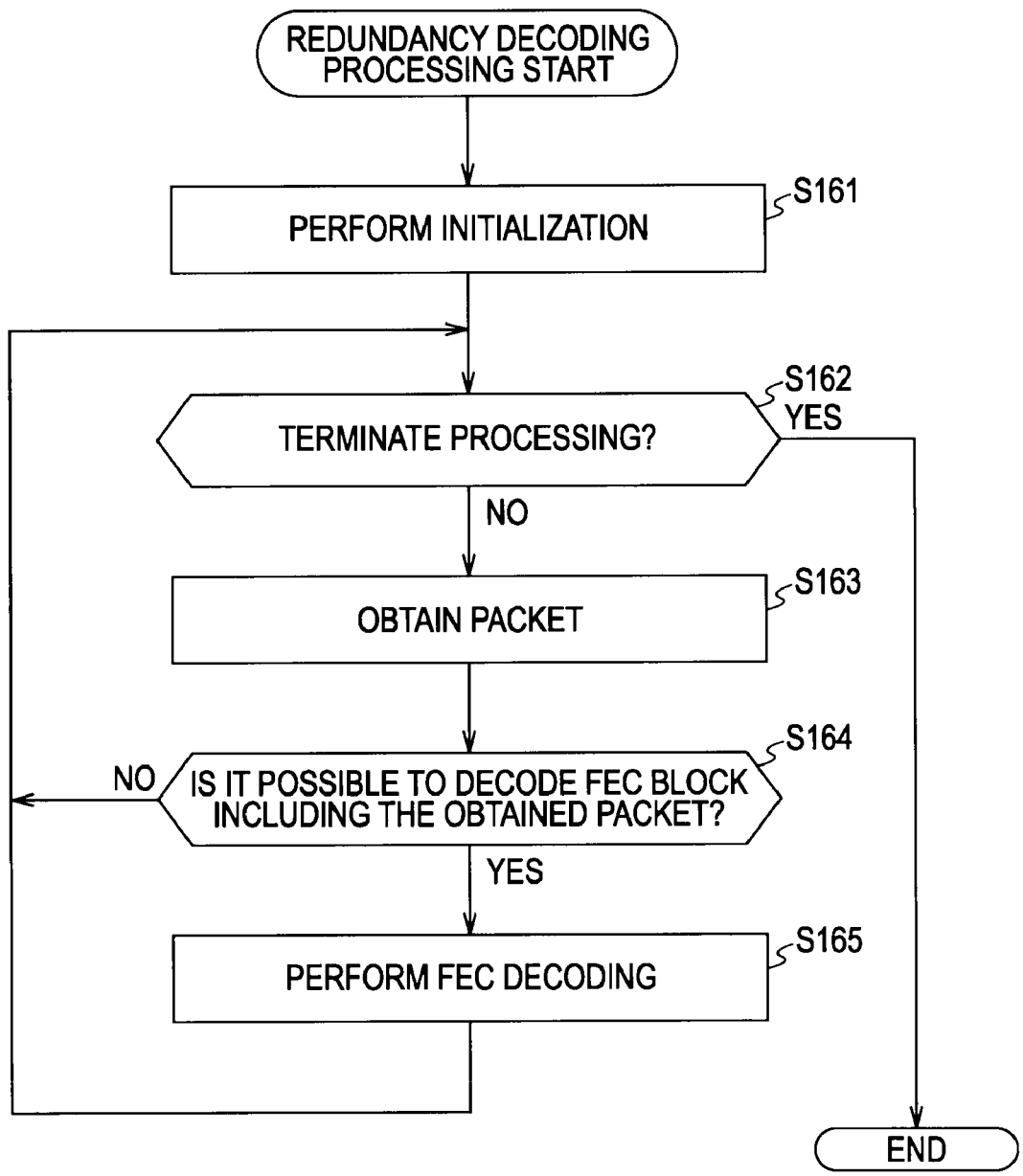
FIG. 20 is a flowchart illustrating an example of redundancy decoding processing.

A description will be given of an example of the flow of the redundancy coding processing executed by the redundancy decoding section 132 in order to redundancy decoding the redundancy coded data in this manner with reference to a flowchart in FIG. 20.

When the redundancy decoding processing is started, the redundancy decoding section 132 performs initialization processing in step S161, and determines whether to complete the redundancy decoding processing in step S162. If determined that there is unprocessed received compression coded data, and thus the redundancy decoding processing is not to be completed, the processing proceeds to step S163.

In step S163, the redundancy decoding section 132 obtains the RTP packet received by the RTP receiving section 131. In step S164, the redundancy decoding section 132 determines whether it is possible to decode the FEC block including the RTP packet obtained in step S163. If determined that a sufficient number of RTP packets of the FEC block to be processed have not been obtained, and it is not possible to decode the FEC block, the processing returns to step S162, and the subsequent processing is repeated. Also, in step S164, if determined that a sufficient number of RTP packets of the FEC block to be processed have been obtained, and it is possible to decode the FEC block, the processing proceeds to step S165.

In step S165, the redundancy decoding section 132 performs the FEC decoding, and if a packet loss has occurred, the redundancy decoding section 132 recovers the coded data. The coded data processed as described above is supplied to the video-expansion-decoding section 133, and is subject to expansion and decoding. When the processing of step S165 is completed, the processing returns to step S162, and the subsequent processing is repeated.

In step S162, if determined that the redundancy decoding processing is to be completed, the redundancy decoding processing is terminated.

2. Second Embodiment

Example of Configuration of Transmission Apparatus

In this regard, in the above, a description has been given that the redundancy-coding control section 121 determines the FEC block size and the redundancy of the redundancy coding on the basis of information, such as the number of hierarchies of compression coding, the dependency information among hierarchies, etc., obtained from the video-compression-coding section 122. As described above, a dependency relationship among hierarchies is determined by the type of filter to be used for compression coding. The type of filter to be used for compression coding and the number of hierarchies of the compression coding are the specification of the video-compression-coding section 122, and is often determined in advance.

For example, if the video-compression-coding section 122 is provided with a plurality of types of filters, and the video-compression-coding section 122 selects one of them, it is desirable for the redundancy-coding control section 121 to determine the FEC block size and the redundancy of the redundancy coding in accordance with a filter because the dependency relationship may be changed depending on a filter to be used. Also, in the case where the number of hierarchies of the compression coding is variable, it is desirable that the redundancy-coding control section 121 determines the FEC block size and the redundancy of the redundancy coding in accordance with the number of hierarchies thereof.

However, if the video-compression-coding section 122 is allowed to perform compression coding only by one type of method, the type of filter to be used for compression coding and the number of hierarchies of compression coding are determined in advance. Accordingly, the redundancy-coding control section 121 may calculate in advance the FEC block size and the redundancy that are suitable for a given number of hierarchies for the compression coding and the dependencies of the hierarchies, may hold the calculation result and may provide the result.

Figure 21:
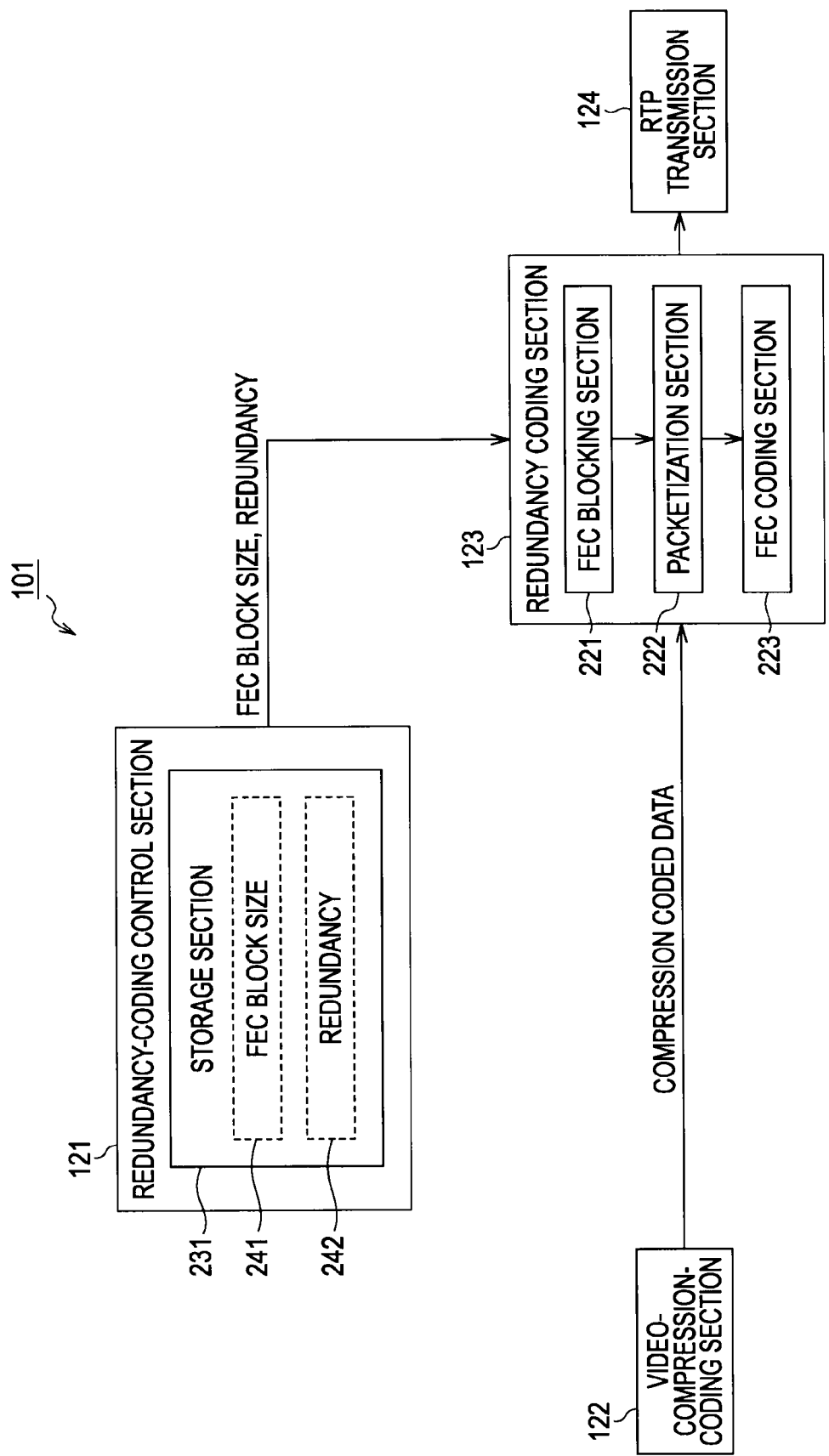
FIG. 21 is a block diagram illustrating an example of a main configuration of a transmission apparatus.

FIG. 21 is a block diagram illustrating an example of a main configuration of the transmission apparatus 101 in that case. As shown in FIG. 21, in this case, the redundancy-coding control section 121 has a storage section 231 holding an FEC block size 241 and a redundancy 242 that are calculated in advance. The storage section 231 is a storage area formed by any recording medium.

The FEC block size 241 is an FEC block size of each hierarchy determined so that the delay time does not increase unnecessarily in accordance with the number of hierarchies of the compression coding performed by the video-compression-coding section 122 and the dependency relationship between the hierarchies. In this regard, the method of determining the FEC block size is the same as the determination method by the FEC-block-size determination section 201 in FIG. 16.

The redundancy 242 is the redundancy of each FEC block determined so as not to increase delay time unnecessarily in accordance with the number of hierarchies of the compression coding processing performed by the video-compression-coding section 122, and the dependency relationship among hierarchies. In this regard, the method of determining this redundancy is the same as the determination method by the redundancy determination section 202 in FIG. 16.

Consequently, in this case, the FEC block size and the redundancy to be supplied to the redundancy coding section 123 is provided in advance. Accordingly, the processing from step S121 to step S123 can be omitted in the block-size and redundancy determination processing shown in FIG. 18, and thus it is possible to control the redundancy coding more easily.

3. Third Embodiment

Example of Configuration of Transmission Apparatus

Also, in the calculation of the redundancy, consideration may be given to priorities of the compression coded data for each hierarchy.

In the case where hierarchical coding is used for video compression coding method, and hierarchies are divided for each frequency component of an image as the above-described wavelet transformation, for example, the lower the frequency component included in a hierarchy, the more significantly is the influence on the decoded image if a loss occurs. That is to say, the importance of data differs depending on each hierarchy. Accordingly, priorities may be set for each hierarchy in accordance with the importance thereof. For example, the smaller the hierarchy number, the higher priority of data may be set, and the higher priority of data, the more the reliability of data transmission may be improved.

In order to improve the reliability of data transmission, the redundancy-coding control section 121 adjusts the redundancy in accordance with the priority. That is to say, the redundancy-coding control section 121 adjusts a target-FEC-block loss rate Pt for each hierarchy in accordance with the priority.

Figure 22:
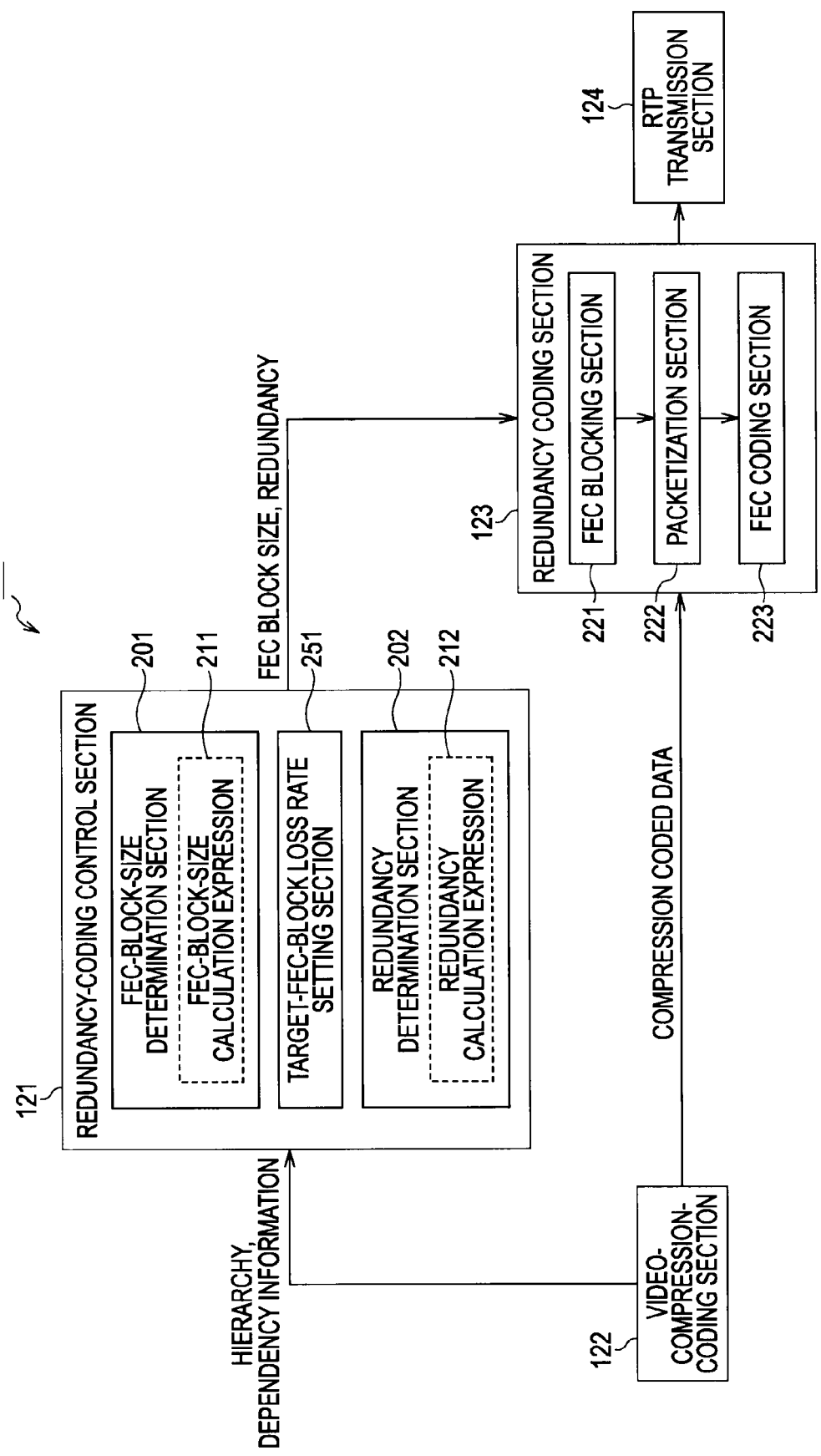
FIG. 22 is a block diagram illustrating an example of a configuration of a main configuration of a transmission apparatus.

FIG. 22 is a block diagram illustrating an example of a configuration of a main configuration of the transmission apparatus 101 in this case. As shown in FIG. 22, the redundancy-coding control section 121 has a target-FEC-block loss rate setting section 251 in addition to the FEC-block-size determination section 201 and the redundancy determination section 202.

In order to improve the reliability of data transmission, the target-FEC-block loss rate setting section 251 adjusts the target-FEC-block loss rate Pt for each hierarchy in accordance with the priority as follows, for example.

Hierarchy Number=1: $Pt=10^{-8}$
Hierarchy Number=2: $Pt=10^{-5}$
Hierarchy Number=3: $Pt=10^{-3}$ When the target-FEC-block loss rate setting section 251 has set a target-FEC-block loss rate Pt, the redundancy determination section 202 calculates the redundancy using the target-FEC-block loss rate Pt.

Description of Processing Flow

Figure 23:
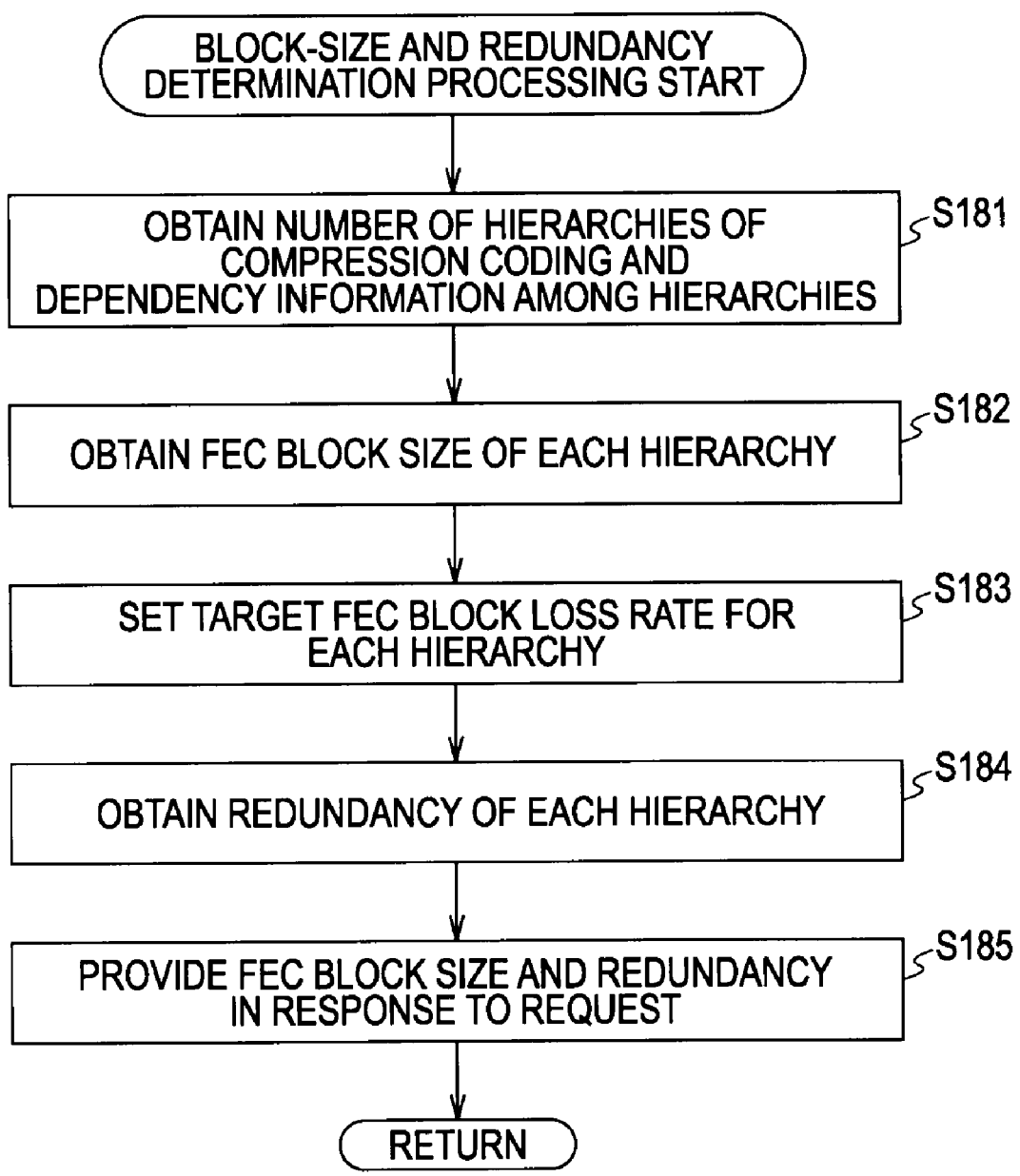
FIG. 23 is a flowchart illustrating an example of a flow of block-size and redundancy determination processing.

A description will be given of an example of the block-size and redundancy determination processing performed in this case with reference to a flowchart in FIG. 23. In this regard, this flowchart corresponds to the flowchart in FIG. 18.

Figure 18:
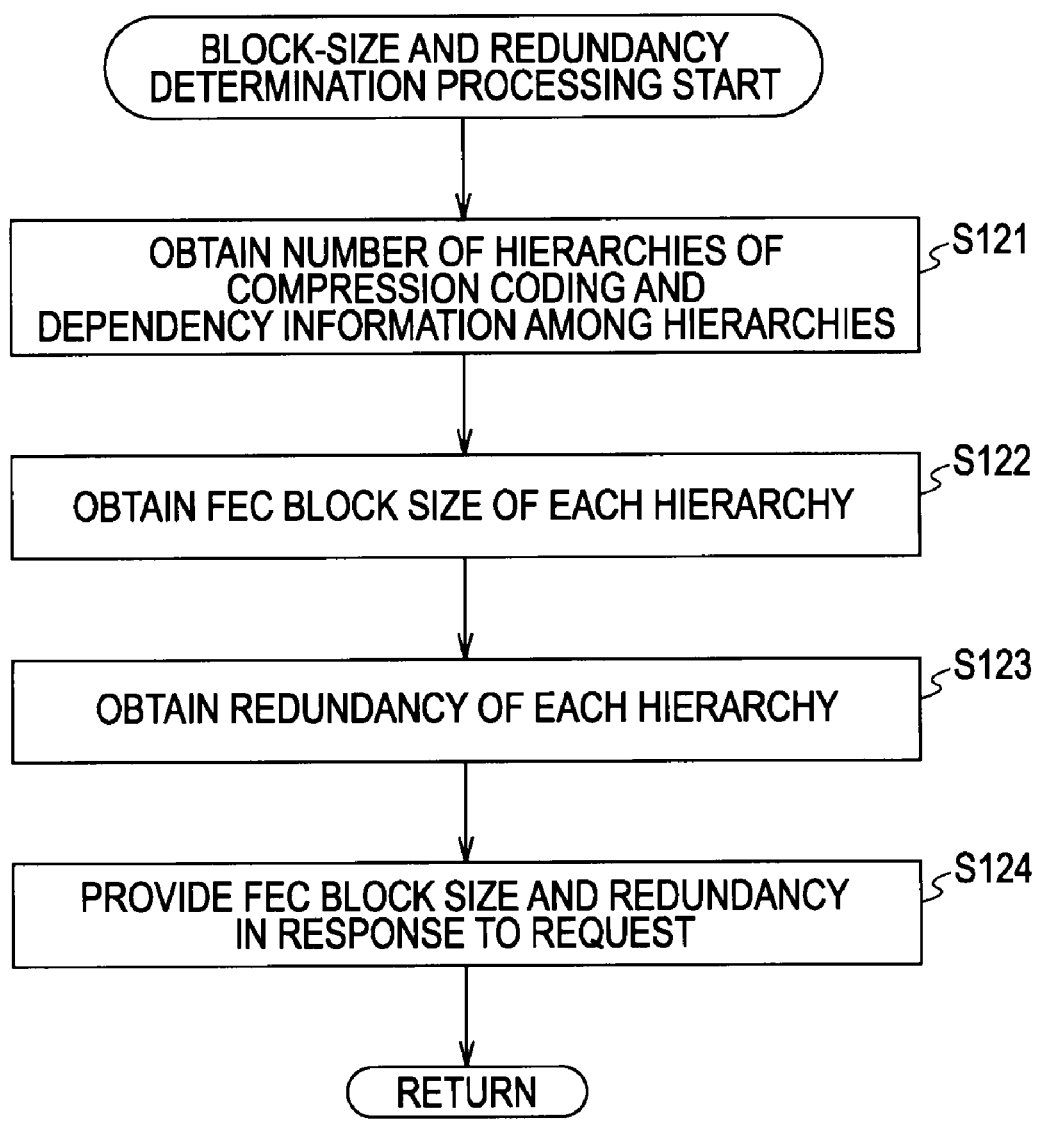
FIG. 18 is a flowchart illustrating an example of a flow of block-size and redundancy determination processing.

When the block-size and redundancy determination processing is started, individual processing of steps S181 and S182 is executed in the same manner as the individual processing of steps S121 and S123 in FIG. 18.

In step S183, the target-FEC-block loss rate setting section 251 sets the target-FEC-block loss rate Pt in accordance with the priority of a hierarchy. In step S184, the redundancy determination section 202 obtains the redundancy using the target-FEC-block loss rate Pt set in step S183.

The processing in step S185 is executed in the same manner as the processing in step S124 in FIG. 18.

When it becomes ready to provide the FEC block size and the redundancy, the block-size and redundancy determination processing is completed, the processing returns step S101 in FIG. 17, and the processing of step S102 and after that is repeated.

As described above, the redundancy-coding control section 121 determines the redundancy in accordance with the priority of the data for each hierarchy, so that it is possible to improve the reliability of data transmission by the transmission apparatus 101 without increasing unnecessary delay time.

4. Fourth Embodiment

Example of Configuration of Network System

In this regard, the redundancy-coding control section 121 may control the FEC block size and the redundancy not only in the initial state, but suitably. For example, the redundancy-coding control section 121 may suitably control the FEC block size and the redundancy on the basis of a state of the network 110 through which data is transmitted.

Figure 24:
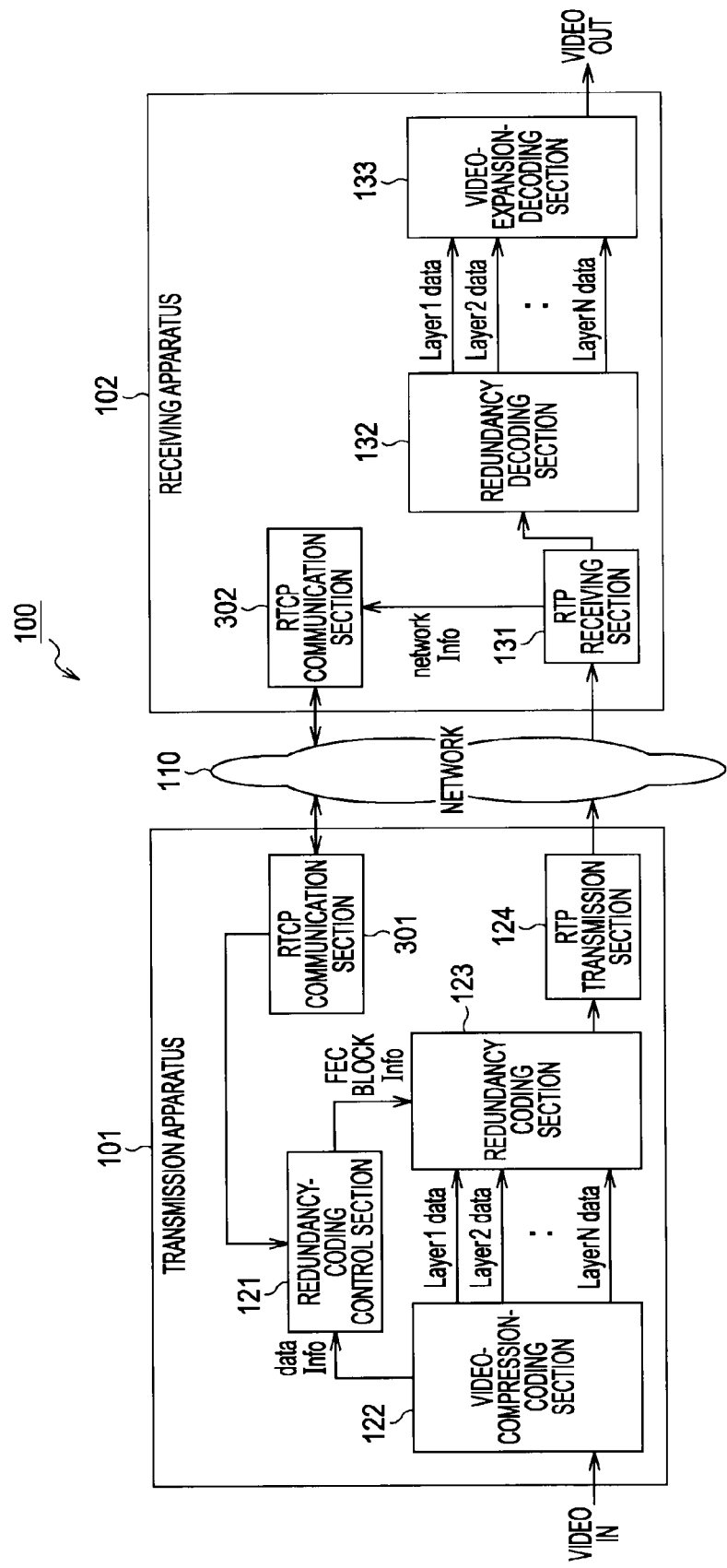
FIG. 24 is a block diagram illustrating an example of a main configuration of a network system to which the present invention is applied.

FIG. 24 is a block diagram illustrating an example of a main configuration of a network system 100 in that case. In the case of the example shown in FIG. 24, a transmission apparatus 101 has an RTCP communication section 301 in addition to the configuration in FIG. 1. Also, the receiving apparatus 102 has an RTCP communication section 302 in addition to the configuration in FIG. 1.

The RTCP communication section 301 and the RTCP communication section 302 send and receive information (network state information) indicating the state of the network 110 by transmitting and receiving, for example, an RTCP (RTP Control Protocol) Sender Report (SR) packet and an RTCP Receiver Report (RR) packet. For the network state information, for example, a so-called RTT (Round Trip Time) indicating a round-trip delay time and a packet loss rate are considered.

The round trip time (RTT) can be obtained by transmitting and receiving (making a round trip) a packet between the RTCP communication section 301 and the RTCP communication section 302. The packet loss rate is obtained by the RTP receiving section 131 of the receiving apparatus 102, and is supplied to the RTCP communication section 301 through the RTCP communication section 302. Of course, information indirectly indicating this information may be used, and any format of the information may be used. Also, any parameters can be applied in addition to these.

The redundancy-coding control section 121 causes the network state information obtained by the RTCP communication section 301 to be reflected on the determination of the FEC block size and the redundancy. By this means, even if the network 110 is a communication line having a band easy to fluctuate, such as the Internet, for example, the redundancy-coding control section 121 can suitably determine the FEC block size and the redundancy in accordance with the communication state, and thus it is possible to further improve the reliability of data transmission by the transmission apparatus 101 without increasing unnecessary delay time.

Example of Configuration of Transmission Apparatus

Figure 25:
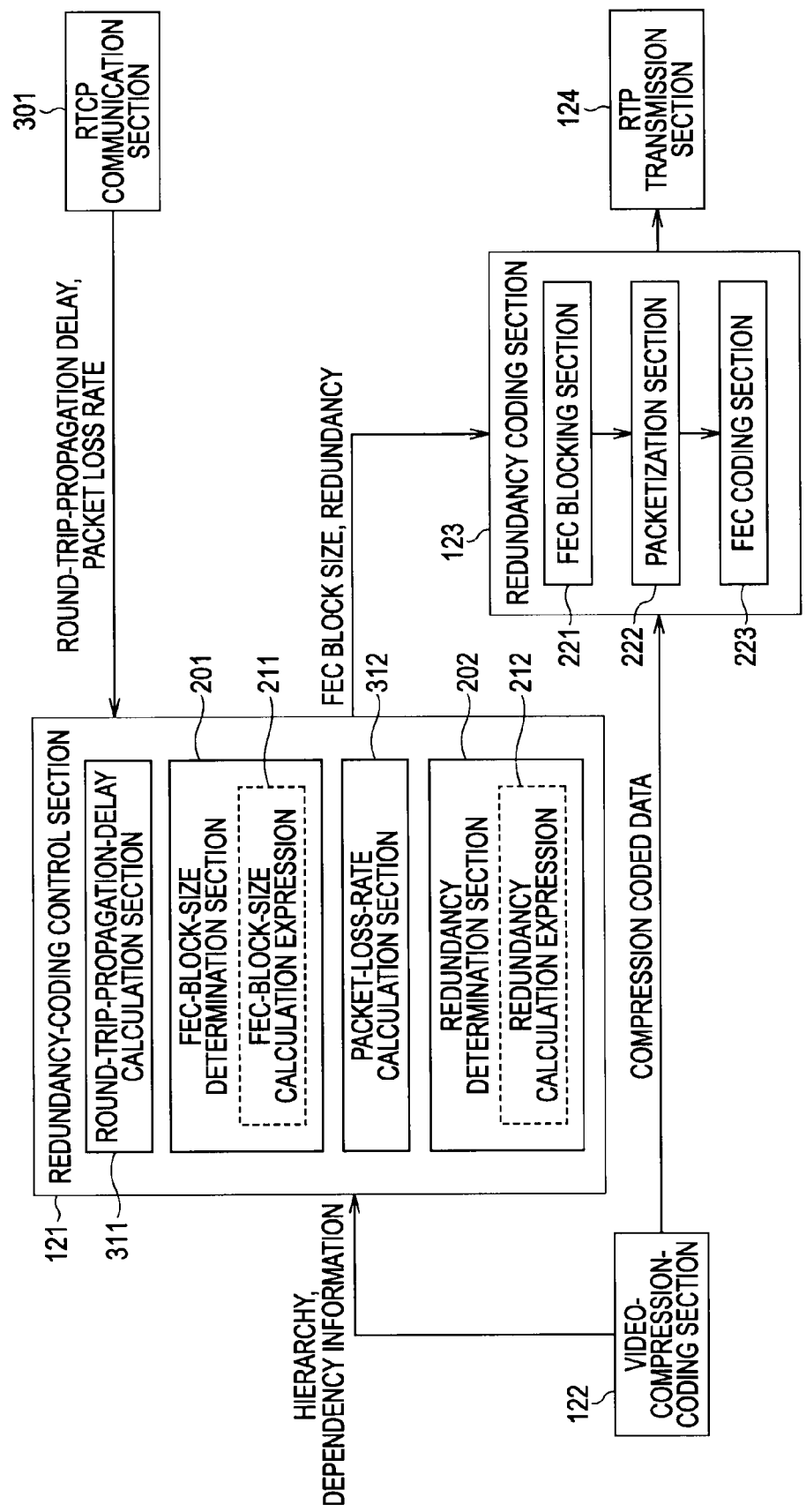
FIG. 25 is a block diagram illustrating an example of a main configuration of a transmission apparatus.

FIG. 25 is a block diagram illustrating an example of a main configuration of the transmission apparatus 101 in the case of the example in FIG. 24. As shown in FIG. 25, in this case, the transmission apparatus 101 has the RTCP communication section 301 in addition to the configuration shown in FIG. 16. Also, in this case, the redundancy-coding control section 121 has the round-trip-propagation-delay calculation section 311 and the packet-loss-rate calculation section 312 in addition to the configuration shown in FIG. 16.

The round-trip-propagation-delay calculation section 311 calculates the average value of the round-trip propagation delay (RTT), which shows a delay time when a packet is made to travel to and from the apparatus 101 and the receiving apparatus 102 through the network 110 in a predetermined time period, on the basis of the network connection information obtained by the RTCP communication section 301.

The FEC-block-size determination section 201 determines the FEC block size, for example by the following expression (11) using the round-trip propagation delay (RTT) (the average value of the round-trip propagation delay in a predetermined time) in addition to the number of hierarchies and the dependency information, which are obtained by the video-compression-coding section 122.

$$B(i) = \begin{cases} T + 1 - \beta RTT, & (i = 1) \\ T + 1 - \beta RTT + \sum_{k=1}^{i-1} (d(k) - 1), & (i = 2, 3, \dots) \end{cases} \quad (11)$$

In Expression (11), β denotes a positive coefficient, and RTT denotes a round-trip propagation delay (RTT) (the average value in a predetermined time). As shown in Expression (11), the redundancy-coding control section 121 determines the FEC block size such that the FEC block size becomes smaller as the propagation delay increases. By this means, it becomes possible to cover an increase in the propagation delay by a decrease in the FEC block size. Accordingly, the redundancy-coding control section 121 can restrain fluctuations of the entire delay including the propagation delay of the network 110 in addition to the principle delay.

In this regard, a time period for obtaining the average value of round-trip propagation delays is any period. For example, the time period may be an update interval of the FEC block size. Also, for example, instead of using the average value of round-trip propagation delays, the value of the latest round-trip propagation delay may be directly used for determining the FEC block size.

The packet-loss-rate calculation section 312 calculates the average value of the packet loss rates that occurs at the receiving apparatus 102 side in a predetermined time on the basis of the network connection information obtained by the RTCP communication section 301. The redundancy determination section 202 determines the redundancy using the average value of the packet loss rates in a predetermined time in addition to the number of hierarchies and the dependency information obtained by the video-compression-coding section 122. At this time, in the same manner as described above, the redundancy determination section 202 calculates the redundancy using the redundancy calculation expression 212 of Expression (10). However, p in Expression (10) is assumed to be an assumed value of the packet loss rate in the above. However, here, p in Expression (10) is assumed to be the average value of the packet loss rates calculated by the packet-loss-rate calculation section 312.

That is to say, the redundancy-coding control section 121 reflects a change (the average value) of the packet loss rate at the receiving side on the redundancy. By this means, the redundancy-coding control section 121 can transmit a packet at a minimum necessary redundancy in accordance with the state of a network during the transmission.

In this regard, a time period during which the average value of packet loss rates is any period. For example, the time period may be an update interval of the redundancy. Also, for example, instead of using the average value of packet loss rates, the value of the latest packet loss rate may be directly used for determining the redundancy.

Description of Processing Flow

Next, a description will be given of an example of the flow of various kinds of processing in this case. A description will be given of an example of the flow of the transmission processing performed by the transmission apparatus 101 in this case with reference to a flowchart in FIG. 26.

Figure 26:
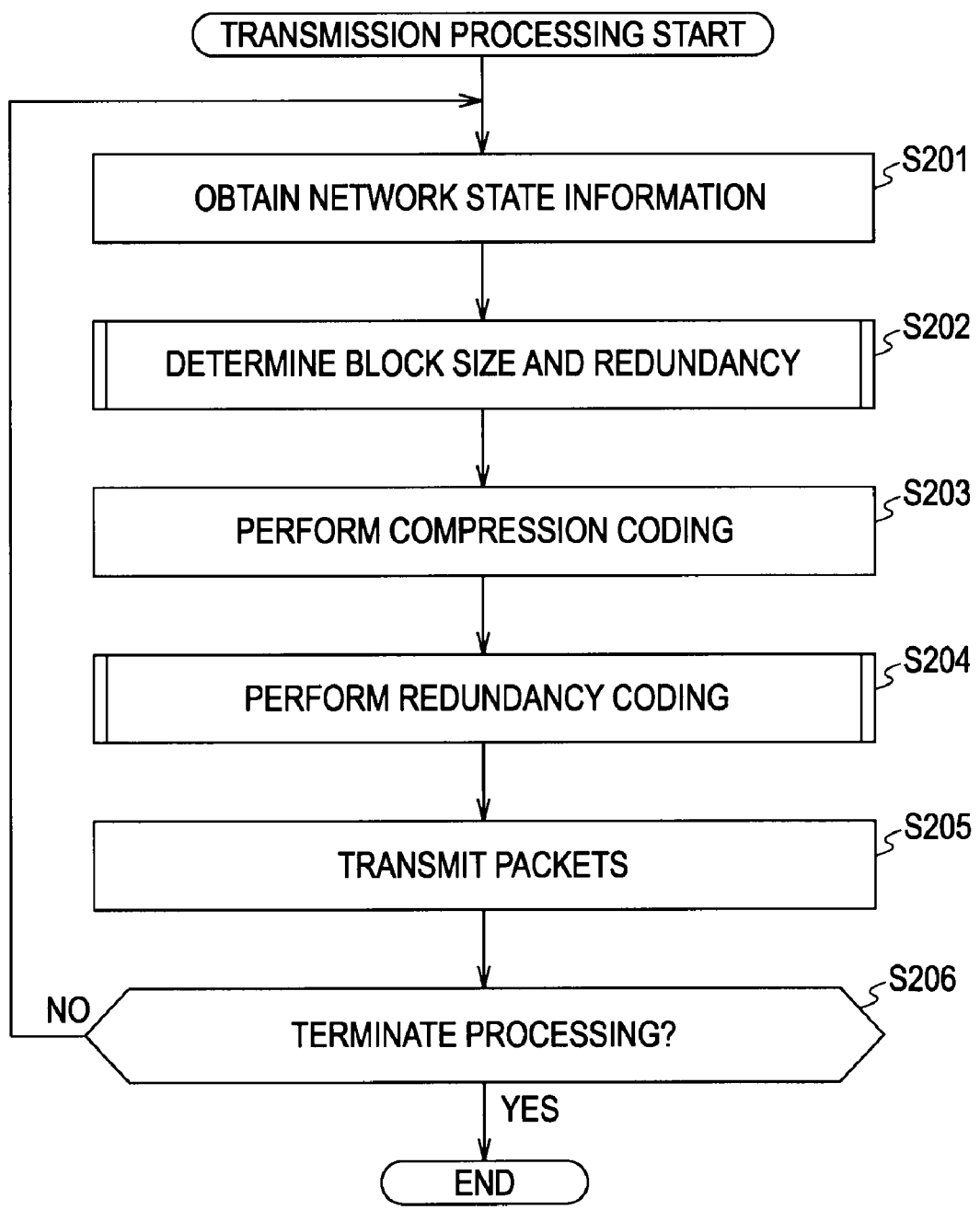
FIG. 26 is a flowchart illustrating an example of a flow of transmission processing.

The flowchart in FIG. 26 corresponds to the flowchart in FIG. 17. When the transmission processing is started, the RTCP communication section 301 obtains network state information including information, such as a round-trip propagation delay and a packet loss rate, etc., in step S201. When the network state information is obtained, individual processing from step S202 to step S206 is executed in the same manner as the individual processing from step S101 to step 105 in the flowchart in FIG. 17. However, if determined that the processing is not completed in step S206, the processing returns to step S201, and the subsequent processing is repeated.

That is to say, in the case of FIG. 26, the determination (update) of the FEC block size and the redundancy is executed repeatedly. By this means, the redundancy-coding control section 121 can dynamically control the FEC block size and the redundancy.

Next, a description will be given of an example of the block-size and redundancy determination processing performed in step S202 in FIG. 26 with reference to a flowchart in FIG. 27. This flowchart corresponds to the flowchart in FIG. 18.

The processing of step S221 is performed in the same manner as that of step S121 in FIG. 18. In step S222, the round-trip propagation delay 311 calculates the average value of the round-trip propagation delays in a predetermined time period. In step S223, the FEC-block-size determination section 201 obtains the FEC block size for each hierarchy using the information obtained in steps S221 and S222.

In step S224, the packet-loss-rate calculation section 312 calculates the average value of the packet loss rates. In step S225, the redundancy determination section 202 obtains the redundancy of each hierarchy using the information obtained in steps S221 and S224. The processing in step S226 is performed in the same manner as that of step S124 in FIG. 18.

By controlling in this way, the redundancy-coding control section 121 can dynamically control the FEC block size and the redundancy in accordance with the network connection state, such as the round-trip propagation delay and the packet loss rate, etc.

In this regard, only the FEC block size may be controlled dynamically, and the redundancy may be fixed at a predetermined value. Also, only the FEC block size may be controlled dynamically, and the redundancy may be controlled statically (be controlled in an initial state of the transmission processing) as described with reference to FIGS. 16 and 22, for example.

5. Fifth Embodiment

Example of Configuration of Transmission Apparatus

Figure 28:
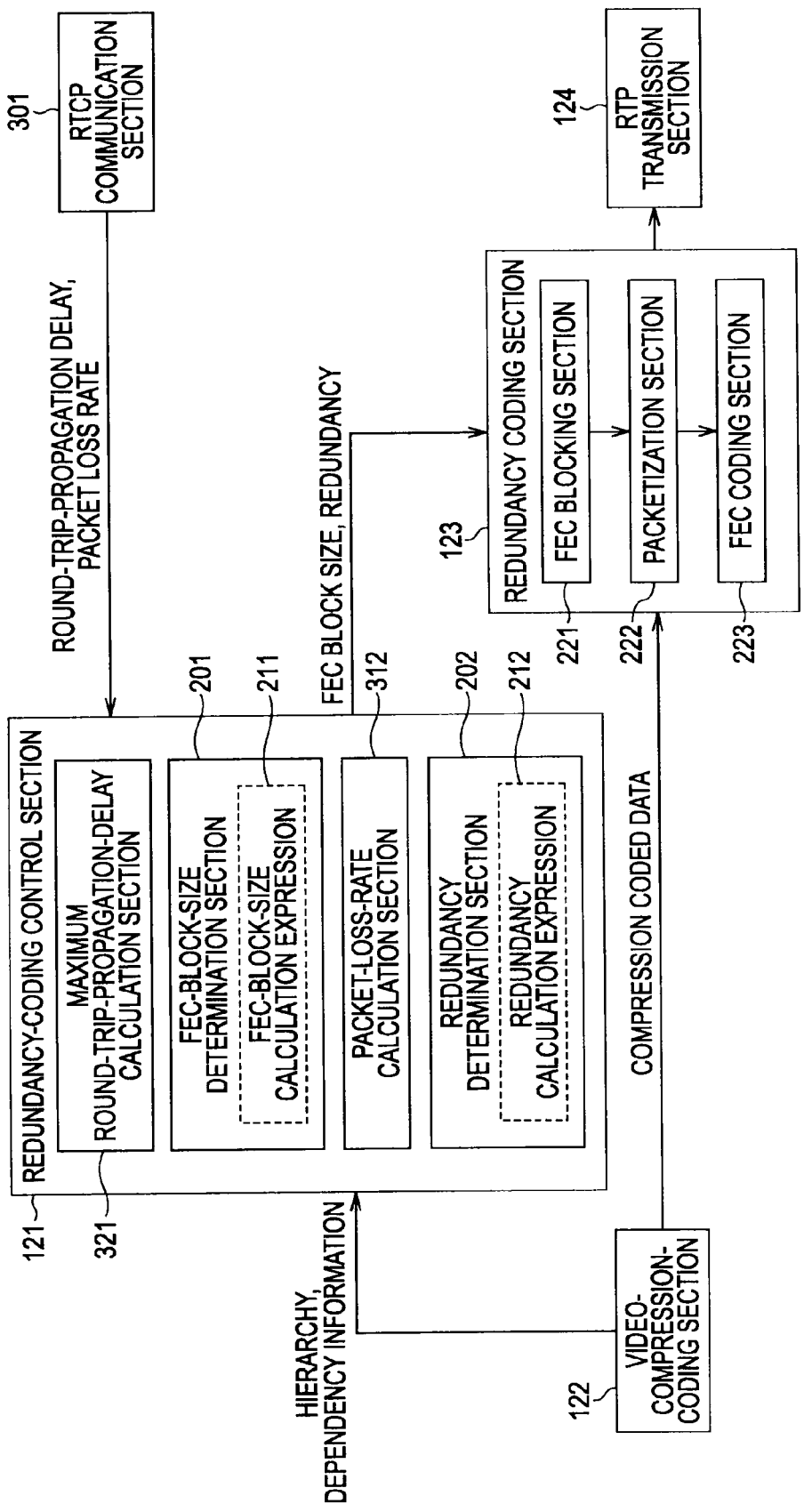
FIG. 28 is a block diagram illustrating an example of a main configuration of a transmission apparatus.

In this regard, in the above, a description has been given that the redundancy-coding control section 121 determines the FEC block size using the average value of the round-trip propagation delays in a predetermined time period. However, for example, the redundancy-coding control section 121 may determine the FEC block size using a maximum value of the round-trip propagation delays in a predetermined time period in addition. FIG. 28 is a block diagram illustrating an example of a main configuration of the transmission apparatus 101 in that case.

In FIG. 28, the configuration of the transmission apparatus 101 is basically the same as the example of the configuration shown in FIG. 25. However, the redundancy-coding control section 121 has a maximum round-trip-propagation-delay calculation section 321 in place of the round-trip-propagation-delay calculation section 311 in FIG. 25.

The maximum round-trip-propagation-delay calculation section 321 calculates a maximum value (maximum round-trip propagation delay) of the round-trip propagation delay (RTT), which shows a delay time when a packet is made to travel to and from the apparatus 101 and the receiving apparatus 102 through the network 110 in a predetermined time period, on the basis of the network connection information obtained by the RTCP communication section 301.

The FEC-block-size determination section 201 determines the FEC block size, for example by the following expression (12) using the maximum round-trip propagation delay in addition to the number of hierarchies and the dependency information, which are obtained by the video-compression-coding section 122.

$$B(i) = \begin{cases} T+1-(\beta RTT+\gamma N), & (i=1) \\ T+1-\left(\beta RTT+\gamma N+\sum_{k=1}^{i-1}(d(k)-1)\right), & (i=2,3,\ldots) \end{cases} \quad (12)$$

In Expression (12), $\beta$ and $\gamma$ individually denote positive coefficients, RTT denotes the average value of round-trip propagation delays in a predetermined time, and N denotes jitters of the round-trip propagation delay. That is to say, in Expression (12), the sum of the average value in a predetermined time and jitters, ($\beta RTT+\gamma N$), is the maximum round-trip propagation delay. As shown in Expression (12), the redundancy-coding control section 121 determines the FEC block size such that the FEC block size becomes smaller as the maximum round-trip propagation delay increases. By this means, the redundancy-coding control section 121 can determine the FEC block size on the basis of the maximum value of the propagation delay, and can avoid an unnecessary increase in delay time in the case of having an instantaneous increase in the propagation delay. That is to say, the redundancy-coding control section 121 can restrain fluctuations of the entire delay including the propagation delay of the network 110 in addition to the principle delay.

In this regard, a time period for obtaining the maximum round-trip propagation delay is any period. For example, the time period may be an update interval of the FEC block size.

Description of Processing Flow

Next, a description will be given of an example of the flow of various kinds of processing in this case. The flow of the transmission processing performed by the transmission apparatus 101 in this case is the same as that described with reference to a flowchart in FIG. 26, and thus the description thereof will be omitted.

Figure 29:
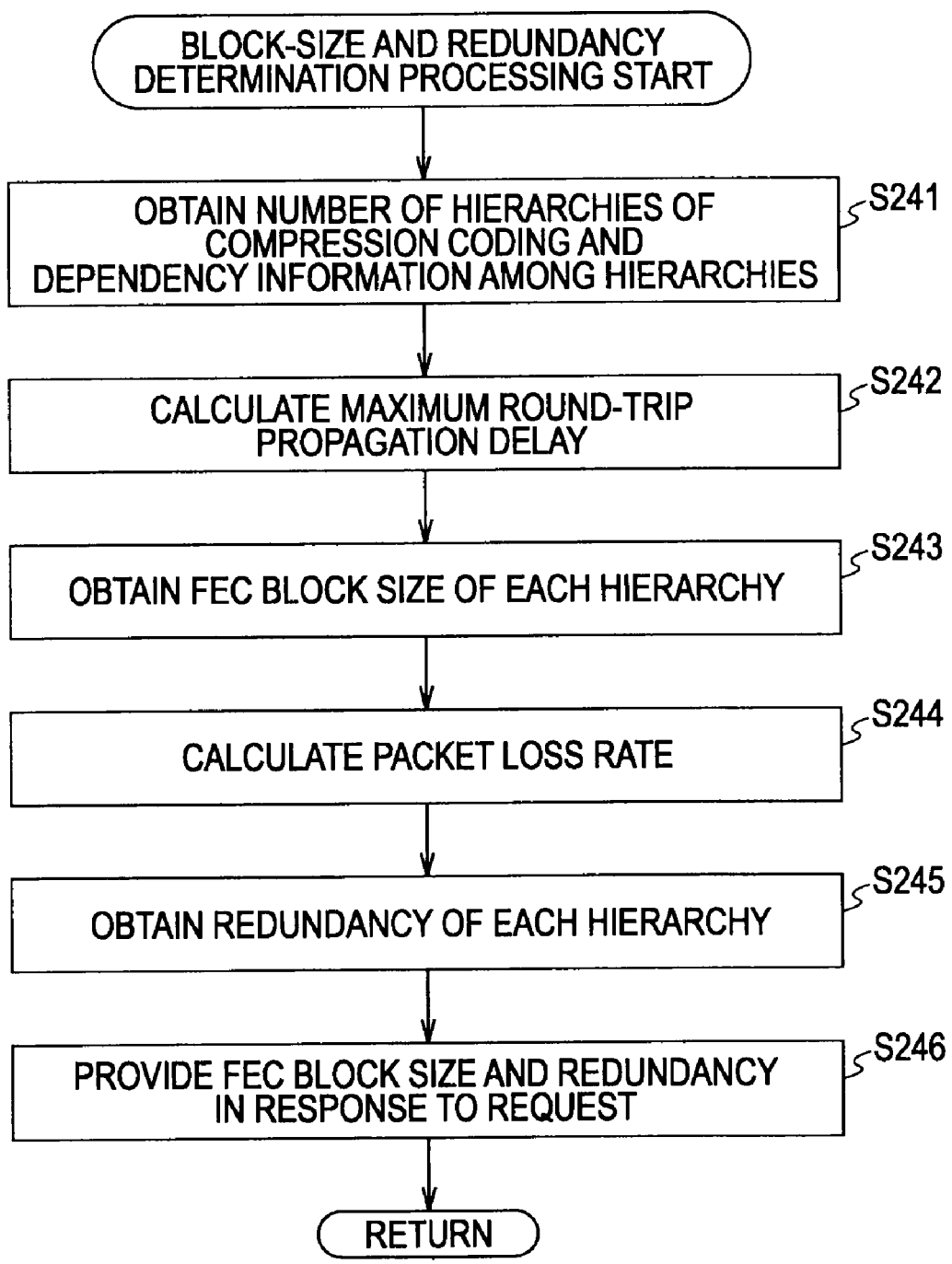
FIG. 29 is a flowchart illustrating an example of a flow of block-size and redundancy determination processing.

A description will be given of an example of the block-size and redundancy determination processing performed in step S202 in FIG. 26 with reference to a flowchart in FIG. 29. This flowchart corresponds to the flowchart in FIG. 27, and the processing is performed basically in the same manner.

Figure 27:
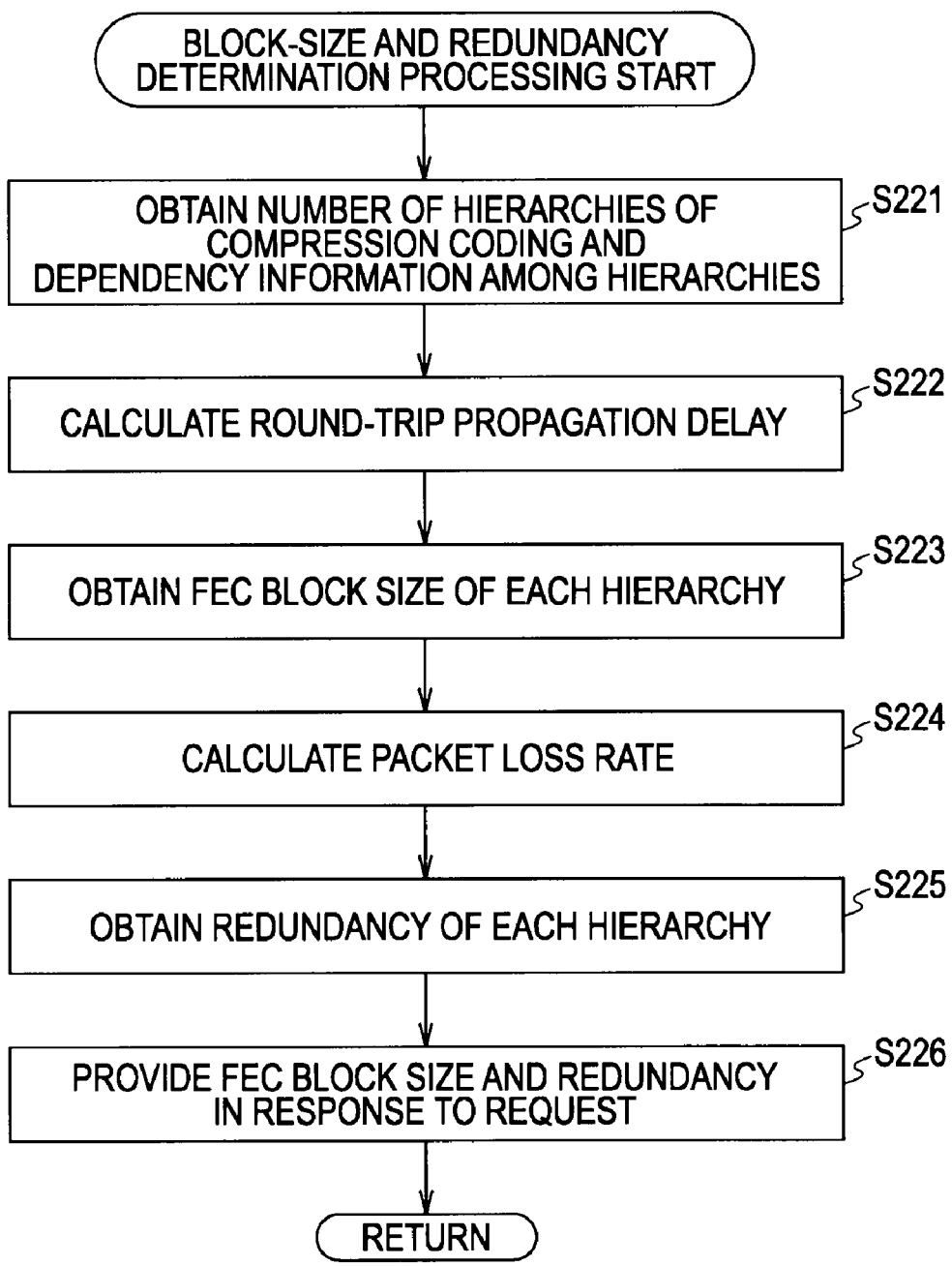
FIG. 27 is a flowchart illustrating an example of a flow of block-size and redundancy determination processing.

That is to say, the processing of step S241 is performed in the same manner as that of step S221 in FIG. 27. In step S242, the maximum round-trip-propagation-delay calculation section 321 calculates a maximum value (maximum round-trip propagation delay) of the round-trip propagation delay. In step S243, the FEC-block-size determination section 201 obtains the FEC block size for each hierarchy using the information obtained in steps S241 and S242.

The individual processing from step S244 to steps S246 is executed in the same manner as the individual processing of steps S224 and S226 in FIG. 27.

By controlling in this way, the redundancy-coding control section 121 can dynamically control the FEC block size and the redundancy in accordance with the network connection state, such as the round-trip propagation delay and the packet loss rate, etc.

In this case, only the FEC block size may also be controlled dynamically, and the redundancy may also be fixed at a predetermined value. Also, only the FEC block size may be controlled dynamically, and the redundancy may be controlled statically (be controlled in an initial state of the transmission processing) as described with reference to FIGS. 16 and 22, for example.

6. Sixth Embodiment

Example of Configuration of Transmission Apparatus

In the above, a description has been given that the FEC block size and the redundancy are controlled dynamically or statically. However, the redundancy-coding control section 121 may select whether to control the FEC block size and the redundancy dynamically or statically on the basis of the network connection information, for example.

Figure 30:
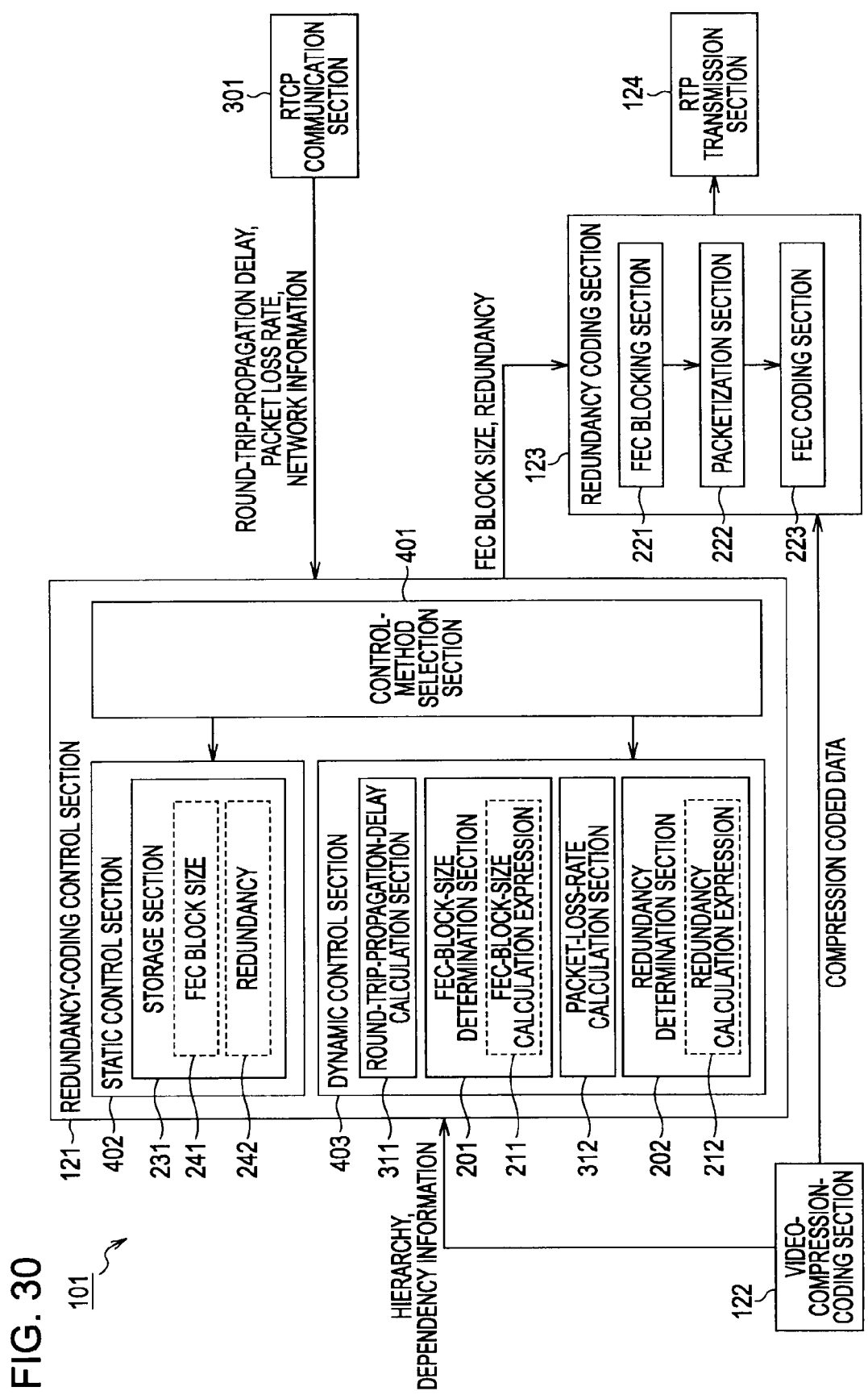
FIG. 30 is a block diagram illustrating an example of a main configuration of a transmission apparatus.

FIG. 30 is a block diagram illustrating an example of a main configuration of the transmission apparatus 101 in that case. In the example in FIG. 30, an RTCP communication section 301 obtains network connection information including network information indicating what kind of communication line is used for the network 110, which is connected to an RTP transmission section 124. The network information is information indicating the type of the communication line of the network 100, for example, an intra-network, a LAN (Local Area Network), the Internet, etc. The network information may be any information as far as the information indicating directly or indirectly the type of communication line forming the network 110. Also, the network information can be any format.

The redundancy-coding control section 121 includes a control-method selection section 401, a static control section 402, and a dynamic control section 403. The control-method selection section 401 selects and drives either the static control section 402 or the dynamic control section 403 in order to control the FEC block size and the redundancy on the basis of the network information obtained by the RTCP communication section 301.

The static control section 402 has a storage section 231. That is to say, the static control section 402 has the same configuration as that of the redundancy-coding control section 121 in the case of the description with reference to FIG. 21, and performs the same processing. That is to say, the static control section 402 statically determines the FEC block size and the redundancy in the initial state of the transmission processing.

The dynamic control section 403 has a round-trip-propagation-delay calculation section 311, an FEC-block-size determination section 201, a packet-loss-rate calculation section 312, and a redundancy determination section 202. That is to say, the dynamic control section 403 has the same configuration as that of the redundancy-coding control section 121 in the case of the description with reference to FIG. 25, and performs the same processing. That is to say, the dynamic control section 403 dynamically determines the FEC block size and the redundancy on the basis of the network connection information.

For example, if the network 110 to which the transmission apparatus 101 is connected is a relatively stable communication line, such as an intra-network or a LAN, the control-method selection section 401 selects the static control section 402, and drives the static control section 402 to determine the FEC block size and the redundancy.

Also, for example, if the network 110 to which the transmission apparatus 101 is connected is a relatively unstable communication line, such as the Internet, the control-method selection section 401 selects the dynamic control section 403, and drives the dynamic control section 403 to determine the FEC block size and the redundancy.

Description of Processing Flow

Figure 31:
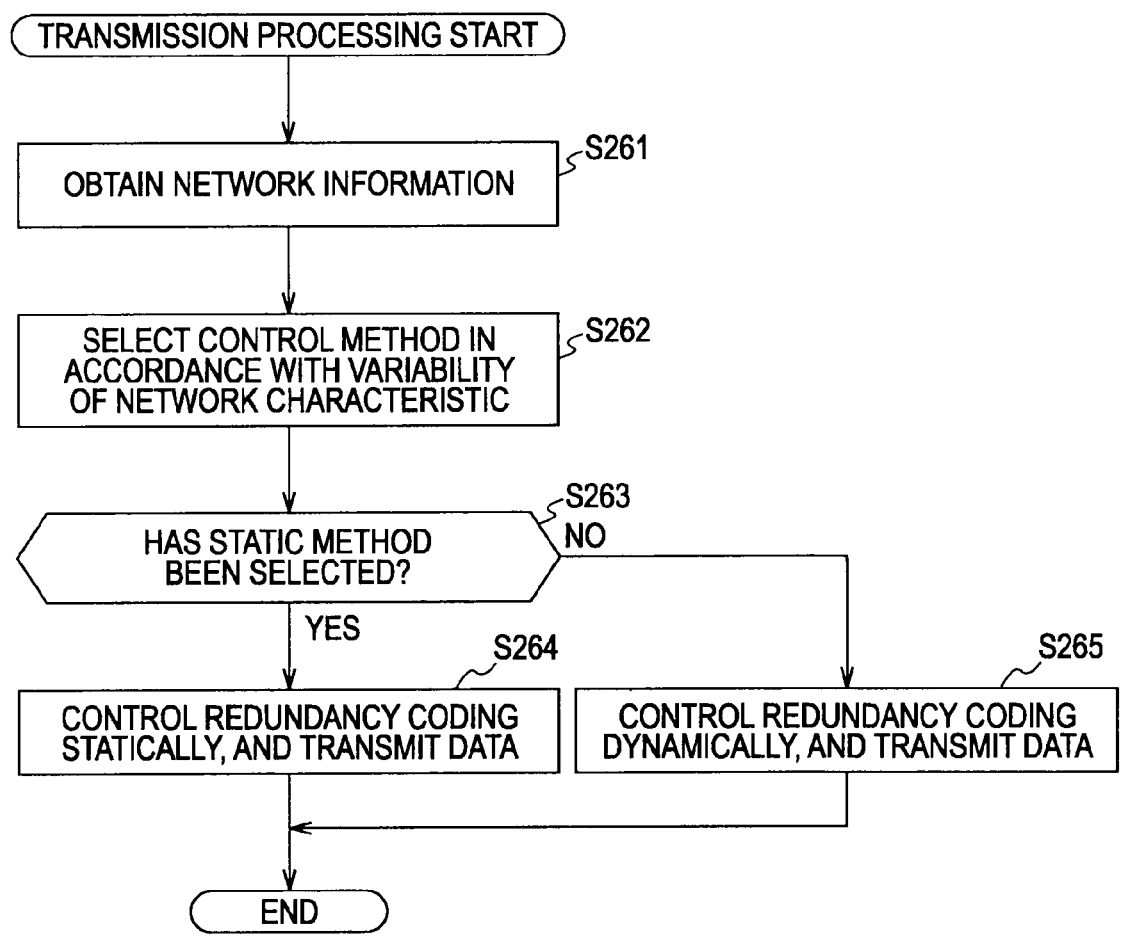
FIG. 31 is a flowchart illustrating an example of a flow of transmission processing.

In this case, a description will be given of an example of the flow of the transmission processing performed by the transmission apparatus 101 with reference to a flowchart in FIG. 31. When the transmission processing is started, in step S261, the RTCP communication section 301 obtains the network information. In step S262, the control-method selection section 401 of the redundancy-coding control section 121 selects a control method in accordance with the variability of the characteristic of the network 110 on the basis of the network information. That is to say, if the variability of the characteristic of the network 110 is relatively small, the control method-selection section 401 controls and drives the static control section 402. Also, if the variability of the characteristic of the network 110 is relatively large, the control method selection section 401 controls and drives the dynamic control section 403.

In step S263, the control-method selection section 401 determines whether the static method has been selected or not. If determined that the static method has been selected, the processing proceeds to step S264. In step S264, the static control section 402 statically controls the redundancy coding, and causes to transmit data. When the processing of step S264 is completed, the transmission processing is terminated.

Also, if determined that the dynamic method has been selected in step S263, the processing proceeds to step S265. In step S265, the dynamic control section 403 dynamically controls the redundancy coding to cause data transmission. When the processing of step S265 is completed, the transmission processing is terminated.

In this manner, the redundancy-coding control section 121 can select suitable control method in accordance with the characteristic of the network 110 to which the transmission apparatus 101 is connected, and can control the redundancy coding (determine the FEC block size and the redundancy) by the selected control method. That is to say, the redundancy-coding control section 121 can control to transmit data so as to further improve the burst packet loss resilience while restraining an increase in unnecessary delay.

In this regard, the control-method selection section 401 may statically perform switching control, but also may perform dynamic control. Also, for example, the static control section 402 may have the same configuration as that of the redundancy-coding control section 121 shown in FIG. 16, and may perform the same processing. Also, for example, the static control section 402 may have the same configuration as that of the redundancy-coding control section 121 shown in FIG. 22, and may perform the same processing. Further, any configuration may be used as far as the FEC block size and the redundancy are statically controlled.

Also, for example, the dynamic control section 403 may have the same configuration as that of the redundancy-coding control section 121 shown in FIG. 25, and may perform the same processing. Also, for example, the static control section 402 may have the same configuration as that of the redundancy-coding control section 121 shown in FIG. 28, and may perform the same processing. Further, any configuration may be used as far as the FEC block size and the redundancy are statically controlled.

As described above, by the present invention, in a multimedia streaming and a real-time communication in the case of using hierarchical coding for the video compression coding method, it is possible to perform the redundancy coding transmission which increases burst-packet loss resilience as much as possible while restraining an increase in delay at a minimum.

In particular, when processing delay of the video coding method is small, it is possible to keep the delay due to redundancy coding at a minimum. Thus, it becomes possible to perform high quality transmission with a maximum utilization of low delay, which is an advantage of the video coding method.

Also, it is possible to give priority to low delay (processing speed), or to give priority to burst-packet loss resilience, and to make an adjustment by adjusting the parameters in accordance with the strength of a delay demand and the strength of the demand for data loss resilience.

As described above, by the present invention, it is possible to perform redundancy coding on the video data having been subjected to compression coding by hierarchical coding for packet loss recovery. Also, by the present invention, it is possible to perform transmission with high burst-loss resilience without significantly increasing delay for redundancy coding in the case of real-time transmission with low delay. Further, an independent redundancy coding block for each hierarchy is generated, and the redundancy-coding block size is adjusted in accordance with the size of an input-video-data range, which is dependent on each hierarchy, thereby a significant increase in a delay can be restrained. Also, by the present invention, it is possible to obtain a same recovery performance in all the hierarchies by adjusting the redundancy for each hierarchy in accordance with the redundancy-coding block size. Further, by the present invention, it is possible to adjust the target recovery performance in accordance with the data priority for each hierarchy, and to further adjust the redundancy in accordance with that value.

The above-described series of processing can be executed by hardware or can be executed by software. In this case, an embodiment of the present invention may be configured as a personal computer as shown in FIG. 32, for example.

Figure 32:
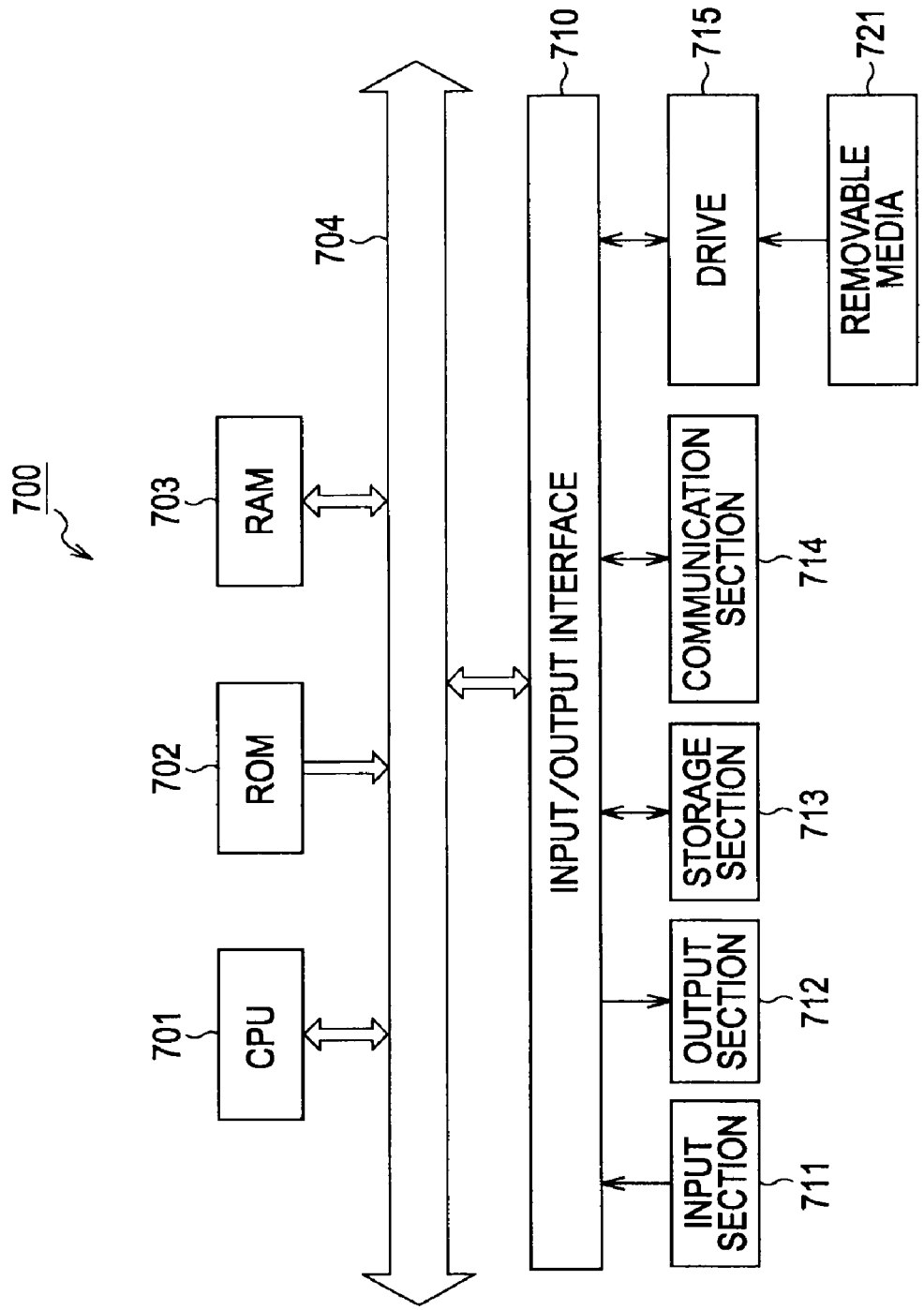
FIG. 32 is a block diagram illustrating an example of a main configuration of a personal computer to which the present invention is applied.

Referring to FIG. 32, a CPU (Central Processing Unit) 701 of a personal computer 700 performs various kinds of processing in accordance with programs stored in a ROM (Read Only Memory) 702 or programs loaded from a storage section 713 to a RAM (Random Access Memory) 703. Also, the RAM 703 suitably stores data, etc., necessary for the CPU 701 to execute the various kinds of processing.

The CPU 701, the ROM 702, and the RAM 703 are mutually connected through a bus 704. The bus 704 is also connected to an input/output interface 710.

An input section 711 including a keyboard, a mouse, etc., an output section 712 including a display including a CRT (Cathode Ray Tube), a LCD (Liquid Crystal Display), an organic EL display (Organic Electro-Luminescence Display), etc., and a speaker, etc., a storage section 713 including a hard disk, an SSD (Solid State Drive), etc., a communication section 714 including a modem, a LAN (Local Area Network) interface, a USB (Universal Serial Bus) interface, an IEEE (Institute of Electrical and Electronic Engineers) 1394 interface, a Bluetooth interface, a wireless LAN interface, etc., are connected to the input/output interface 710. The communication section 714 performs communication processing through a network including the Internet.

A drive 715 is connected to the input/output interface 710 as necessary. A removable media 721, such as a magnetic disk, an optical disc, a magneto-optical disc, or a semiconductor memory, etc., are suitably loaded to the drive 715, and computer programs read therefrom are installed into the storage section 713 as necessary.

If the above-described series of processing is performed by software, the programs of the software are installed from a network or a recording medium.

This recording medium includes not only a removable medium 721, which stores the program to be distributed to a user separately from the application main unit as shown in FIG. 32, including, for example, a magnetic disk (including a flexible disk), an optical disc (a CD-ROM (Compact Disc-Read Only Memory)), a DVD (Digital Versatile Disc), a magneto-optical disc (including a MD (Mini Disc)), or a semiconductor memory, etc., but also includes a ROM 702, a hard disk included in a storage section 713, whish stores the program in a state of being incorporated in the apparatus main unit in advance, etc.

In this regard, in this specification, each processing step described by the program recorded in a recording medium is not necessarily processed in time series in accordance with the described sequence, but also includes processing to be performed in parallel or individually.

Also, in this specification, a system represents an entire apparatus including a plurality of devices (apparatuses).

The present application contains subject matter related to that disclosed in Japanese Priority Patent Application JP 2008-316719 filed in the Japan Patent Office on Dec. 12, 2008, the entire content of which is hereby incorporated by reference.

In this regard, in the above, a component described as one apparatus (or processing section) may be divided and configured as a plurality of apparatuses (or processing sections). On the contrary, components described as a plurality of apparatuses (or processing sections) may be put together into one apparatus (or processing section). Also, a component other than described above may be added to the component of individual apparatus (or individual processing section). Further, if the configuration and operation of the overall system are substantially the same, a part of a component of a certain apparatus (or processing section) may be included in a component of another apparatus (or another processing section). That is to say, an embodiment of the present invention is not limited to the above-described embodiments. It is possible to make various changes without departing from the gist of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. An information processing apparatus comprising:
a processing section configured to:
generate hierarchical data hierarchized in descending order of importance with respect to resolution from image data;
code the hierarchical data for each hierarchy;
determine a size B(i) of a block in a hierarchy i using the following expression $$B(i) = \begin{cases} T+1, & (i=1) \\ T+1+\sum_{k=1}^{i-1}(d(k)-1), & (i=2,3,\dots) \end{cases}$$

where T is a number of extended blocks permitted to be delayed, and d(k) is a range on which a hierarchy k is dependent;
block the hierarchical data for each of the hierarchies using the determined block size; and
perform redundancy coding to generate redundant data of the hierarchical data for each of the blocks.

2. An information processing apparatus comprising:
a processing section configured to:
generate hierarchical data hierarchized in descending order of importance with respect to resolution from image data;
code the hierarchical data for each hierarchy;
determine a block size for each of the hierarchies on the basis of dependencies of the hierarchies between pieces of the generated hierarchical data or between the generated hierarchical data and the image data;
block the hierarchical data for each of the hierarchies using the determined block size;
determine a number of packets, k, of the hierarchical data and a number of packets, n–k, of redundancy data so that a target value Pt of a block loss rate satisfies the following expression $$P_t \geq 1 - \sum_{j=0}^{n-k} {}_nC_j p^j (1-p)^{n-j} \quad (n > k)$$

where p is an assumed packet loss rate, n is a number of packets in the block, k is a number of packets of the coefficient, and Pt is a target value of the block loss rate; and
perform redundancy coding to generate redundant data of the hierarchical data using the determined redundancy for each of the blocks.

3. The information processing apparatus according to claim 2, wherein the processing section is configured to set the target value Pt of the block loss rate independently for each hierarchy.

4. The information processing apparatus according to claim 2, wherein the processing section is configured to:
control transmission of packets of the hierarchical data having been subjected to redundancy coding and packets of the redundant data to another information processing apparatus through a network;
calculate an average value of the packet loss rate in a predetermined period of time in the other information processing apparatus; and
determine the number of packets k of the hierarchical data and the number of packets n–k of the redundant data assuming that the calculated average value of the packet loss rate in a predetermined time period is p.

5. An information processing apparatus comprising:
a processing section configured to:
generate hierarchical data hierarchized in descending order of importance with respect to resolution from image data;
code the hierarchical data for each hierarchy;
determine a block size for each of the hierarchies on the basis of dependencies of the hierarchies between pieces of the generated hierarchical data or between the generated hierarchical data and the image data;
block the hierarchical data for each of the hierarchies using the determined block size;

perform redundancy coding to generate redundant data of the hierarchical data for each of the blocks;

control transmitting packets of the hierarchical data having been subjected to redundancy coding and packets of the redundant data to another information processing apparatus through a network; and calculate an average value of propagation delays of the network in a predetermined time period, wherein determining the block-size includes determining a size B(i) of the block in a hierarchy i using the following expression $$B(i) = \begin{cases} T + 1 - \beta RTT, & (i = 1) \\ T + 1 - \beta RTT + \sum_{k=1}^{i-1} (d(k) - 1), & (i = 2, 3, \dots) \end{cases}$$

where T is the number of extended blocks permitted to be delayed, d(k) is a range on which a hierarchy k is dependent, RTT is an average value of the propagation delays in a predetermined time period, and β is a positive-number coefficient.

6. The information processing apparatus according to claim 1, wherein the processing section is configured to generate the hierarchical data hierarchized in descending order of importance with respect to an SNR (Signal to Noise Ratio), a spatial resolution, or a time-direction resolution, and coding the hierarchical data for each hierarchy.

7. The information processing apparatus according to claim 1, wherein the processing section is configured to recursively repeat dividing processing of the image data or the hierarchical data into a plurality of sub-bands so as to generate the hierarchical data for each of the plurality of hierarchized sub-bands, and code the hierarchical data for each hierarchy.

\* \* \* \* \*